United States Patent
Okamura et al.

(10) Patent No.: US 8,423,876 B2
(45) Date of Patent: Apr. 16, 2013

(54) LOW-DENSITY PARITY CHECK CONVOLUTION CODE (LDPC-CC) ENCODER AND LDPC-CC DECODER

(75) Inventors: Shutai Okamura, Osaka (JP); Yutaka Murakami, Osaka (JP); Masayuki Orihashi, Kanagawa (JP)

(73) Assignee: Panasonic Corporation, Osaka (JP)

( * ) Notice: Subject to any disclaimer, the term of this patent is extended or adjusted under 35 U.S.C. 154(b) by 553 days.

(21) Appl. No.: 12/668,655

(22) PCT Filed: Jul. 11, 2008

(86) PCT No.: PCT/JP2008/001874
§ 371 (c)(1),
(2), (4) Date: Jan. 29, 2010

(87) PCT Pub. No.: WO2009/008182
PCT Pub. Date: Jan. 15, 2009

(65) Prior Publication Data
US 2010/0199153 A1   Aug. 5, 2010

(30) Foreign Application Priority Data

| Jul. 12, 2007 | (JP) | ................................. | 2007-183492 |
| Dec. 28, 2007 | (JP) | ................................. | 2007-339913 |
| Jul. 8, 2008 | (JP) | ................................. | 2008-178241 |

(51) Int. Cl.
*H03M 13/03* (2006.01)
(52) U.S. Cl.
USPC .......................................... 714/786; 714/758
(58) Field of Classification Search .................. 714/758, 714/786
See application file for complete search history.

(56) References Cited

U.S. PATENT DOCUMENTS

| 6,848,069 | B1 * | 1/2005 | Levy et al. | ..................... 714/755 |
| 7,499,490 | B2 * | 3/2009 | Divsalar et al. | ............... 375/240 |
| 7,831,895 | B2 * | 11/2010 | Lin | ............................. 714/800 |
| 2006/0026488 | A1 * | 2/2006 | Kim et al. | ..................... 714/758 |

(Continued)

FOREIGN PATENT DOCUMENTS

| EP | 1 455 458 | 9/2004 |
| WO | 2007/037124 | 4/2007 |

OTHER PUBLICATIONS

International Search Report dated Oct. 7, 2008.

(Continued)

*Primary Examiner* — Yolanda L Wilson
(74) *Attorney, Agent, or Firm* — Dickinson Wright PLLC

(57) ABSTRACT

It is possible to provide and an LDPC-CC (Low-Density Parity-Check Convolution Codes) encoder and an LDPC-CC decoder which performs an error correction encoding and decoding while reducing the amount of a termination sequence required for encoding/decoding the LDPC-CC encoding/decoding and suppressing degradation of the transmission efficiency. The LDPC-CC encoder (400) includes a weight control unit (470) which stores a weight pattern (475) based on an LDPC-CC inspection matrix (100); and a weight pattern (476) based on a check matrix (300) obtained by deforming an LDPC-CC inspection matrix (100). The weight control unit (470) controls a weight to be multiplied onto the outputs of a plurality of shift registers (410-1 to 410-M, 430-1 to 430-M) by using the weight pattern (475) when the input bit is an information sequence, and using a weight pattern (476) which makes a weight value to be multiplied by an inspection bit $v_{2,t}$ to be 0 when the input bit is a termination sequence.

10 Claims, 44 Drawing Sheets

U.S. PATENT DOCUMENTS

2007/0220395 A1* 9/2007 Nimbalker et al. ............ 714/758
2008/0126908 A1* 5/2008 Lin ................................ 714/758
2009/0135920 A1 5/2009 Oga

OTHER PUBLICATIONS

A. Felstrom et al., "Time-Varying Periodic Convolutional Codes With Low-Density Parity-Check Matrix," IEEE Transactions on Information Theory, vol. 45, No. 6, Sep. 1999, pp. 2181-2191.

Z. Chen et al., "Low-Density Parity-Check Convolutional Codes Applied to Packet Based Communication Systems," IEEE Globecom 2005, pp. 1250-1254.

S. Bates et al., "Termination Sequence Generation circuits for Low-Density Parity-Check Convolutional Codes," IEEE Transactions on Circuits and Systems, vol. 53, No. 9, Sep. 2006, pp. 1909-1917.

S. Lin et al., "Error Control Coding: Fundamentals and Applications," Second Edition, Prentice Hall: Englewood Cliffs, NJ, 2004, pp. 582-599.

R. M. Tanner at al., "LDPC Block and Convolutional Codes Based on Circulant Matrices," IEEE Transactions on Information Theory, vol. 50, No. 12, Dec. 2004, pp. 2966-2984.

G. Richter et al., "Irregular Low-Density Parity-Check Convolutional Codes Based on Protographs," IEEE, ISIT 2006, Jul. 2006, pp. 1633-1637.

A. E. Pusane et al., "On Deriving Good LDPC Convolutional Codes from QC LDPC Block Codes," IEEE, ISIT 2007, Jun. 2007, pp. 1221-1225.

H. Ma et al., "On Tail Biting Convolutional Codes," IEEE Transactions on Communications, vol. COM-34, No. 2, Feb. 1986, pp. 104-111.

International Search Report dated Aug. 4, 2011.

Z. Chen, et al., "Efficient Encoding and Termination of Low-Density Parity-Check Convolutional Codes," IEEE 2006 Global Telecommunications Conference, GLOBECOM 2006, Nov. 27-Dec. 1, 2006, pp. 1-5.

R. Swamy, et al., "Architectures for ASIC Implementations of Low-Density Parity-Check Convolutional Encoders and Decoders," IEEE International Symposium on Circuits and Systems (ISCAS), May 23, 2005, pp. 4513-4516.

T. Kishigami, et al., "LDPC-Convolutional Codes for IEEE 802.16m FEC Scheme," IEEE 802.16 Broadband Wireless Access Working Group, Jan. 16, 2008, pp. 1-6.

Extended European Search Report dated Aug. 4, 2011.

* cited by examiner $$\mathbf{H}_{[0,n]}^{T} = \begin{bmatrix} h_1^{(0)}(0) & h_1^{(1)}(1) & \cdots & h_1^{(M)}(M) & 0 & \cdots & 0 & \cdots & 0 \\ h_2^{(0)}(0) & h_2^{(1)}(1) & \cdots & h_2^{(M)}(M) & 0 & \cdots & 0 & & \vdots \\ 0 & h_1^{(0)}(1) & \cdots & h_1^{(M)}(M) & h_1^{(M)}(M+1) & \cdots & & & h_1^{(M)}(n) \\ \vdots & h_2^{(0)}(1) & \cdots & h_2^{(M)}(M) & h_2^{(M)}(M+1) & \cdots & & & h_2^{(M)}(n) \\ & 0 & \cdots & \vdots & \vdots & \ddots & & & \vdots \\ & & \ddots & & & & & & h_2^{(0)}(n) \\ & & & & & & & & 0 \end{bmatrix}$$

FIG.1

BLOCK 1: $V_{1,1}$, $V_{2,1}$, $V_{1,2}$, $V_{2,2}$, $V_{1,3}$, $V_{2,3}$, $V_{1,4}$

BLOCK 2: $V_{2,4}$, $V_{1,5}$, $V_{2,5}$, $V_{1,6}$, $V_{2,6}$

BLOCK 3: $V_{1,7}$, $V_{2,7}$, $V_{1,8}$, $V_{2,8}$, $V_{1,9}$, $V_{2,9}$

BLOCK 4: $V_{1,10}$, $V_{2,10}$, $V_{1,11}$, $V_{2,11}$, $V_{1,12}$, $V_{2,12}$

BLOCK 5: $V_{1,13}$, $V_{2,13}$, $V_{1,14}$, $V_{2,14}$, $V_{1,15}$, $V_{2,15}$, $V_{1,16}$

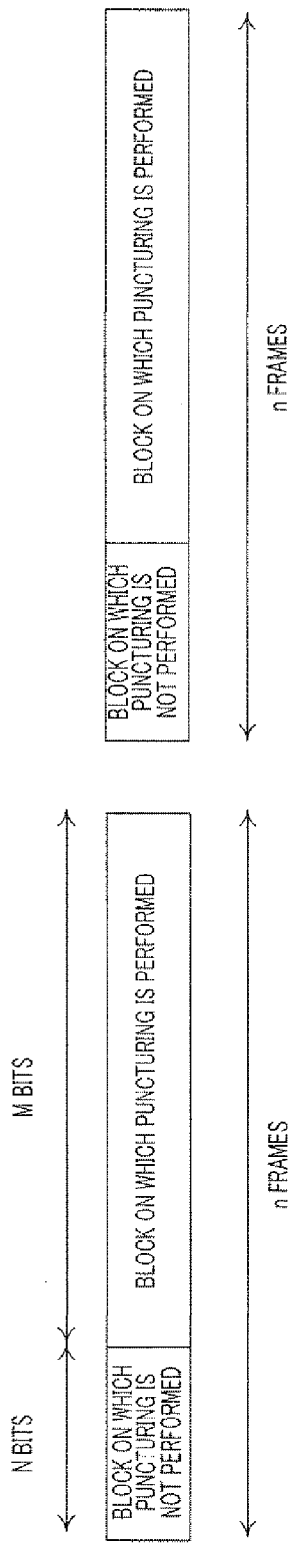
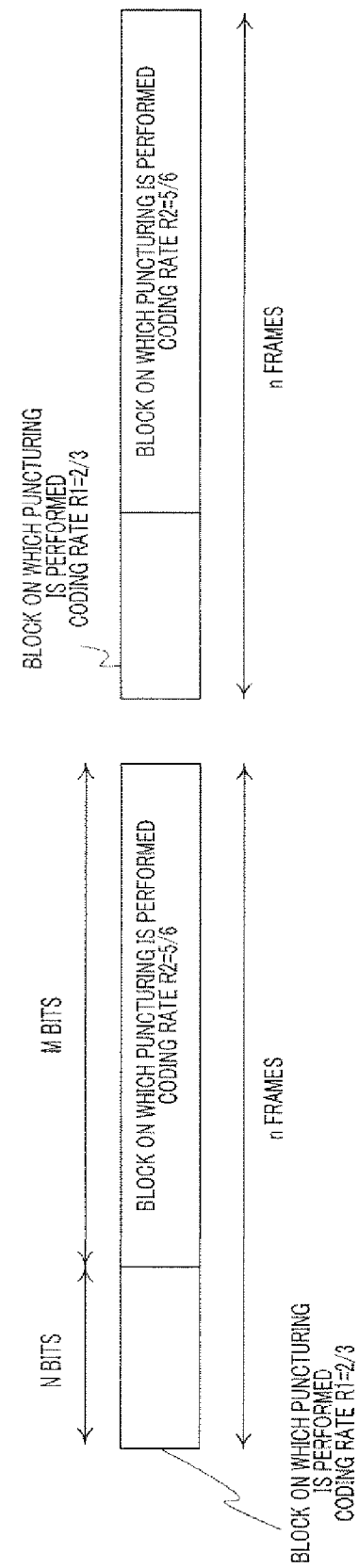
FIG.30A
FIG.30B

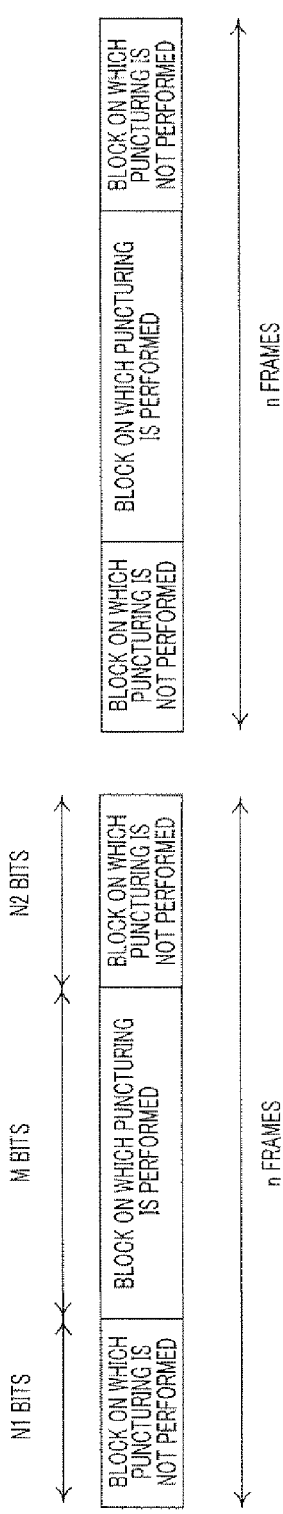
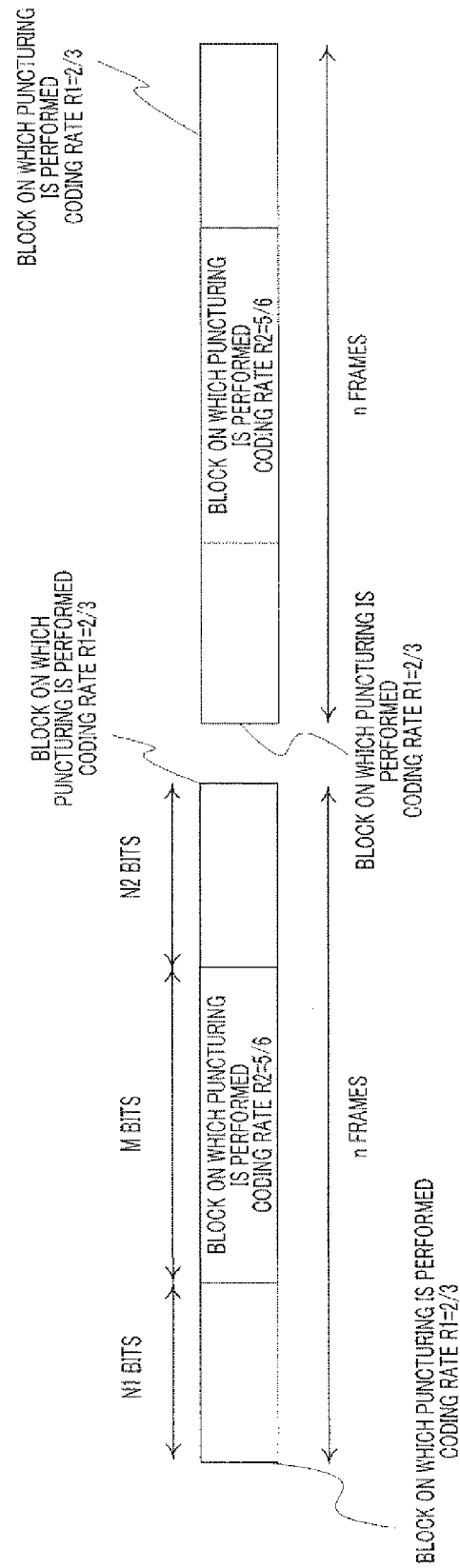
FIG.32A
FIG.32B

FIG. 37

LOW-DENSITY PARITY CHECK CONVOLUTION CODE (LDPC-CC) ENCODER AND LDPC-CC DECODER

TECHNICAL FIELD

The present invention relates to an LDPC-CC (Low-Density Parity-Check Convolutional Code) encoder, a transmitting apparatus, and an LDPC-CC decoder, and relates to an LDPC-CC encoder that performs error correction encoding using LDPC-CC, and an LDPC-CC decoder.

BACKGROUND ART

In recent years, attention has been attracted to a Low-Density Parity-Check (LDPC) code as an error correction code that provides high error correction capability with a feasible circuit scale. Due to its high error correction capability and ease of implementation, an LDPC code has been adopted in an error correction code for IEEE802.11n high-speed radio LAN (Local Area Network) systems, digital broadcasting systems, and so forth.

An LDPC code is an error correction code defined by a low-density parity check matrix (that is, a parity check matrix in which there are far fewer 1 elements than 0 elements). An LDPC code is a block code having a block length equal to number of columns N of a parity check matrix.

However, a characteristic of many current communication systems is that communication is based on variable-length packets and frames, as in the case of the Ethernet (registered trademark). A problem with applying an LDPC code, which is a block code, to a system of this kind is, for example, how to make a fixed-length LDPC code block correspond to a variable-length Ethernet (registered trademark) frame. With IEEE802.11n, a wireless LAN standard for which an LDPC code has been adopted, adjustment of the length of a transmission information sequence and an LDPC code block length is performed by applying padding and/or puncturing to a transmission information sequence. However, a problem with this is the necessity of changing the coding rate by means of padding or puncturing, and of performing redundant sequence transmission.

In contrast to this kind of block-wise LDPC code (hereinafter referred to as "LDPC-BC: Low-Density Parity-Check Block Code"), an LDPC-CC allowing encoding and decoding of information sequences with arbitrary length has been investigated (see Non-Patent Document 1).

An LDPC-CC is a convolutional code defined by a low-density parity-check matrix.

FIG. 1 shows, as an example, parity check matrix $H_{[0,n]}^T$ of an LDPC-CC for which coding rate R=½ (=b/c).

With an LDPC-CC, elements $h_1^{(m)}(t)$ and $h_2^{(m)}(t)$ of parity check matrix $H_{[0,n]}^T$ are 0 or 1. Also, all elements other than $h_1^{(m)}(t)$ and $h_2^{(m)}(t)$ included in parity check matrix $H_{[0,n]}^T$ are 0. In FIG. 1, M represents the memory length for an LDPC-CC, and n represents the length of a transmission information sequence. As shown in FIG. 1, a characteristic of a parity check matrix of an LDPC-CC is that it is a parallelogram-shaped matrix in which 1 is placed only in diagonal terms of the matrix and neighboring elements, and the bottom-left and top-right elements of the matrix are zero.

Here, if an example in which coding rate R=½ (=b/c) is shown, when $h_1^{(0)}(t)=1$ and $h_2^{(0)}(t)=1$, LDPC-CC encoding is performed by means of Equation (1) and Equation (2) in accordance with parity check matrix $H_{[0,n]}^T$ in FIG. 1.

(Equation 1)

$$v_{1,t} = u_t \quad [1]$$

(Equation 2)

$$v_{2,t} = \sum_{i=0}^{M} h_1^{(i)}(t) u_{t-i} + \sum_{i=1}^{M} h_2^{(i)}(t) v_{2,t-i} \quad [2]$$

Here, $u_t$ represents a transmission information sequence, and $v_{1,t}$ and $v_{2,t}$ represent transmission codeword sequences.

FIG. 2 shows an example of a main configuration of an LDPC-CC encoder that executes Equation (1) and Equation (2). As shown in FIG. 2, LDPC-CC encoder 10 comprises shift registers 11-1 through 11-M and 14-1 through 14-M, weight multipliers 12-0 through 12-M and 13-0 through 13-M, modulo 2 adder (exclusive OR computing element) 15, bit counter 16, and weight control section 17.

Shift registers 11-1 through 11-M and 14-1 through 14-M are registers storing and $v_{1,t-i}$ and $v_{2,t-i}$ (where i=0, ..., M) respectively, and at a timing at which the next input comes in, send a stored value to the adjacent shift register to the right, and store a new value sent from the adjacent shift register to the left.

Weight multipliers 12-0 through 12-M and 13-0 through 13-M switch a weight value to 0 or 1 in accordance with a control signal output from weight control section 17. Based on a count output from bit counter 16 and a weight pattern conforming to a parity check matrix stored in weight control section 17, weight control section 17 sends the values of $h_1^{(m)}(t)$ and $h_2^{(m)}(t)$ at that timing to weight multipliers 12-0 through 12-M and 13-0 through 13-M. Modulo 2 adder 15 performs modulo 2 addition on the outputs of weight multipliers 12-0 through 12-M and 13-0 through 13-M, and calculates $v_{2,t}$. Bit counter 16 counts the number of bits of an input transmission information sequence.

By employing this kind of configuration, LDPC-CC encoder 10 can perform LDPC-CC encoding in accordance with a parity check matrix.

A characteristic of an LDPC-CC encoder is that it can be implemented with extremely simple circuitry as compared with the circuitry of an encoder that performs generator matrix multiplication, or an LDPC-BC encoder that performs computation based on backward substitution or forward substitution. Also, since an LDPC-CC is a convolutional code, it is not necessary to divide a transmission information sequence into fixed-length blocks when encoding, and an information sequence of any length can be encoded.

In LDPC-CC decoding, a sum-product algorithm can be applied based on a parity check matrix in the same way as with an LDPC-BC. Therefore, it is not necessary to use a BCJR (Bahl, Cocke, Jeinek, Raviv) algorithm, or a decoding algorithm based on maximum likelihood sequence estimation such as a Viterbi algorithm, and decoding processing can be completed with little processing delay. Furthermore, in Non-Patent Document 1, a pipeline-based decoding algorithm is proposed that takes advantage of the structure of the parity check matrix, in which 1s are arranged in a parallelogram configuration.

When LDPC-CC and LDPC-BC decoding characteristics are compared using parameters such that the decoder circuit scales are equivalent, LDPC-CC decoding characteristics are shown to be superior (see Non-Patent Document 1).

Now we consider that a encoder terminate LDPC-CC encoding at an arbitrary length n, and a decoder decodes a corresponding received codeword sequence. In this case, the decoder requires the codeword that encoded transmission information sequences after n-th bit and shift register states at the end of encoding in order to make probability propagation of the rear 2M bits equivalent to that of the other bits in sum-product decoding.

However, when a transmission information sequence is simply encoded, since encoder shift register states at the end of encoding depend on the transmission information sequence, it is difficult to decide those states uniquely at a receiver side.

If decoding processing is performed on the receiver side based on a received codeword sequence in such a situation, a phenomenon occurs whereby errors increase at the end of a received information sequence obtained after decoding, particularly in the rear 2M bits.

In order to prevent such errors, it is necessary for terminating processing (termination) that uniquely decides a terminal state of encoding to be executed on a transmission information sequence.

With a convolutional code conforming to IEEE802.11n, termination is executed by adding "tail bits" comprising the six 0s to the rear of a transmission information sequence when performing encoding. The length of tail bits, six, is the same number as shift registers in an encoder. By so doing, the state of an encoder shift registers can be made all-zeros at a point in time at which tail bit input ends. A codeword output when a tail bit is input is necessary for decoding processing on the receiver side, and is therefore transmitted to the receiver side together with a transmission codeword.

In the case of an LDPC-CC, as shown in Equation (1), codewords $v_{2,t-i}$ for the past M times are necessary to find codeword $v_{2,t}$, and therefore shift registers for storing codeword $v_{2,t-i}$ for the past M times are provided in an LDPC-CC encoder. A register storing a transmission information sequence can be set to an all-zero state by making the end of a transmission information sequence a length-M all-zero sequence (termination), but a problem is that it is difficult to set a shift register storing codeword $v_{2,t-i}$ to an all-zero state with only this termination processing.

In Non-Patent Document 2, termination processing is proposed that sets the state of a shift register at the end of encoding to all-zeros by performing encoding after adding a termination sequence to the rear of a transmission information sequence.

In the termination processing proposed in Non-Patent Document 2, a transmission codeword sequence is defined as shown in Equation (3).

Equation (3) is an example for a case in which coding rate R=½. In Equation (3), $v_{1\times2}$ is a length-2n codeword sequence obtained by convolutional encoding of a length-n information sequence, $x_{1\times2L}$ is a termination codeword sequence obtained by convolutional encoding of a length-L termination sequence, and $0_{1\times2M}$ is a length-2M 0-sequence.

[3]

$$[v_{1\times2n}, x_{1\times2L}, 0_{1\times2M}]H'_{2(n+L+M)\times(n+L+M)} = 0_{1\times(n+L+M)} \quad \text{(Equation 3)}$$

Here, termination sequence $x_{1\times2L}$ is decided by Equation (4) and Equation (5).

(Equation 4)

$$[v_{1\times2n}, x_{1\times2L}, 0_{1\times2M}]\begin{bmatrix} A_{2n\times n} & B_{2n\times(L+M)} \\ 0_{2L\times n} & D_{2L\times(L+M)} \\ 0_{2M\times n} & F_{2M\times(L+M)} \end{bmatrix} = 0_{1\times(n+L+M)} \quad [4]$$

-continued (Equation 5)

$$x_{1\times2L}D_{2L\times(L+M)} = v_{1\times2n}B_{2n\times(L+M)} = \beta \quad [5]$$

The state of a shift register can be set to an all-zero state by encoding a transmission codeword sequence to which such a termination sequence has been added with an LDPC-CC encoder. By having a transceiver-side communication apparatus transmit a transmission codeword that has undergone termination processing in this way to the receiver side, the receiver side decoder can uniquely decide a shift register state at the end of encoding, and performs error correction decoding at a desired level of performance.

Non-Patent Document 1: Alberto Jimenez Felstorom, and Kamil Sh. Zigangirov, "Time-Varying Periodic Convolutional Codes With Low-Density Parity-Check Matrix.", IEEE Transactions on Information Theory, Vol. 45, No. 6, pp. 2181-2191, September, 1999.

Non-Patent Document 2: Zhengang Chen, Stephen Bates, and Ziaodai Dong, "Low-Density Parity-Cheek Convolutional Codes Applied to Packet Based Communication Systems", Proceeding of IEEE Globecom 2005, pp. 1250-1254.

Non-Patent Document 3: Stephen Bates, Duncan G. Elliott, and Ramkrishna Swamy, "Termination Sequence Generation Circuits for Low-Density Parity-Check Convolutional Codes," IEEE Transaction on Circuits and Systems-I: Regular Papers, vol. 53, no. 9, pp. 1909-1917, September 2006

Non-Patent Document 4: S. Lin, D. J. Jr., Costello, "Error control coding: Fundamentals and applications,",582-598, Prentice-Hall.

Non-Patent Document 5: R. M. Tanner, D. Sridhara, A. Sridharan, T. E. Fuja, and D. J. Costello Jr., "LDPC block and convolutional codes based on circulant matrices," IEEE Trans. Inform. Theory, vol. 50, no. 12, pp. 2966-2984, December 2004.

Non-Patent Document 6: G. Richter, M. Kaupper, and K. Sh. Zigangirov, "Irregular low-density parity-Check convolutional codes based on protographs," Proceeding of IEEE ISIT 2006, pp 1633-1637.

Non-Patent Document 7: A. Pusane, R. Smarandache, P. Vontobel, and D. J. Costello Jr., "On deriving good LDPC convolutional codes from QC LDPC block codes," Proc. of IEEE ISIT 2007, pp. 1221-1225, June 2007.

Non-Patent Document 8: Howard H. MA and Jack K. Wolf, On "Tail Bitin Convolutional Codes", IEEE Transactions on communications, vol. COM-34, No. 2, pp. 104-111, February 1986

DISCLOSURE OF INVENTION

Problems to be Solved by the Invention

However, with the above conventional configuration, a 2L-bit sequence (where L≧M) is necessary as a transmitted termination sequence, and there are problems of an increase in the amount of overhead and degradation of transmission efficiency resulting from sending a redundant signal sequence. For example, when an 8,000-bit transmission information sequence is transmitted using an LDPC-CC with memory length M=200, 400 bits or more—that is, redundant bits equivalent to 5% or more of the transmission information sequence—must be transmitted for termination. Also, transmission efficiency degradation due to termination sequence transmission is more pronounced when the transmission information sequence length is short, when the coding rate is high, or when memory length M is large.

It is an object of the present invention to provide an LDPC-CC encoder and LDPC-CC decoder that enable error correction encoding and decoding to be performed while reducing the amount of a termination sequence necessary for LDPC-CC encoding/decoding and suppressing degradation of transmission efficiency.

Means for Solving the Problem

An LDPC-CC encoder of the present invention employs a configuration having: a plurality of shift registers; a plurality of weight multiplication sections that multiply outputs of the shift registers by a weight; an exclusive OR computing element that finds an exclusive OR of outputs of the plurality of weight multiplication sections; a bit counter that counts a number of input bits that are encoded; and a weight control section that controls weights of the plurality of weight multiplication sections according to the number of bits.

One aspect of an LDPC-CC encoder of the present invention employs a configuration in which the weight control section stores a first weight pattern conforming to a parity check matrix of an LDPC-CC and a second weight pattern conforming to a parity check matrix obtained by the deformed parity check matrix, and uses the first weight pattern when the input bits are an information sequence, and uses the second weight pattern when the input bits are a termination sequence.

According to this configuration, LDPC-CC encoding that uses a parity check matrix of an LDPC-CC can be performed. Also, a shift register weight value can be switched according to whether input bits are an information sequence or a termination sequence. Therefore when input bits are a termination sequence, LDPC-CC encoder can conclude termination processing using weight values for a transmission codeword sequence which are set to be 0 irrespective of the value of the transmission codeword sequence. As a result, the length of a transmitted termination sequence can be reduced.

Advantageous Effects Of Invention

The present invention enables error correction encoding and decoding to be performed while reducing the amount of a termination sequence necessary for LDPC-CC encoding/decoding and suppressing degradation of transmission efficiency.

BRIEF DESCRIPTION OF DRAWINGS

FIG. 1 is a drawing showing an example of a conventional parity check matrix of LDPC-CC;

FIG. 25 is a drawing for explaining a puncturing method according to Embodiment 7;

FIG. 26 is a drawing showing the correspondence between transmission codeword sequence v and parity check matrix H according to a puncturing method according to Embodiment 7;

FIG. 30 is a drawing showing another puncture pattern according to Embodiment 7;

FIG. 32 is a drawing showing another puncture pattern according to Embodiment 7;

FIG. 37 is a drawing showing an example of a parity check matrix according to Embodiment 9 of the present invention;

BEST MODE FOR CARRYING OUT THE INVENTION

Now, embodiments of the present invention will be described in detail with reference to the accompanying drawings.

(Embodiment 1)

In this embodiment, descriptions are given of a parity check matrix and a configuration of an encoder that performs LDPC-CC encoding using that parity check matrix. The parity check matrix described in this embodiment is that matrix elements corresponding to the rear M bits of a transmission information sequence have been deformed from the parity check matrix in order to reduce the number of termination sequences.

Figure 2:
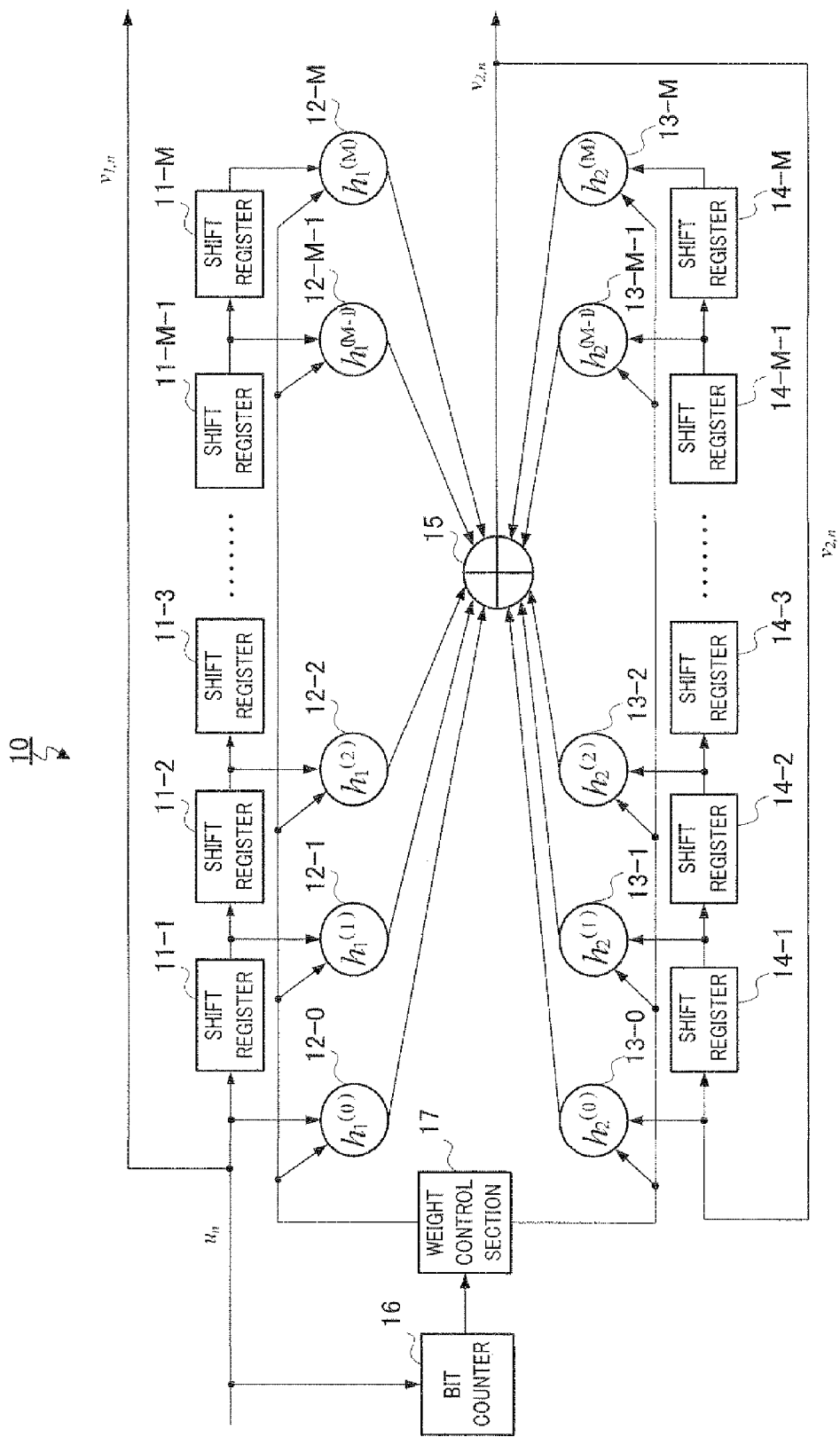
FIG. 2 is a drawing showing an example of a main configuration of a conventional LDPC-CC encoder.
Figure 3:
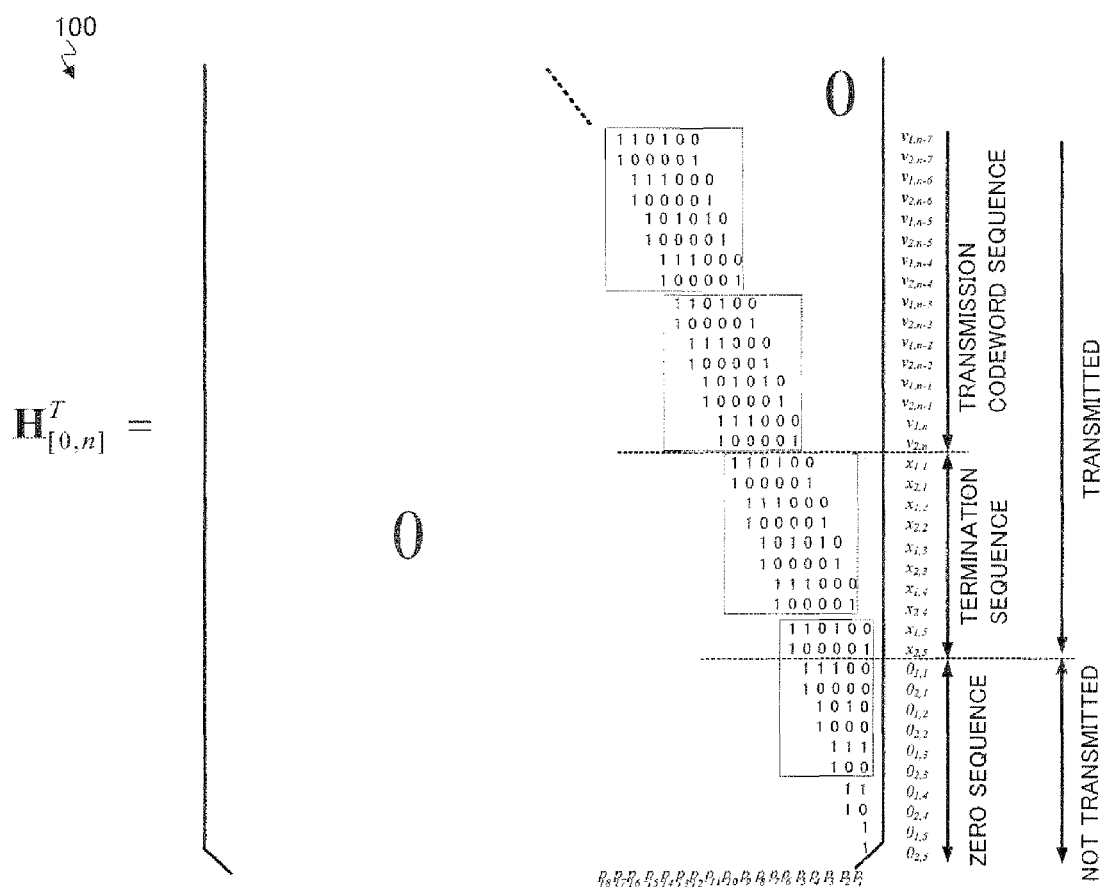
FIG. 3 is a drawing showing an example of a parity check matrix of an LDPC-CC when a conventional termination sequence has been added.

FIG. 3 shows an example of a parity check matrix of an LDPC-CC. Parity check matrix 100 in FIG. 3 is an example of a case with memory length M=5, coding rate 1/2, and transmission information sequence length n. For the sake of simplicity, FIG. 3 shows only a part corresponding to the end part of a transmission codeword sequence, and the following termination sequence, extracted from parity check matrix 100.

In parity check matrix 100, rows correspond to bits of a transmission codeword sequence, termination sequence, and zero sequence. Also, columns $p_1$, $p_2$, $p_{18}$ correspond to parity check equations. To simplify the description, indexes are assigned in order from the right-hand column. The LDPC-CC encoding is performed so that, in each column, a modulo 2 addition result (exclusive OR operation result) of transmission codeword bits corresponding to a row in which a 1 is placed becomes zero. Parity check matrix 100 in FIG. 3 is an example of a systematic code in which transmission information sequence $u_t$ is included directly in that form in transmission codeword sequences $v_{1,t}$ and $v_{2,t}$, and transmission codeword bits $v_{1,t}$ and $v_{2,t}$ are represented by Equation (1).

Figure 4:
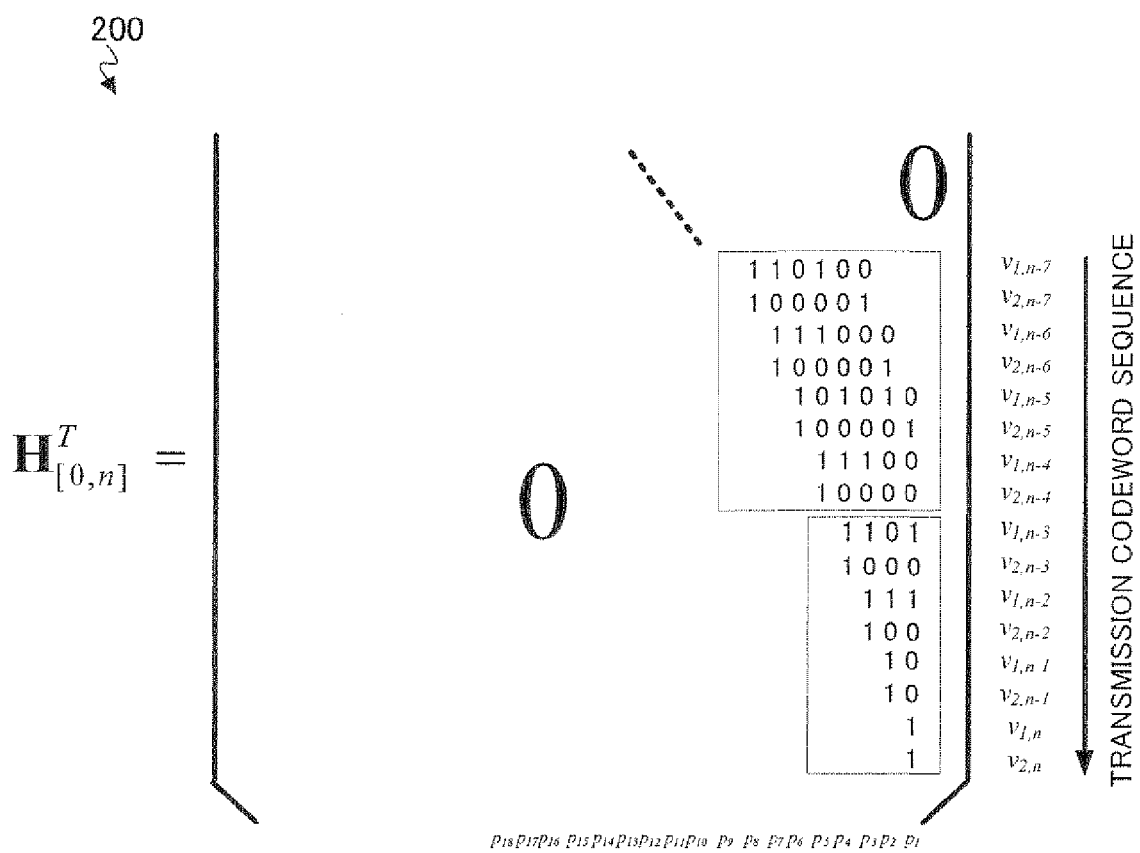
FIG. 4 is a drawing showing an example of a parity check matrix of an LDPC-CC when a conventional termination sequence is not added.

Here, the reason why termination is necessary will be explained. If termination is not performed—that is, if a parity check matrix is terminated with a $v_{2,t}$ row—the parity check matrix becomes as shown in FIG. 4. Consider a case in which sum-product decoding is performed on the receiver side using parity check matrix 200 in FIG. 4. In sum-product decoding, a repetition code decoding and a single parity check code decoding are iteratively performed. The repetition code decoding is performed by logarithmic likelihood ratio addition processing in the parity check matrix 200 row direction. The decoding of a single parity check code is performed by multiplication processing of values of hyperbolic tangent of logarithmic likelihood ratio in the column direction. At this time, to consider the $v_{2,n}$ row of parity check matrix 200, there is only one column ($p_1$) in which a 1 is placed in the $v_{2,n}$ row. The same also applies to the $v_{1,n}$, $v_{1,n-1}$, $v_{2,n-1}$, $v_{2,n-2}$, $v_{2,n-3}$, and $v_{2,n-4}$ rows. With such rows, sufficient coding gain by the repetition code cannot be obtained, and therefore these codeword bits also adversely affect the decoding performance of other codeword bits. As a result, many bit errors occur in the rear part of a post-decoding received information sequence.

In contrast to this, when a termination sequence and zero sequence are added after transmission codeword sequences $v_{1,n}$ and $v_{2,n}$, sufficient encoding gain can be obtained when iterative decoding is performed on transmission codeword sequences $v_{1,n}$ and $v_{2,n}$. Because there is present in the $v_{2,n}$ row in parity check matrix 100 a column in which the same number of 1s are placed as in another $v_{2,x}$ row, as shown in FIG. 3.

Furthermore, sufficient encoding gain can also be obtained for codeword bits other than $v_{2,n}$ included in parity check equations ($p_6$, $p_{11}$) including codeword bit $v_{2,n}$ by adding a termination sequence and zero sequence. Therefore bit errors no longer occur in the rear part of a post-decoding received information sequence. However, in this case, it is necessary to transmit a 2L-bit (in this example, 2M=10-bit) termination sequence in addition to a 2n-bit transmission codeword sequence, and degradation of transmission efficiency is a problem.

Thus, in this embodiment, LDPC-CC encoding is performed using a parity check matrix obtained by deforming matrix elements corresponding to the rearmost M bits of a transmission information sequence in parity check matrix 100. This is described in detail below.

Figure 5:
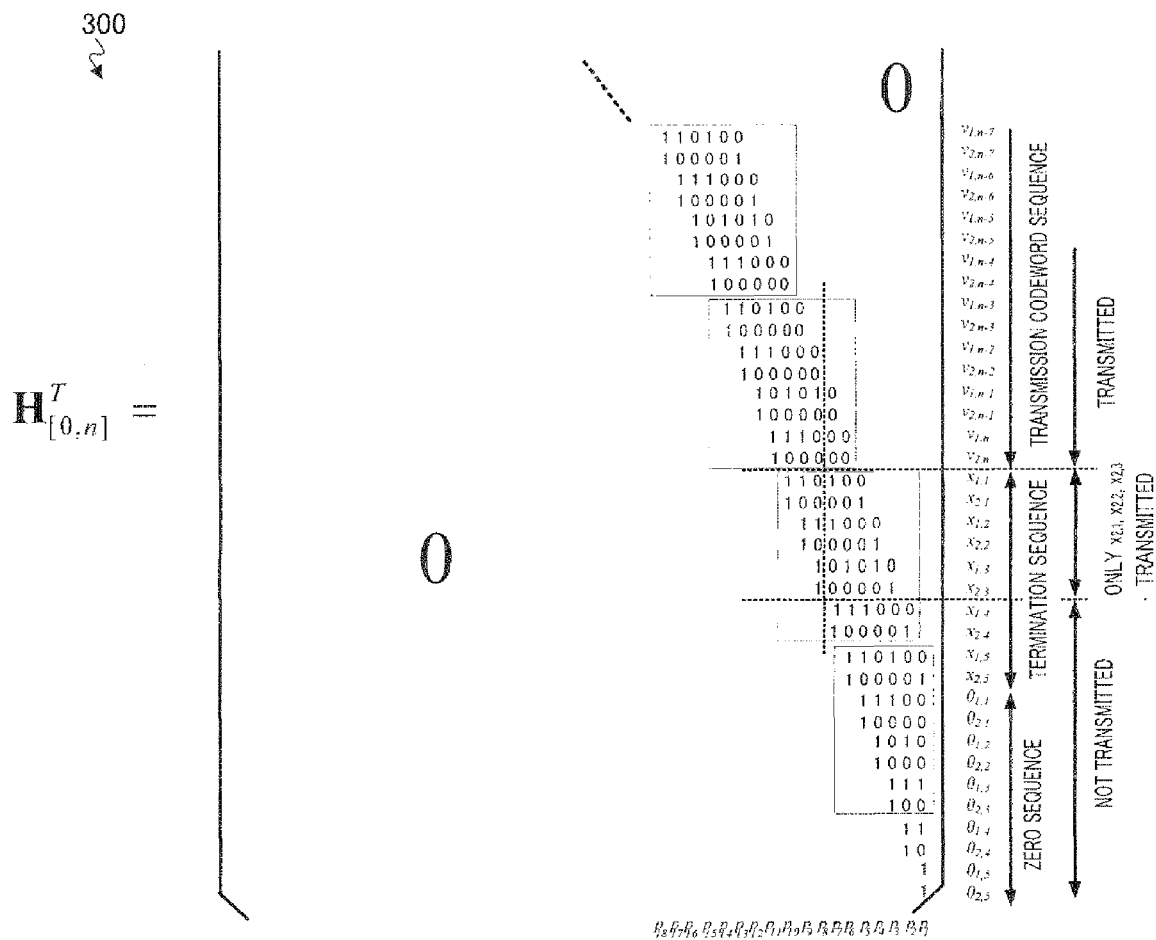
FIG. 5 is a drawing showing an example of a parity check matrix according to Embodiment 1 of the present invention.

FIG. 5 shows parity check matrix 300 according to this embodiment. Parity check matrix 300 in FIG. 5 has a 1 placed in a row corresponding to $v_{2,t}$ in parity check equation ($p_6$, $p_7$, $p_8$, $p_9$, $p_{10}$) columns used for encoding of $x_{2,1}$, $x_{2,2}$, $x_{2,3}$, $x_{2,4}$, and $x_{2,5}$ changed to a 0 with respect to parity check matrix 100 in FIG. 3. Specifically, parity check matrix 300 is a matrix obtained by changing a rightmost 1 in rows corresponding to $v_{2,n}$, $v_{2,n-1}$, $v_{2,n-2}$, $v_{2,n-3}$, and $v_{2,n-4}$ of parity check matrix 100 to a 0. Rows relating to transmission codeword bits prior to $v_{2,n-5}$ of parity check matrix 300 are the same as in parity check matrix 100.

In parity check matrix 300, since the rightmost value in rows corresponding to $v_{2,n}$, $v_{2,n-1}$, $v_{2,n-2}$, $v_{2,n-3}$, and $v_{2,n-4}$ is a 0, when this parity check matrix 300 is used, the value of $v_{2,t}$ is unnecessary for encoding of $x_{2,1}$, $x_{2,2}$, $x_{2,3}$, $x_{2,4}$, and $x_{2,5}$, and only transmission information sequence $v_{1,t}$ ($=u_t$) and $x_{1,x}$ are necessary. Consequently, it is not necessary for $v_{1,t}$ and $v_{2,t}$ shift registers both to be set to an all-zero state, and only the $v_{1,t}$ shift register need be set to an all-zero state. The $v_{1,t}$ shift register can be set to an all-zero state by input of $x_{1,1}$, $x_{1,2}$, $x_{1,3}$, $x_{1,4}$, and $x_{1,5}$ to the encoder as all-zeros, in the conventional way.

Furthermore, if it is decided beforehand on the transmitting side and receiver side that $x_{1,1}$ through $x_{1,5}$ are to be set to all-zeros, it is not necessary for $x_{1,1}$ through $x_{1,5}$ to actually be transmitted to the receiver, and only $x_{2,m}$ obtained by encoding need be transmitted. At this time, the receiver performs decoding with a Log-Likelihood Ratio (LLR) of a bit corresponding to $x_{1,m}$ as ∞ (infinity).

In this way, a transmitted termination sequence can be reduced to M bits at least from the conventional 2L bits.

For example, when parity check matrix 300 is used, if the 3 bits $x_{2,1}$, $x_{2,2}$, and $x_{2,3}$ are transmitted, codeword bits for all parity check equations relating to $v_{1,t}$ and $v_{2,t}$ can be obtained on the receiver side. By contrast, when parity check matrix 100 is used, it is necessary for 10-bit termination sequence $x_{1,1}$ through $x_{1,5}$, $x_{2,1}$ through $x_{2,5}$ to be transmitted. That is to say, when parity check matrix 300 is used, the termination sequence transmission amount can be reduced by 30% compared with a case in which parity check matrix 100 is used.

A configuration of an LDPC-CC encoder that performs LDPC-CC encoding using parity check matrix 300 in FIG. 5 will now be described with reference to the accompanying drawings.

Figure 6:
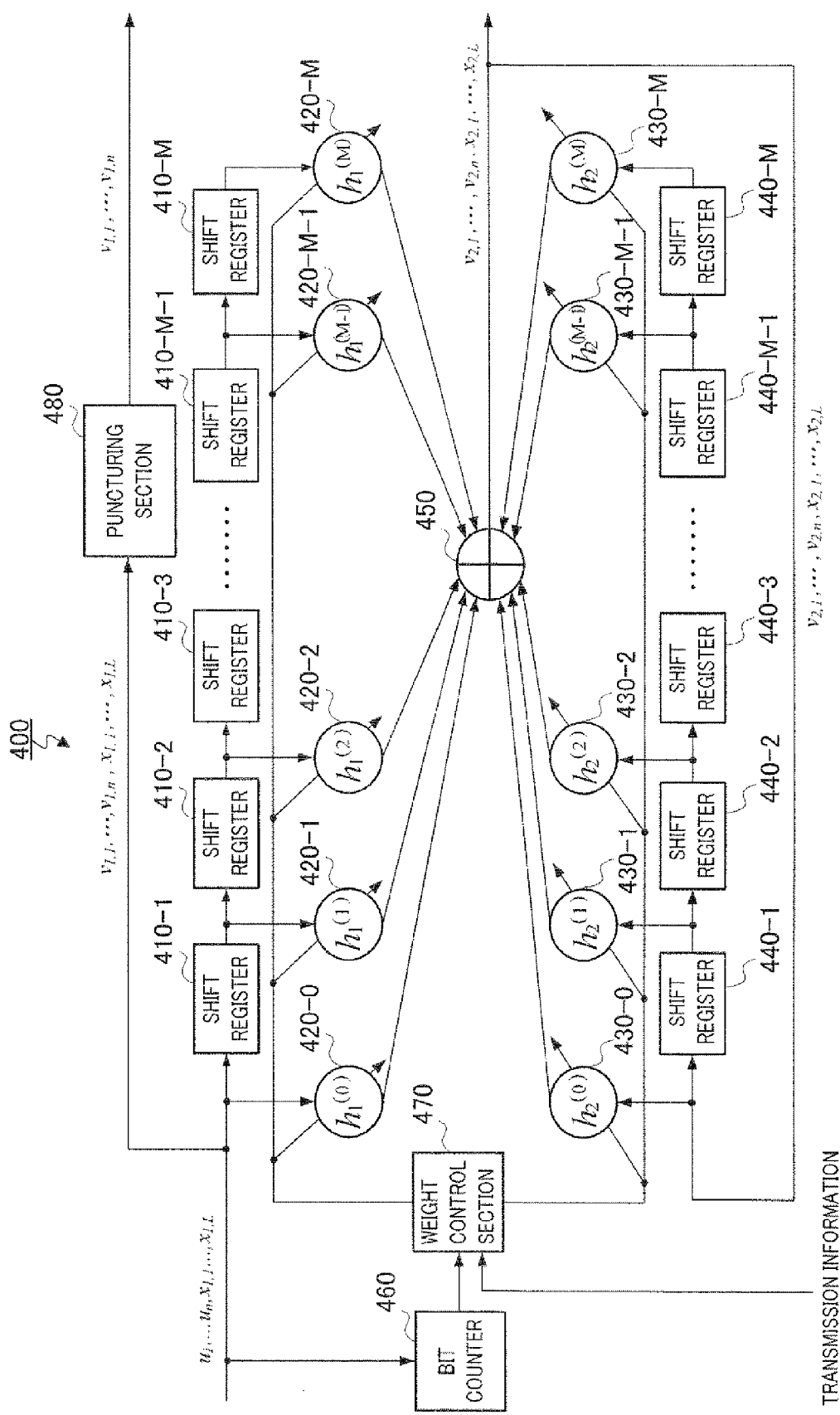
FIG. 6 is a block diagram showing a configuration of an LDPC-CC encoder according to Embodiment 1.

FIG. 6 is a block diagram showing a main configuration of an LDPC-CC encoder according to this embodiment.

In FIG. 6, LDPC-CC encoder 400 comprises shift registers 410-1 through 410-M and 440-1 through 440-M, weight multipliers 420-0 through 420-M and 430-0 through 430-M, modulo 2 adder (exclusive logical sum computing element) 450, bit counter 460, weight control section 470, and puncturing section 480.

Shift registers 410-1 through 410-M and 440-1 through 440-M are registers storing $v_{2,t-i}$ and $v_{2,t-i}$ (where i=0, ..., M) respectively, and at a timing at which the next input comes in, send a stored value to the adjacent shift register to the right, and store a new value sent from the adjacent shift register to the left. Here, n represents the transmission information sequence length of transmission information sequence $u_t$.

Weight multipliers 420-0 through 420-M and 430-0 through 430-M switch a weight value to 0 or 1 in accordance with a control signal output from weight control section 470.

Modulo 2 adder 450 performs modulo 2 addition on the outputs of weight multipliers 420-0 through 420-M and 430-0 through 430-M, and calculates $v_{2,t}$.

Bit counter 460 counts the number of bits of an input transmission information sequence and termination sequence, and outputs the bit count to weight control section 470.

Based on the bit count output from bit counter 460 and a weight pattern conforming to parity check matrix 300 stored in weight control section 470, weight control section 470 sends the values of parity check matrix elements $h_1^{(m)}(t)$ and $h_2^{(m)}(t)$ at that timing to weight multipliers 420-0 through 420-M and 430-0 through 430-M.

Figure 7:
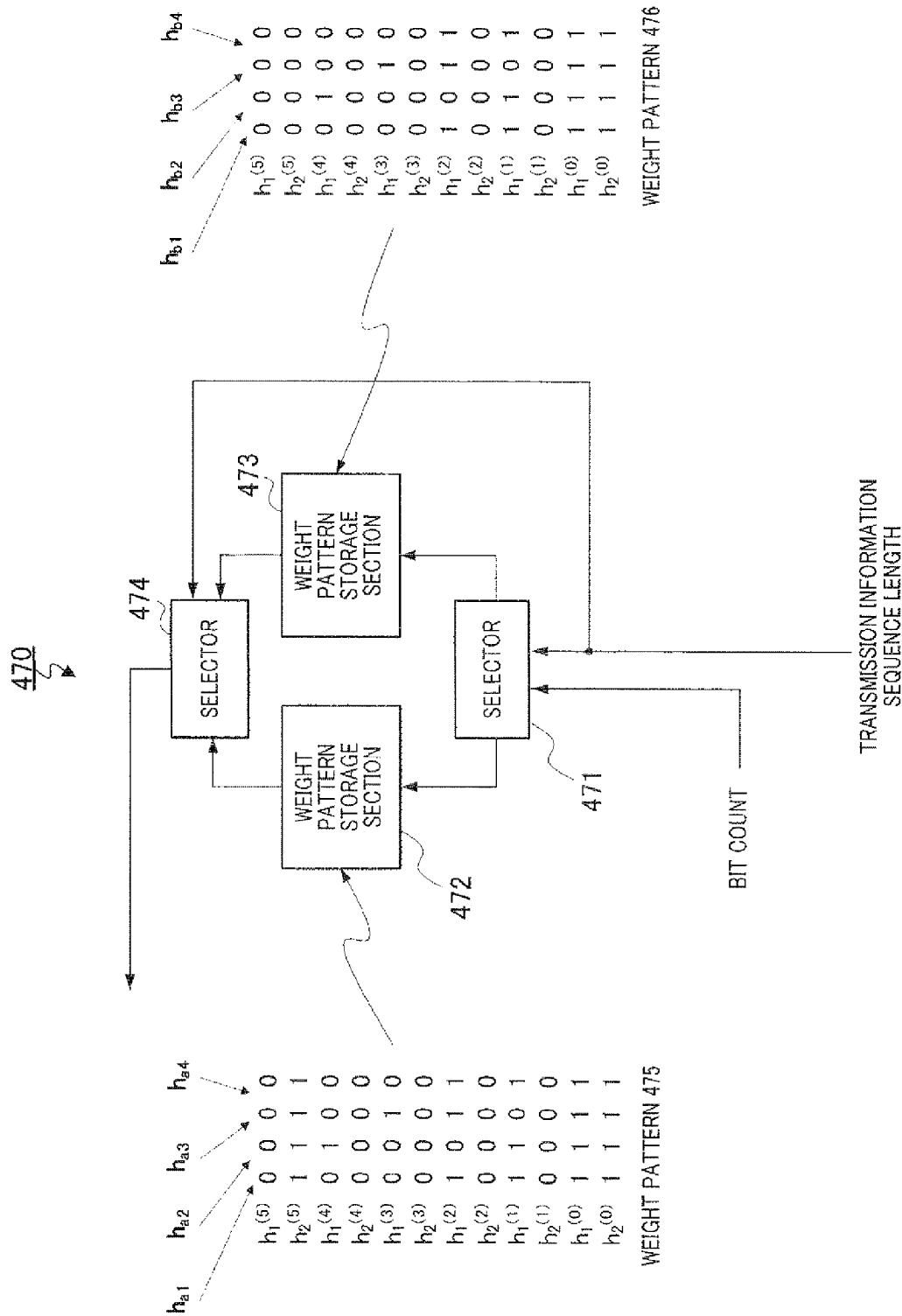
FIG. 7 is a block diagram showing a configuration of a weight control section according to Embodiment 1.

FIG. 7 is a configuration diagram of weight control section 470. Weight control section 470 comprises selectors 471 and 474, weight pattern storage section 472, and weight pattern storage section 473.

Selector 471 has a bit count and transmission information sequence length n as input, and if bit count≦transmission information sequence length n, sends the bit count to weight pattern storage section 472. On the other hand, if bit count>transmission information sequence length n, selector 471 sends the bit count to weight pattern storage section 473.

Weight pattern storage section 472 stores the weight pattern indicated by weight pattern 475, and outputs $h_{a1}, h_{a2}, h_{a3}$, and $h_{a4}$ to selector 474 periodically as the bit count increases. Weight pattern 475 comprises parity check matrix 100 matrix elements $h_{1(m)}(t)$ and $h_2^{(m)}(t)$ (where m=0, ..., M).

Weight pattern storage section 473 stores the weight pattern indicated by weight pattern 476, and outputs $h_{b1}, h_{b2}, h_{b3}$, and $h_{b4}$ to selector 474 periodically as the bit count increases. Weight pattern 476 comprises matrix elements $h_{1(m)}(t)$ and $h_2^{(m)}(t)$ (where m=0, ..., M) of parity check matrix 300 obtained by deforming parity check matrix 100 elements.

Selector 474 outputs matrix elements $h_{a1}, h_{a2}, h_{a3}$, and $h_{a4}$ input from weight pattern storage section 472 or matrix elements $h_{b1}, h_{b2}, h_{b3}$, and $h_{b4}$ input from weight pattern storage section 473, to weight multipliers 420-0 through 420-M and 430-0 through 430-M.

That is to say, when input bits are a transmission information sequence according to the result of a comparison between a bit count and transmission information sequence length in conjunction with selector 471, selector 474 outputs matrix elements of weight pattern 475 conforming to parity check matrix 100 stored in weight pattern storage section 472 to weight multipliers 420-0 through 420-M and 430-0 through 430-M. On the other hand, when input bits are a termination sequence, selector 474 outputs matrix elements of weight pattern 476 conforming to parity check matrix 300 obtained by deforming parity check matrix 100 stored in weight pattern storage section 473 to weight multipliers 420-0 through 420-M and 430-0 through 430-M.

Puncturing section 480 punctures termination sequence $x_{1,1}$ through $x_{1,L}$ from transmission codeword sequences $v_{1,1}$ through $v_{1,n}$ and $x_{1,1}$ through $x_{1,L}$.

The operation of LDPC-CC encoder 400 configured as described above will now be explained.

Transmission information sequence $u_1$ through $u_n$ and termination sequence $x_{1,1}$ through $x_{1,L}$ are output sequentially to shift register 410-1, weight multiplier 420-0, and bit counter 460, and transmission information sequence $u_t$ is output to puncturing section 480 as transmission codeword sequence $v_{2,t}$.

Bit counter 460 counts the number of bits of input transmission information sequence $u_1$ through $u_n$ and termination sequence $x_{1,1}$ through $x_{1,L}$, and outputs the obtained bit count to weight control section 470.

Weight control section 470 selects either weight pattern 475 or weight pattern 476 according to the result of a comparison between the bit count and transmission information sequence length n, and outputs matrix elements of the selected weight pattern to weight multipliers 420-0 through 420-M and 430-0 through 430-M.

Specifically, if bit count≦transmission information sequence length—that is, the input bits are a transmission information sequence—matrix elements of weight pattern 475 conforming to parity check matrix 100 are output to weight multipliers 420-0 through 420-M and 430-0 through 430-M. Weight pattern 475 is identical to a pattern used in conventional LDPC-CC encoding in which 1 is placed at the rightmost end of TOWS corresponding to $v_{2,n}, v_{2,n-1}, v_{2,n-2}, v_{2,n-3}$, and $v_{2,n-4}$.

On the other hand, if bit count>transmission information sequence length—that is, the input bits are a termination sequence—a weight pattern 476 parity check matrix conforming to parity check matrix 300 obtained by deforming parity check matrix 100 is output to weight multipliers 420-0 through 420-M and 430-0 through 430-M. Weight pattern 476 is a pattern in which a 1 placed at the rightmost end of rows corresponding to $v_{2,n}, v_{2,n-1}, v_{2,n-2}, v_{2,n-3}$, and $v_{2,n-4}$ has been changed to a 0 with respect to weight pattern 475. That is to say, this is a pattern in which rightmost $h_2^{(5)}$ of a parity check matrix row is 0 in FIG. 7. In the example of parity check matrix 100, $h_2^{(1)}$ through $h_2^{(4)}$ are 0, and therefore, by using weight pattern 476, when a termination sequence is input the weight value by which $v_{2,n}, v_{2,n-1}, v_{2,n-2}, v_{2,n-3}$, and $v_{2,n-4}$ are multiplied becomes 0, and $v_{2,n}, v_{2,n-1}, v_{2,n-2}, v_{2,n-3}$, and $v_{2,n-4}$ are no longer used in encoding of $x_{2,1}, x_{2,2}, x_{2,3}, x_{2,4}$, and $x_{2,5}$. As a result, it is no longer necessary for shift registers 440-0 through 440-M relating to $v_{2,t}$ to be made 0 at the end of encoding, and redundant bits for making $v_{2,t}$ 0 are unnecessary.

Furthermore, puncturing section 480 punctures termination sequence $x_{1,1}$ through $x_{1,L}$ from transmission codeword sequences $v_{1,1}$ through and $x_{1,1}$ through $x_{1,L}$. As a result, degradation of transmission efficiency due to termination sequence transmission can be reduced compared with a conventional method.

As described above, in this embodiment it has been assumed that LDPC-CC encoder 400 is equipped with plurality of shift registers 410-1 through 410-M and 440-1 through 440-M, plurality of weight multipliers 420-0 through 420-M that multiply outputs of shift registers 410-1 through 410-M and 440-1 through 440-M by a weight, modulo 2 adder 450 that performs modulo 2 addition of outputs of weight multipliers 420-0 through 420-M, bit counter 460 that counts a number of input bits that are encoded, and weight control section 470 that controls weights of weight multipliers 420-0 through 420-M according to the number of input bits. By this means, LDPC-CC encoding that uses an LDPC-CC parity check matrix can be performed.

Also, it has been assumed that weight control section 470 stores weight pattern 475 conforming to LDPC-CC parity check matrix 100 and weight pattern 476 conforming to parity check matrix 300 obtained by deforming LDPC-CC parity check matrix 100, and uses weight pattern 475 when input bits are an information sequence, and uses weight pattern 476 when input bits are a termination sequence. By this means, transmission codeword sequences $v_{1,t}$ and $v_{2,t}$ can be acquired by using weight pattern 475 when transmission information sequence $u_t$ is input, and transmission codeword sequences $v_{1,t}$ and $v_{2,t}$ can be acquired by using weight pattern 476 in which the weight value by which $v_{2,t}$ is multiplied is made 0 when termination sequence $x_{1,m}$ is input, thereby enabling a transmitted termination sequence to be reduced.

Furthermore, by providing puncturing section 480 that punctures a zero sequence ($x_{1,1}$ through $x_{1,L}$) known by the transceiver side and the receiver side that is transmitted for termination, a decrease in transmission efficiency due to termination sequence transmission can be suppressed.

Whereas with a termination method disclosed in Non-Patent Document 2 separate circuitry is necessary in order to find termination sequence $x_{1\times 2L}$ (see Non-Patent Document 3), this embodiment enables encoding processing including termination to be completed without the need for such special circuitry.

(Sample Variant)

Figure 8:
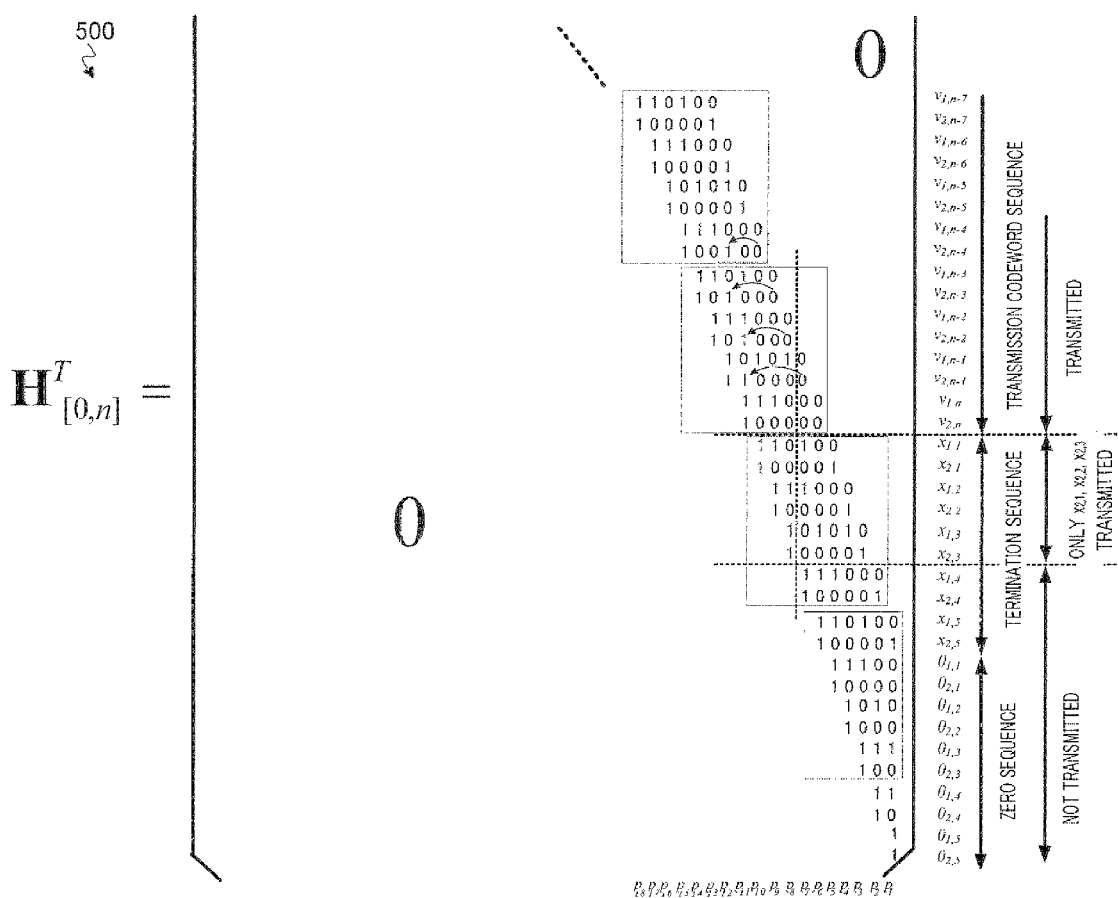
FIG. 8 is a drawing showing another example of a parity check matrix according to Embodiment 1.

FIG. 8 is a drawing showing another example of a parity check matrix according to this embodiment. In parity check matrix 500 in FIG. 8, a 1 placed in the rightmost position of a row corresponding to $v_{2,1}$ in parity check equations ($p_6, p_7, p_8, p_9, p_{10}$) used for encoding of $x_{2,1}, x_{2,2}, x_{2,3}, x_{2,4}$, and $x_{2,5}$ is changed to a 0, and furthermore a 1 is newly placed in a column other than a parity check equation ($p_6, p_7, p_8, p_9, p_{10}$) used for encoding of $x_{2,1}, x_{2,2}, x_{2,3}, x_{2,4}$, and $x_{2,5}$ in rows corresponding to $v_{2,n}, v_{2,n-1}, v_{2,n-2}, v_{2,n-3}$, and $v_{2,n-4}$. As shown by the arrows in FIG. 8, positions at which a 1 is placed are shifted to a column other than a parity check equation ($p_6, p_7, p_8, p_9, p_{10}$) used for encoding of $x_{2,1}, x_{2,2}, x_{2,3}, x_{2,4}$, and $x_{2,5}$.

In this way, in addition to obtaining the same kind of effect as with parity check matrix 300 in at least halving a transmitted termination sequence to L bits from the conventional 2L bits, parity check matrix 500 enables encoding gain due to repetition code decoding processing in sum-product decoding to be maintained since the number of row-direction 1s (row weight) does not change in a row in which a position at which a 1 is placed is shifted.

Also, although parity check matrix 500 in FIG. 8 illustrates an example in which the number of 1s shifted to the left is not the same for each row, parity check matrix 500 is not limited to this, and provision may also be made for the same number of 1s to be shifted to the left in each row. When the number of 1s shifted to the left is the same for each row, fewer kinds of weight patterns need to be stored by weight control section 470 than when the number of 1s shifted to the left is not the same for each row.

The effect of the present invention of suppressing degradation of transmission efficiency through a reduction in the amount of a termination sequence can also be obtained if all 1s relating to encoding of $x_{2,1}, x_{2,2}, x_{2,3}, x_{2,4}$, and $x_{2,5}$ are shifted, or if only 1s of some rows are shifted and is of other rows are only changed to 0 or the like.

(Embodiment 2)

In this embodiment, descriptions are given of a parity check matrix that is designed so that memory length M of LDPC-CC decreases toward the rear of a transmission information sequence in order to reduce the number of termination sequence, and a configuration of an LDPC-CC encoder that is based on that parity check matrix.

Figure 9:
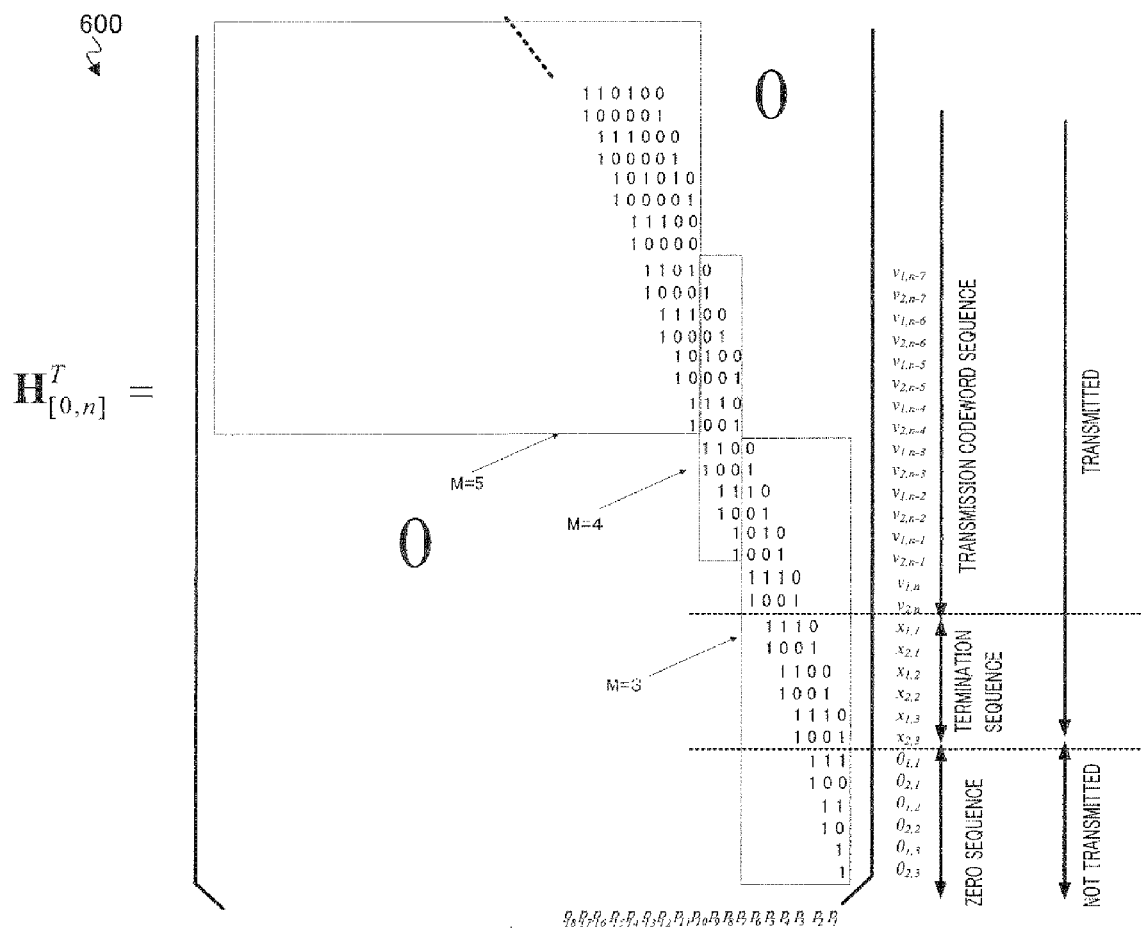
FIG. 9 is a drawing showing an example of a parity check matrix according to Embodiment 2 of the present invention.

FIG. 9 shows an example of a parity check matrix according to this embodiment. Parity check matrix 600 in FIG. 9 is an example of a case with coding rate R=b/c=½ and transmission information sequence length n. Parity check matrix 600 differs from parity check matrix 100 in FIG. 3 that memory length M decreases from 5 to 4 to 3 successively as the index of transmission information sequence $u_t$ approaches n.

That is to say, as shown in FIG. 9, when parity check matrix 600 is used encoding is performed for transmission information sequence $u_t$ through $u_{n-4}$ with memory length M=5, and transmission codeword sequences $v_{1,1}$ through $v_{1,n-4}$ and $v_{2,1}$ through $v_{2,n-4}$ are acquired. For transmission information sequence $u_{n-3}$ through $u_{n-1}$, encoding is performed with memory length M=4, and transmission codeword sequences through $v_{1,n-1}$ and $v_{2,n-3}$ through $v_{2,n-1}$ are acquired. And for transmission information sequence $u_n$ and termination sequence $x_{1,1}$ through $x_{1,3}$, encoding is performed with memory length M=3, and $v_{1,n}, v_{2,n}$ and $x_{1,1}$ through $x_{1,3}, x_{2,1}$ through $x_{2,3}$ are acquired.

As explained above, it is necessary for termination sequence length L to satisfied the relationship L≧M. Therefore, if encoder memory length M is small at a point in time at which termination is performed, termination sequence length L can be made correspondingly shorter.

Thus, by performing LDPC-CC encoding using parity check matrix 600 shown in FIG. 9, the length of a termination sequence can be made shorter than heretofore, and as a result, degradation of transmission efficiency due to termination sequence transmission can be suppressed.

A characteristic of an LDPC-CC is that greater encoding gain and a better error rate characteristic are obtained the larger the value of memory length M. Consequently, if memory length M is reduced toward the rear of a transmission codeword sequence, as in the case of parity check matrix 600, the bit error rate of the rear part can be expected to degrade. However, a characteristic of an LDPC-CC is that, since a shift register state at the end of encoding is decided as an all-zero state by performing appropriate termination processing, and LLRs of zero sequence which follows a termination sequence can be set to infinity at the time of decoding, the bit error rate of the rear part of a information sequence is better than that of other parts.

Consequently, when LDPC-CC encoding using parity check matrix 600 whose memory length M is reduced toward the rear of a transmission codeword sequence is performed, a problem of degradation of the bit error rate of the rear part of a information sequence does not arise.

Next, we describe a configuration of an LDPC-CC encoder that performs LDPC-CC encoding using parity check matrix 600 in FIG. 9 with reference to the accompanying drawings.

Figure 10:
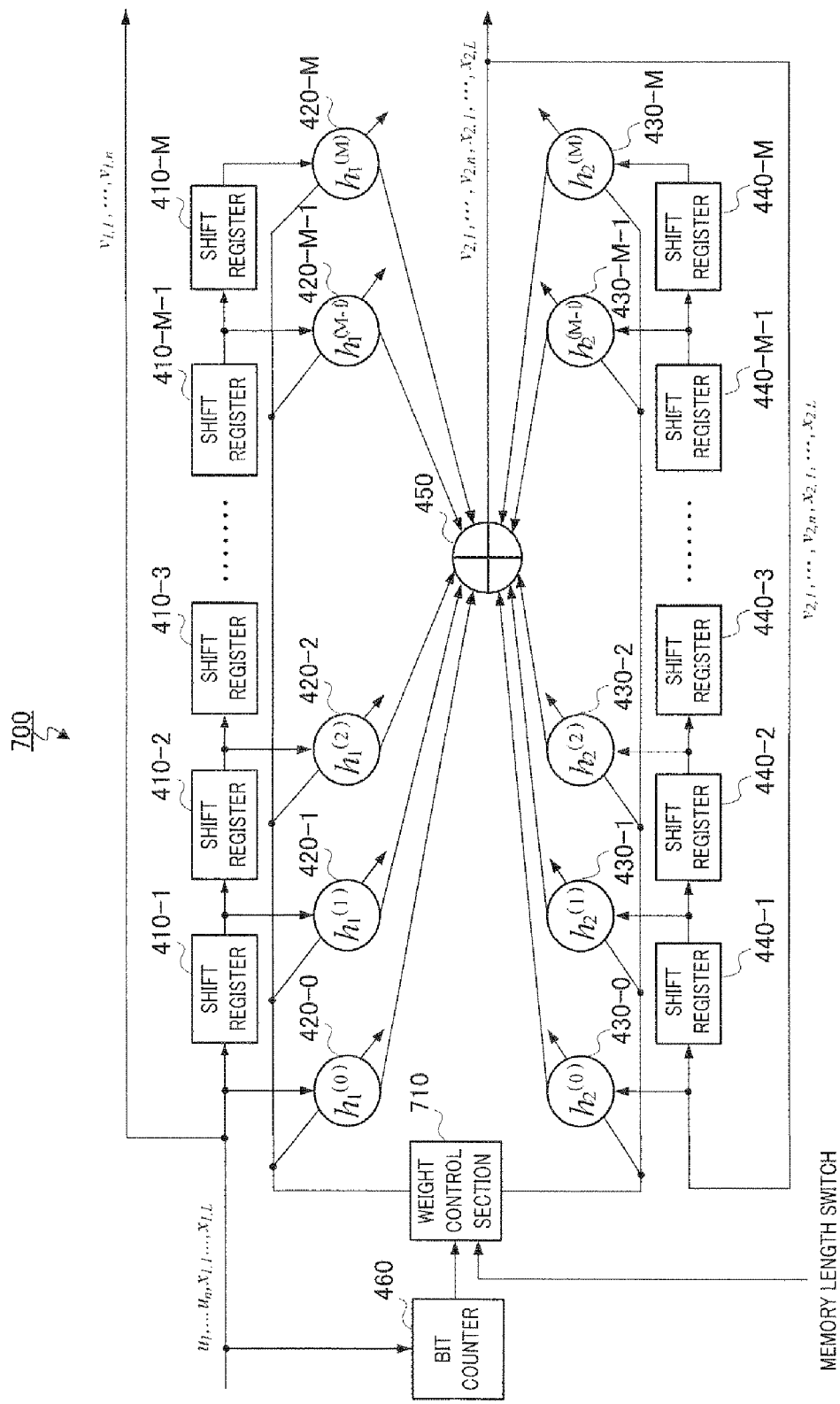
FIG. 10 is a block diagram showing a configuration of an LDPC-CC encoder according to Embodiment 2.

FIG. 10 is a block diagram showing a main configuration of an LDPC-CC encoder according to this embodiment. In the description of this embodiment, configuration parts identical to those in FIG. 6 are assigned the same reference numbers as in FIG. 6, and descriptions thereof are omitted. As compared with LDPC-CC encoder 400 in FIG. 6, LDPC-CC encoder 700 in FIG. 10 does not have puncturing section 480 and is equipped with weight control section 710 instead of weight control section 470.

Based on a bit count output from bit counter 460, memory length switch timing information, and a weight pattern conforming to parity check matrix 600 stored in weight control section 710, weight control section 710 sends the values of matrix elements $h_1^{(m)}(t)$ and $h_2^{(m)}(t)$ at that timing to weight multipliers 420-0 through 420-M and 430-0 through 430-M.

Here, memory length switch timing information denotes a transmission information sequence index that switches memory length M of parity check matrix 600. For example, if three kinds of memory length M are used, memory length switch timing information can have two values. That is to say, as memory lengths, memory length switch timing information has a timing information index that switches from M=5 to M=4, and a timing information index that switches from M=4 to M=3.

Figure 11:
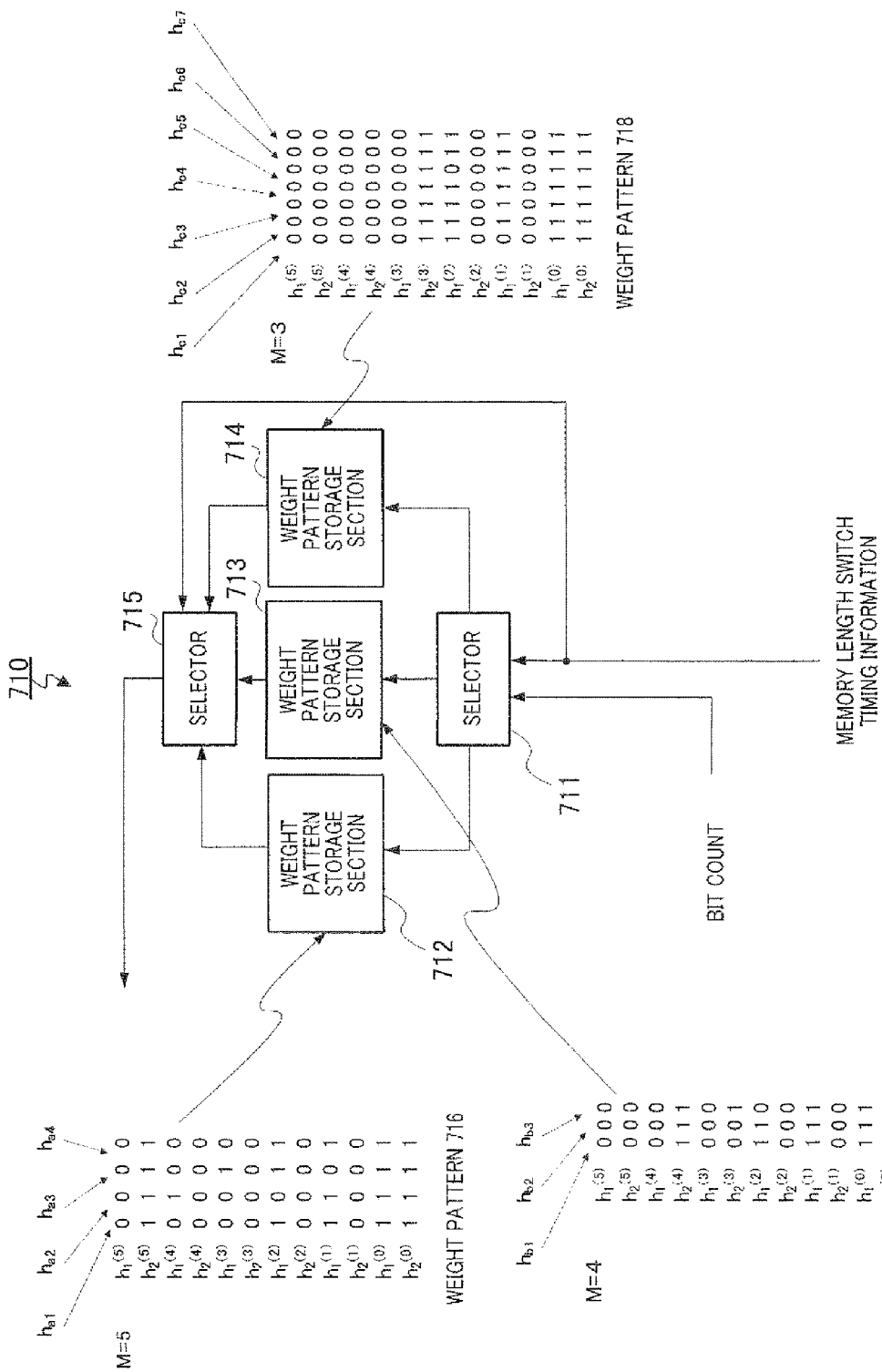
FIG. 11 is a block diagram showing a configuration of a weight control section according to Embodiment 2.

FIG. 11 shows a sample configuration of weight control section 710 when using three kinds of memory length M: M=5, 4, and 3. Weight control section 710 in FIG. 11 comprises selectors 711 and 715, and weight pattern storage sections 712 through 714. Below, an index indicating timing for switching from memory length M=5 to M=4 is referred to as memory length switch timing information 1, and an index indicating timing for switching from memory length M=4 to M=3 is referred to as memory length switch timing information 2.

Selector 711 has a bit count and memory length switch timing information 1 and 2 as input, and if bit count≦memory length switch timing information 1, sends the bit count to weight pattern storage section 712.

On the other hand, if bit count>memory length switch timing information 1, and bit count≦memory length switch timing information 2, selector 711 sends the bit count to weight pattern storage section 713.

Furthermore, if bit count>memory length switch timing information 2, selector 711 sends the bit count to weight pattern storage section 714.

Weight pattern storage section 712 stores the weight pattern indicated by weight pattern 716, and outputs $h_{a1}, h_{a2}, h_3$, and $h_{a4}$ to selector 715 periodically as the bit count increases. Weight pattern 716 comprises matrix elements $h_1^{(m)}(t)$ and $h_2^{(m)}(t)$ (where m=0, . . . , 5) of an LDPC-CC parity check matrix for a case in which memory length M=5.

Weight pattern storage section 713 stores the weight pattern indicated by weight pattern 717, and outputs $h_{b1}, h_{b2}$, and $h_{b3}$ to selector 715 periodically as the bit count increases. Weight pattern 717 comprises matrix elements $h_1^{(m)}(t)$ and $h_2^{(m)}(t)$ (where m=0, . . . , 4) of an LDPC-CC parity check matrix for a case in which memory length M=4, and $h_1^{(5)}=0$ and $h_2^{(5)}=0$. When memory length M=4, the number of $h_{b1}, h_{b2}, h_{b3}$ weight pattern elements is 10, but LDPC-CC encoder 700 is equipped with 12 weight multipliers 420-0 through 420-M and 430-0 through 430-M capable of handling memory length M=5. Consequently, in weight pattern 717, the $h_1^{(5)}$ and $h_2^{(5)}$ weight elements are 0 in any pattern.

Weight pattern storage section 714 stores the weight pattern indicated by weight pattern 718, and outputs $h_{c1}, h_{c2}, h_{c3}, h_{c4}, h_{c5}, h_{c6}$, and $h_{c7}$ to selector 715 periodically as the bit count increases. Weight pattern 718 comprises matrix elements $h_1^{(m)(t) \, and \, h_2^{(m)}}(t)$ (where m=0, . . . , 3) of an LDPC-CC parity check matrix for a case in which memory length M=3, and $h_1^{(4)}=0, h_2^{(4)}=0, h_1^{(5)}=0$, and $h_2^{(5)}=0$. In the same way as when memory length M=4, in weight pattern 718, the $h_1^{(4)}, h_2^{(4)}, h_1^{(5)}$, and $h_2^{(5)}$ weight elements are 0 in any pattern.

Selector 715 outputs matrix elements $h_{a1}, h_{a2}, h_{a3}$, and $h_{a4}$ input from weight pattern storage section 712, matrix elements $h_{b1}, h_{b2}$, and $h_{b3}$ input from weight pattern storage section 713, or matrix elements $h_{c1}, h_{c2}, h_{c3}, h_{c4}, h_{c5}, h_{c6}$, and $h_{c7}$ input from weight pattern storage section 714, to weight multipliers 420-0 through 420-M and 430-0 through 430-M.

That is to say, if bit count≦memory length switch timing information 1 according to the result of a comparison between a bit count and memory length switch timing information 1 and 2 in conjunction with selector 711, selector 715 outputs matrix elements of weight pattern 716 conforming to a parity check matrix with memory length M=5 stored in weight pattern storage section 712 to weight multipliers 420-0 through 420-M and 430-0 through 430-M.

On the other hand, if bit count>memory length switch timing information 1 and bit count≦memory length switch timing information 2, selector 715 outputs matrix elements of weight pattern 717 conforming to a parity check matrix with memory length M=4 stored in weight pattern storage section 713 to weight multipliers 420-0 through 420-M and 430-0 through 430-M.

Furthermore, if bit count>memory length switch timing information 2, selector 715 outputs matrix elements of weight pattern 718 conforming to a parity check matrix with memory length M=3 stored in weight pattern storage section 714 to weight multipliers 420-0 through 420-M and 430-0 through 430-M.

The operation of LDPC-CC encoder 700 configured as described above will now be explained.

Transmission information sequence $u_1$ through $u_n$ and termination sequence $x_{1,1}$ through $x_{1,L}$ are input sequentially to shift register 410-1, weight multiplier 420-0, and bit counter 460.

Bit counter 460 counts the number of bits of input transmission information sequence $u_1$ through $u_n$ and termination sequence $x_{1,1}$ through $x_{1,L}$, and outputs the obtained bit count to weight control section 710.

Weight control section 710 selects weight pattern 716, weight pattern 717, or weight pattern 718 according to the result of a comparison between the bit count and memory length switch timing information, and outputs matrix elements of the selected weight pattern to weight multipliers 420-0 through 420-M and 430-0 through 430-M.

Specifically, if bit count≦memory length switch timing information 1, matrix elements of weight pattern 716 conforming to a parity check matrix with memory length M=5 are output to weight multipliers 420-0 through 420-M and 430-0 through 430-M.

If bit count>memory length switch timing information 1 and bit count≦memory length switch timing information 2, matrix elements of weight pattern 717 conforming to a parity check matrix with memory length M=4 are output to weight multipliers 420-0 through 420-M and 430-0 through 430-M.

And if bit count>memory length switch timing information 2, matrix elements of weight pattern 718 conforming to a parity check matrix with memory length M=3 are output to weight multipliers 420-0 through 420-M and 430-0 through 430-M.

In this way, the number of bits of a past transmission codeword sequence necessary for generating a transmission codeword sequence can be reduced as a transmission codeword sequence approaches its end.

As described above, according to this embodiment, weight control section 710 stores weight patterns 716, 717, and 718 conforming to parity check matrices with different memory lengths, and when input bits are an information sequence, a weight pattern with a shorter memory length is used toward the rear of the information sequence. Since termination sequence length L can be made shorter as memory length M decreases, using a weight pattern with a shorter memory length toward the rear of an information sequence enables termination sequence length L to be made shorter and degradation of transmission efficiency to be suppressed.

In this embodiment, a case has been described by way of example in which memory length M is decreased by 1 at a time—from 5 to 4 to 3—as the rear of a transmission information sequence is approached, but this is not a limitation, and an effect of suppressing transmission efficiency degradation through a reduction in the termination sequence transmission amount can still be obtained by the present invention if a parity check matrix for which reduction is performed to an arbitrary memory length, or for which a memory length reduction amount is set arbitrarily, is used.

(Embodiment 3)

In this embodiment, descriptions are given of a parity check matrix that is designed so that the coding rate of LDPC-CC decreases toward the rear of a transmission information sequence in order to reduce transmission errors in the rear part of a information sequence by reducing the number of termination sequences, and a configuration of an LDPC-CC encoder that is based on that parity check matrix.

Figure 12:
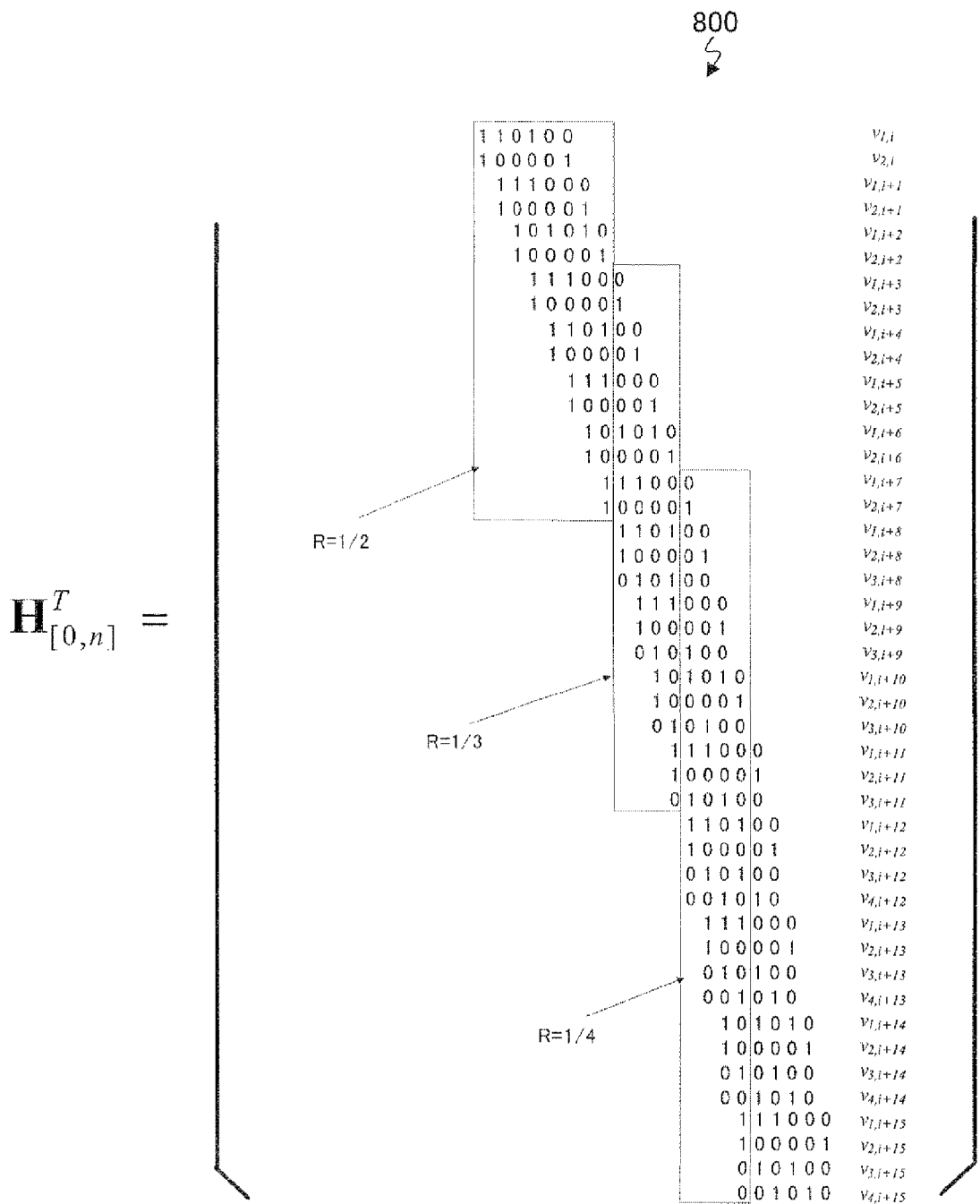
FIG. 12 is a drawing showing an example of a parity check matrix according to Embodiment 3 of the present invention.

FIG. 12 shows an example of a parity check matrix according to this embodiment. Parity check matrix 800 in FIG. 12 is an example of a case with memory length M=5 and transmission information sequence length n. Parity check matrix 800 differs from a conventional LDPC-CC parity check matrix in that coding rate R decreases from ½ to ⅓ to ¼ successively as the index of transmission codeword sequence $u_i$ increases.

That is to say, as shown in FIG. 12, when parity check matrix 800 is used encoding is performed for transmission information sequence $u_i$ through $u_{i+7}$ with a coding rate ½, and transmission codeword sequences $v_{1,1}$ through $v_{1,i+7}$ and $v_{2,1}$ through $v_{2,i+7}$ are acquired. For transmission information $u_{i+8}$ through $u_{i+11}$, encoding is performed with a coding rate ⅓, and transmission codeword sequences $v_{1,i+8}$ through $v_{1,i+11}$, $v_{2,i+8}$ through $v_{2,i+11}$, and $v_{3,i+8}$ through $v_{3,i+11}$ are acquired. And for transmission information $u_{i+12}$ through $u_{i+15}$, encoding is performed with a coding rate ¼, and transmission codeword sequences $v_{1,i+12}$ through $v_{1,i+15}$, $v_{2,i+12}$ through $v_{2,i+15}$, $v_{3,i+12}$ through $v_{3,i+15}$, and $v_{4,i+12}$ through $v_{4,i+15}$ are acquired.

Thus, by performing LDPC-CC encoding using parity check matrix 800 shown in FIG. 12, an LDPC-CC codeword with a lower coding rate can be generated toward the rear of a transmission codeword sequence. Since error correction capability is higher the lower the coding rate, this enables a bit error occurring in the rear part of an information sequence to be corrected even if an entire termination sequence is not transmitted.

Next, we describe a configuration of an LDPC-CC encoder that performs LDPC-CC encoding using parity check matrix 800 in FIG. 12 with reference to the accompanying drawings.

Figure 13:
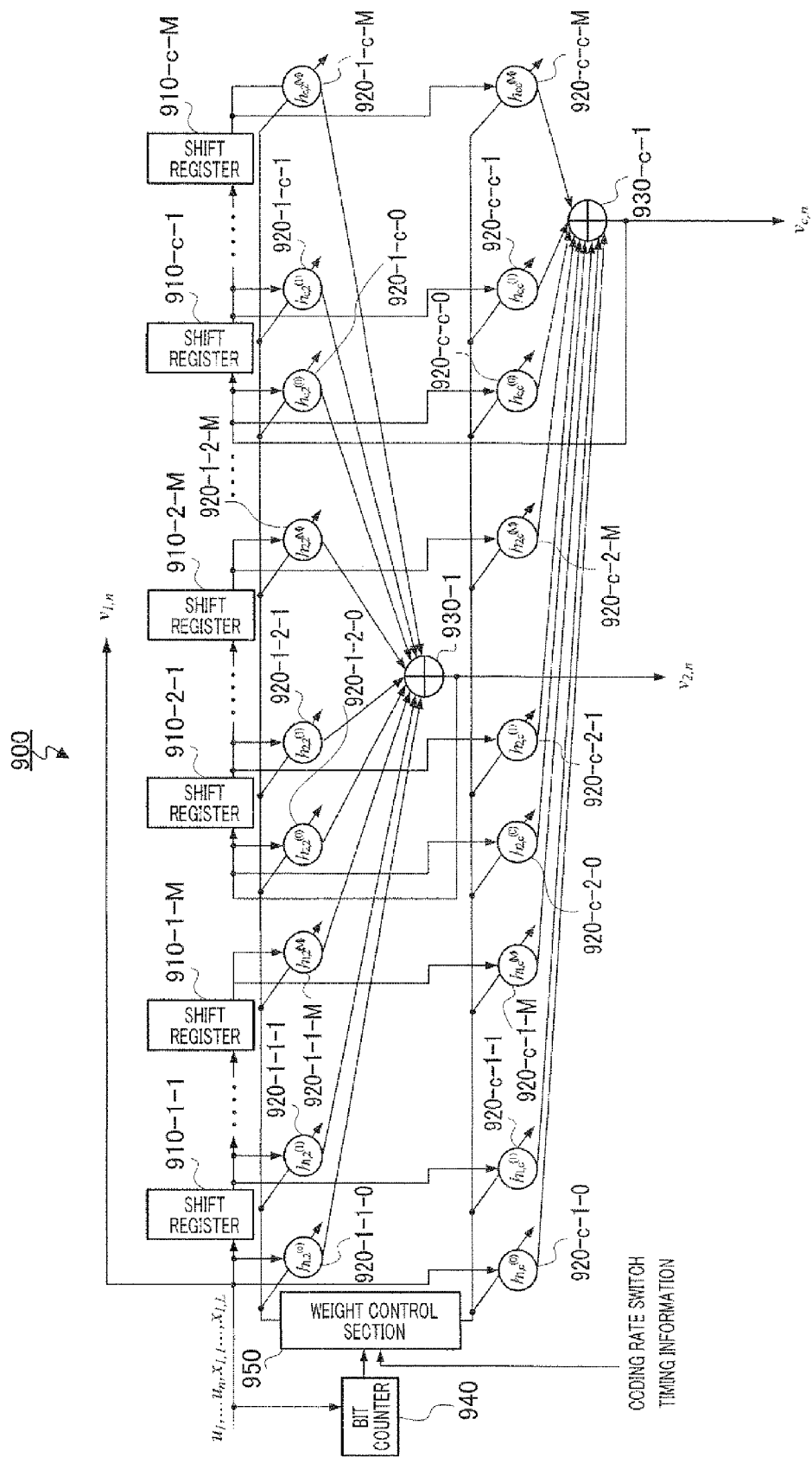
FIG. 13 is a block diagram showing a configuration of an LDPC-CC encoder according to Embodiment 3.

FIG. 13 is a block diagram showing a main configuration of an LDPC-CC encoder according to this embodiment.

LDPC-CC encoder 900 in FIG. 13 comprises shift registers 910-1-1 through 910-c-M, weight multipliers 920-1-1-0 through 920-c-c-M, modulo 2 adders 930-1 through 930-c-1, bit counter 940, and weight control section 950.

The shift registers, weight multipliers, bit counter, and weight control section in LDPC-CC encoder 900 are similar to the shift registers, weight multipliers, bit counter, and weight control section in conventional use and in above Embodiments 1 and 2, and therefore descriptions thereof are omitted here.

Based on a bit count output from bit counter 940, coding rate switch timing information, and a weight pattern conforming to a parity check matrix stored in weight control section 950, weight control section 950 sends the values of parity check matrix elements $h_{1,2}^{(m)}(t)$, $h_{2,2}^{(m)}(t)$, $h_{c,c}^{(m)}(t)$ at that timing to weight multipliers 920-1-1-0 through 920-c-c-M.

Here, coding rate switch timing information denotes a transmission information sequence index that switches coding rate R of parity check matrix 800. For example, if three kinds of coding rate R are used, coding rate switch timing information can have two values. That is to say, when using coding rate R=½, ⅓, and ¼, coding rate switch timing information has a timing information index that switches from R=½ to R=⅓, and a timing information index that switches from R=⅓ to R=¼.

The configuration and weight pattern switching processing of weight control section 950 are similar to those of weight control section 710, and therefore descriptions thereof are omitted here.

As described above, according to this embodiment, weight control section 950 stores a plurality of weight patterns conforming to LDPC-CC parity check matrices with different coding rates, and when input bits are an information sequence, a weight pattern with a lower coding rate is used toward the rear of the information sequence. Since error correction capability is higher the lower the coding rate, this enables degradation of transmission efficiency to be suppressed while correcting bit errors occurring in the rear part of an information sequence, even if a termination sequence is reduced.

(Embodiment 4)

In this embodiment, a transmitting apparatus is described that is equipped with a termination sequence puncturing section that reduces a termination sequence amount by puncturing some bits of a termination sequence after LDPC-CC encoding in order to reduce the number of termination sequences in an LDPC-CC.

Figure 14:
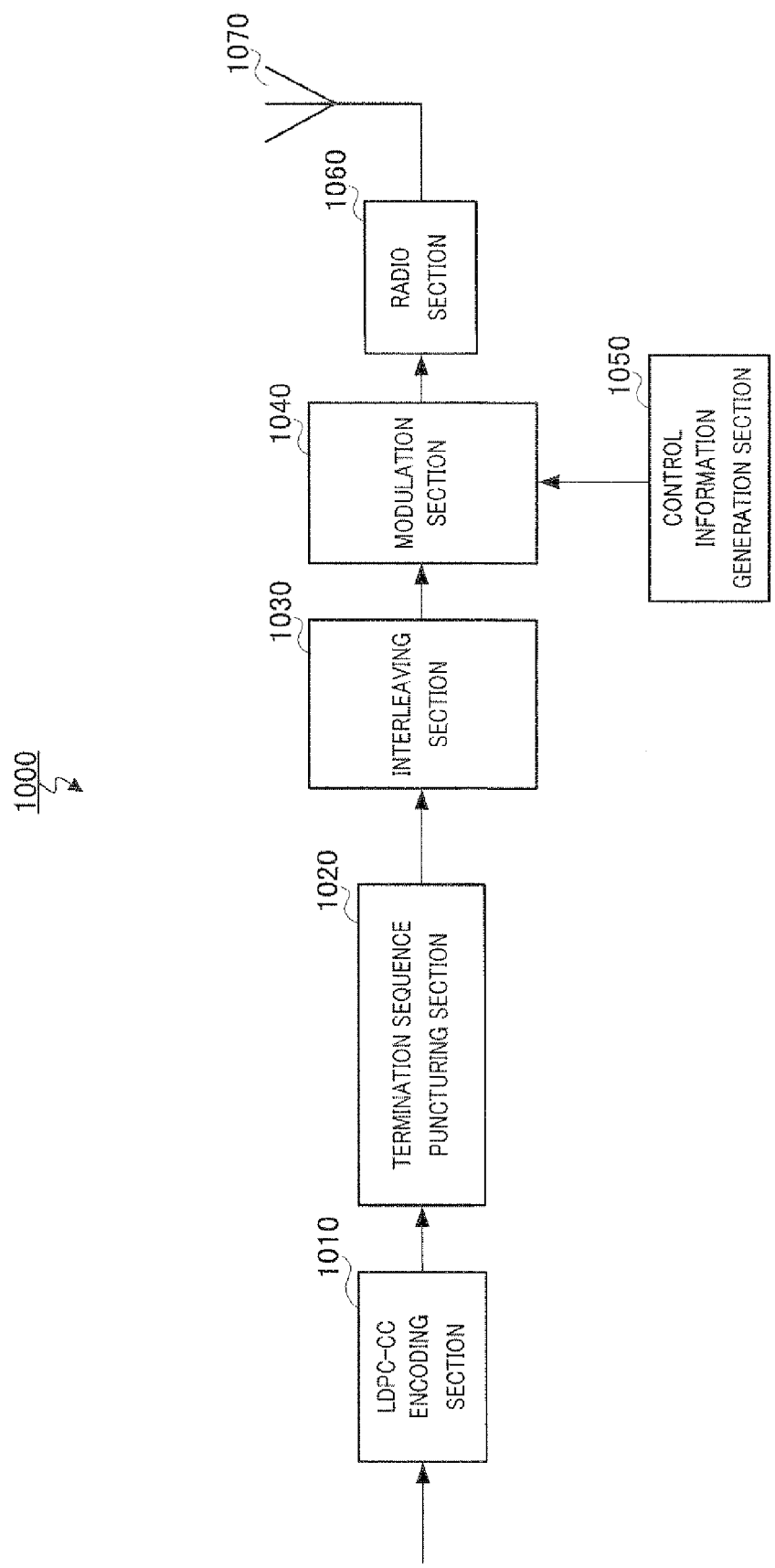
FIG. 14 is a block diagram showing a main configuration of a transmitting apparatus according to Embodiment 4 of the present invention.

FIG. 14 is a block diagram showing a main configuration of a transmitting apparatus according to this embodiment. Transmitting apparatus 1000 in FIG. 14 comprises LDPC-CC encoding section 1010, termination sequence puncturing section 1020, interleaving section 1030, modulation section 1040, control information generation section 1050, radio section 1060, and transmitting antenna 1070.

LDPC-CC encoding section 1010 performs LDPC-CC encoding processing on an input sequence in which a termination sequence has been added to a transmission information sequence, and outputs a encoded transmission codeword sequence to termination sequence puncturing section 1020.

Termination sequence puncturing section 1020 performs puncturing on a termination sequence within a transmission codeword sequence, and outputs a punctured termination sequence to interleaving section 1030. Puncturing processing will be described later herein.

Interleaving section 1030 performs sequence order rearrangement processing (interleaving) on a transmission codeword sequence, and outputs a interleaved transmission codeword sequence to modulation section 1040.

Modulation section 1040 modulates a interleaved transmission codeword sequence using a modulation method such as PSK (Phase Shift Keying), QAM (Quadrature Amplitude Modulation) and so on, and outputs a transmission modulated symbol sequence to radio section 1060.

Control information generation section 1050 generates control information necessary for transmitting and receiving signals between the transceiver and the receiver, and sends this control information to modulation section 1040. Control information includes the modulation method and transmission information sequence length, a preamble signal for time/frequency synchronization, and so forth.

Radio section 1060 performs radio modulation processing such as D/A (Digital to Analog) conversion, frequency conversion, and RF (Radio Frequency) filtering processing on a transmission modulated symbol sequence, generates a transmission RF signal, and transmits this signal via transmitting antenna 1070.

The operation of transmitting apparatus 1000 configured as described above will now be explained, focusing mainly on puncturing processing by termination sequence puncturing section 1020. In the following description, it is assumed that LDPC-CC coding rate is R=b/c in LDPC-CC encoding section 1010.

In LDPC-CC encoding section 1010, LDPC-CC encoding processing is executed on an input sequence in which a termination sequence has been added to transmission information sequence $u_i$ (where i=1, n), and transmission codeword sequence $[v_{k,i}\ x_{k,j}]$ is acquired. Here, k=1, . . . , c and j=1, . . . , L, where L denotes the sequence length of a termination sequence. The LDPC-CC encoding method is described in Non-Patent Document 1 and Non-Patent Document 2, and therefore a description thereof is omitted here.

in termination sequence puncturing section 1020, puncturing processing is executed on $x_{k,j}$ corresponding to a termination sequence within transmission codeword sequence $[v_{k,i}\ x_{k,j}]$ output from LDPC-CC encoding section 1010.

Figure 15:
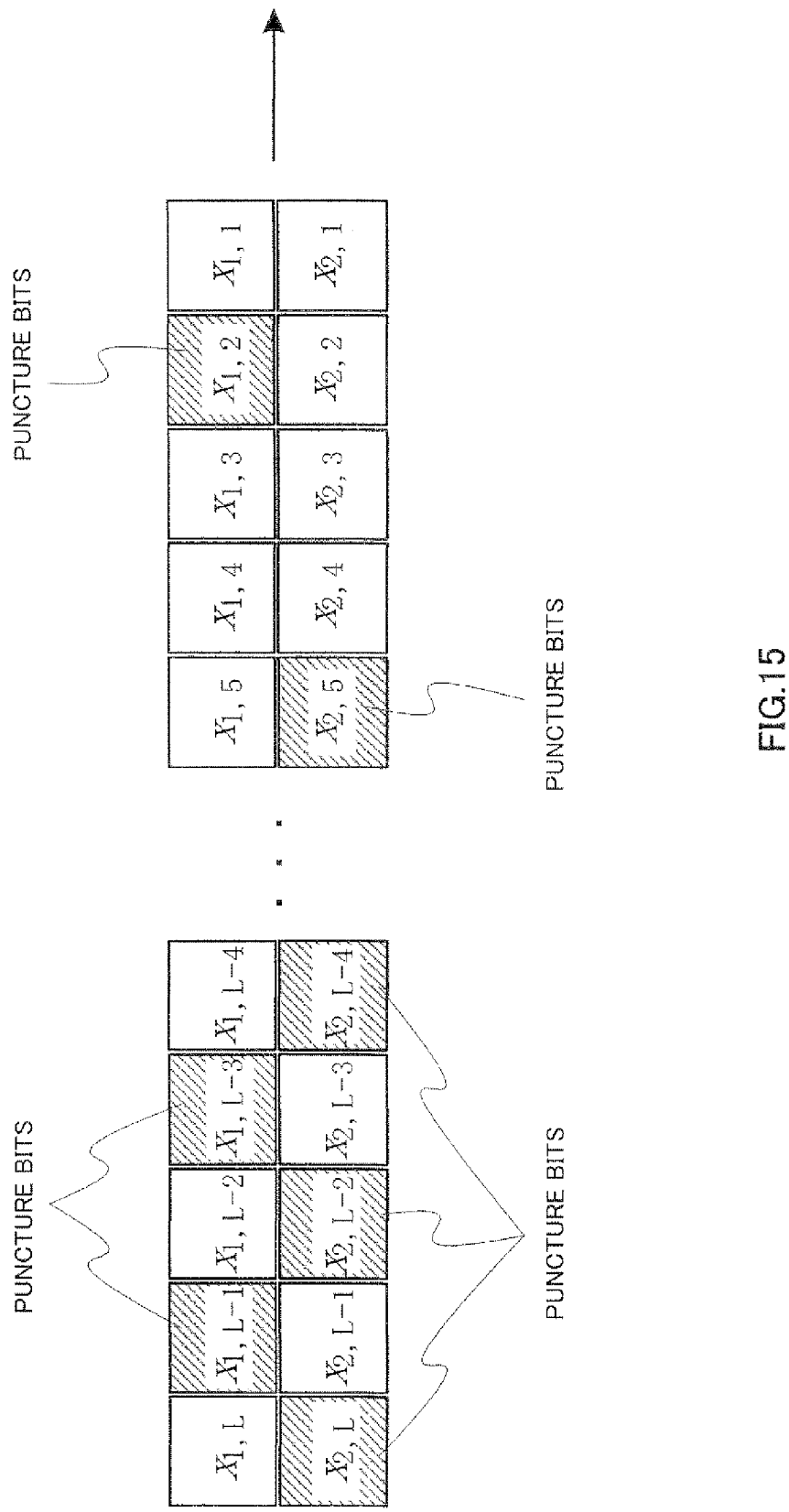
FIG. 15 is a drawing for explaining an example of puncturing according to Embodiment 4.

FIG. 15 shows an example of puncturing executed by termination sequence puncturing section 1020. FIG. 15 shows an example of a case in which coding rate R=½ (b=1, c=2), in which the upper part indicates $x_{1,1}$ through $x_{1,L}$, and the lower part indicates $x_{2,1}$ through $x_{2,L}$, and each sequence is input to termination sequence puncturing section 1020 in left-to-right order. In FIG. 15, diagonally hatched $x_{k,j}$ bits represent bits punctured by termination sequence puncturing section 1020. As shown in FIG. 15, in this embodiment termination sequence puncturing section 1020 uses a lower puncturing frequency for bits in the front part of a termination sequence, and uses a higher puncturing frequency for bits in the rear part of a termination sequence.

In LDPC-CC encoding, the more to the front a part of a termination sequence is, the nearer it is to a transmission information sequence, and therefore the rear part of a termination sequence has less effect on transmission codeword sequence $v_{k,i}$ than the front part. Therefore, by having termination sequence puncturing section 1020 increase the proportion of punctured bits toward the rear of a termination sequence, the termination sequence transmission amount can be reduced while suppressing degradation of the error rate of an information sequence due to puncturing.

A punctured transmission codeword sequence is interleaved by interleaving section 1030, and modulation is executed on the interleaved transmission codeword sequence and control information by modulation section 1040. A modulated symbol sequence has radio modulation processing executed on it by radio section 1060, and a transmission RF signal is transmitted via transmitting antenna 1070.

As described above, in this embodiment transmitting apparatus 1000 is equipped with termination sequence puncturing section 1020 that punctures a termination sequence included in a sequence after LDPC-CC encoding, and termination sequence puncturing section 1020 increases the proportion of punctured bits toward the rear of a termination sequence.

By using a puncture pattern having a low puncturing frequency for bits in the front part of a termination sequence, and using a puncture pattern having a high puncturing frequency for bits in the rear part of a termination sequence, bits having relatively little effect on transmission codeword sequence $v_{k,i}$ during encoding—that is, bits in the rear part of a termination sequence—are punctured preferentially, enabling the termination sequence transmission amount to be reduced while suppressing degradation of the error rate of an information sequence due to puncturing.

Puncture patterns in termination sequence puncturing section 1020 are not limited to the puncture patterns shown in FIG. 15, and the effect of the present invention can also be achieved by using another puncture pattern with a higher puncturing frequency for rearward bits of a termination sequence than for forward bits.

(Embodiment 5)

In this embodiment, a transmitting apparatus and receiving apparatus are described that are equipped with a function that compensates for transmission errors that occur due to a reduction in the number of transmitted termination sequences by retransmitting part or all of a termination sequence.

Figure 16:
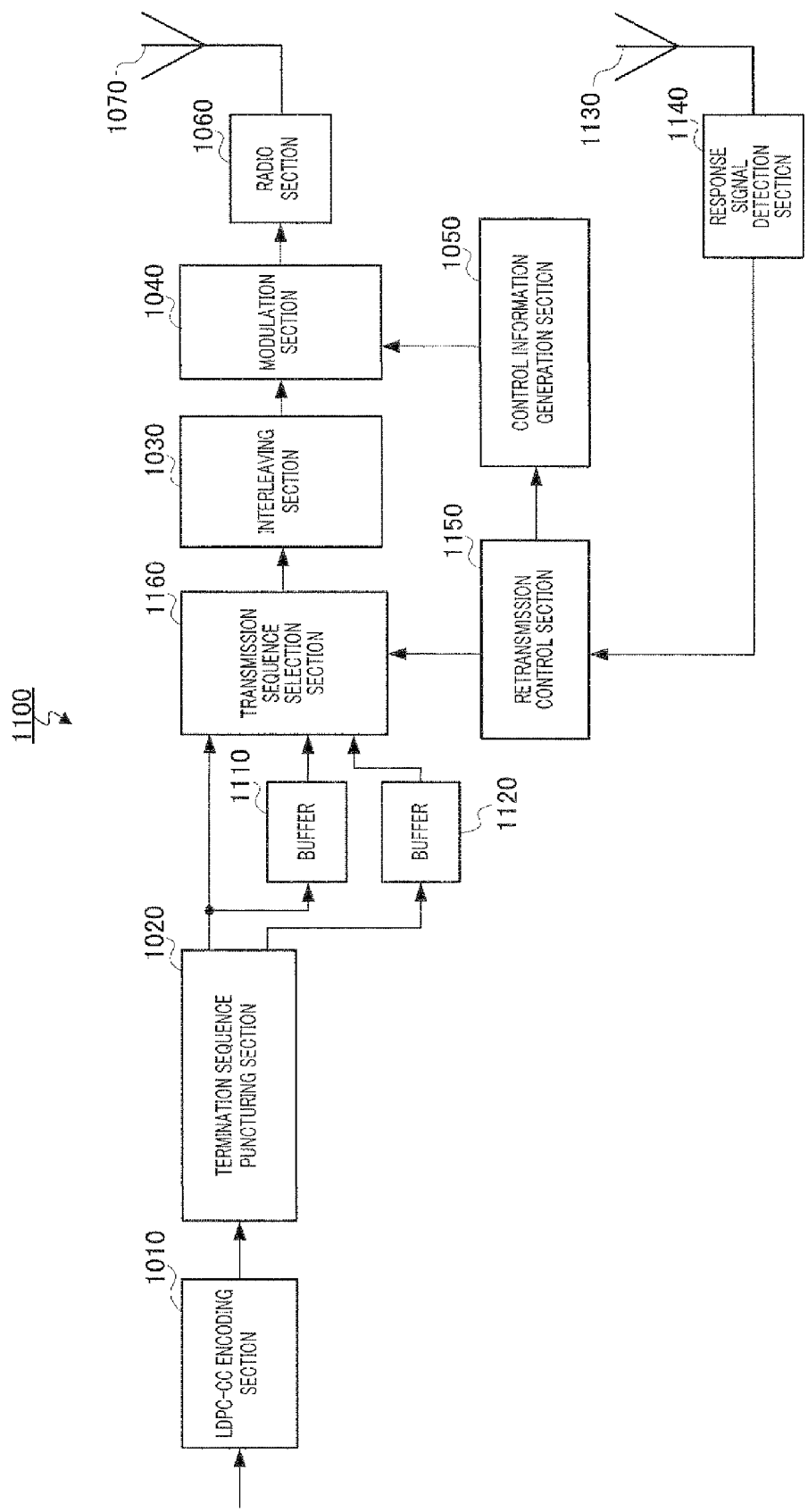
FIG. 16 is a block diagram showing a main configuration of a transmitting apparatus according to Embodiment 5 of the present invention.

FIG. 16 is a block diagram showing a main configuration of a transmitting apparatus according to this embodiment. In the description of this embodiment, configuration parts identical to those in FIG. 14 are assigned the same reference numbers as in FIG. 14, and descriptions thereof are omitted. As compared with transmitting apparatus 1000 in FIG. 14, transmitting apparatus 1100 in FIG. 16 employs a configuration that additionally includes buffers 1110 and 1120, receiving antenna 1130, response signal detection section 1140, retransmission control section 1150, and transmission sequence selection section 1160.

Buffer 1110 stores a punctured transmission codeword sequence that has been punctured by termination sequence puncturing section 1020, and buffer 1120 stores a puncture bit sequence that has been punctured by termination sequence puncturing section 1020.

Response signal detection section 1140 detects a response signal sent from receiving apparatus 1200 described later herein from a received signal received via receiving antenna 1130, and sends the detected response signal to retransmission control section 1150.

Based on the response signal, retransmission control section 1150 creates retransmission control information. Specifically, retransmission control section 1150 creates the following four categories of retransmission control information based on the response signal.

(0) Retransmission control information "0": No retransmission (1) Retransmission control information "1": Retransmission of entire transmission codeword sequence (2) Retransmission control information "2": Retransmission of transmission codeword sequence after puncturing (3) Retransmission control information "3": Retransmission of puncture bit sequence The correspondence between a response signal and retransmission control information will be described later herein. Retransmission control section 1150 outputs retransmission control information to transmission sequence selection section 1160 and control information generation section 1050.

Transmission sequence selection section 1160 selects a transmission codeword sequence to be output to interleaving section 1030 according to the retransmission control information output from retransmission control section 1150. Specifically, in the case of retransmission control information "0", transmission sequence selection section 1160 sends a new transmission codeword sequence output from termination sequence puncturing section 1020 to interleaving section 1030.

In the case of retransmission control information "1", transmission sequence selection section 1160 regenerates a transmission codeword sequence prior to being punctured by termination sequence puncturing section 1020 from sequences stored in buffer 1110 and buffer 1120, and sends the regenerated transmission codeword sequence to interleaving section 1030.

In the case of retransmission control information "2", transmission sequence selection section 1160 sends a punctured transmission codeword sequence stored in buffer 1110 to interleaving section 1030.

And in the case of retransmission control information "3", transmission sequence selection section 1160 sends a puncture bit sequence stored in buffer 1120 to interleaving section 1030 as a transmission codeword sequence.

Figure 17:
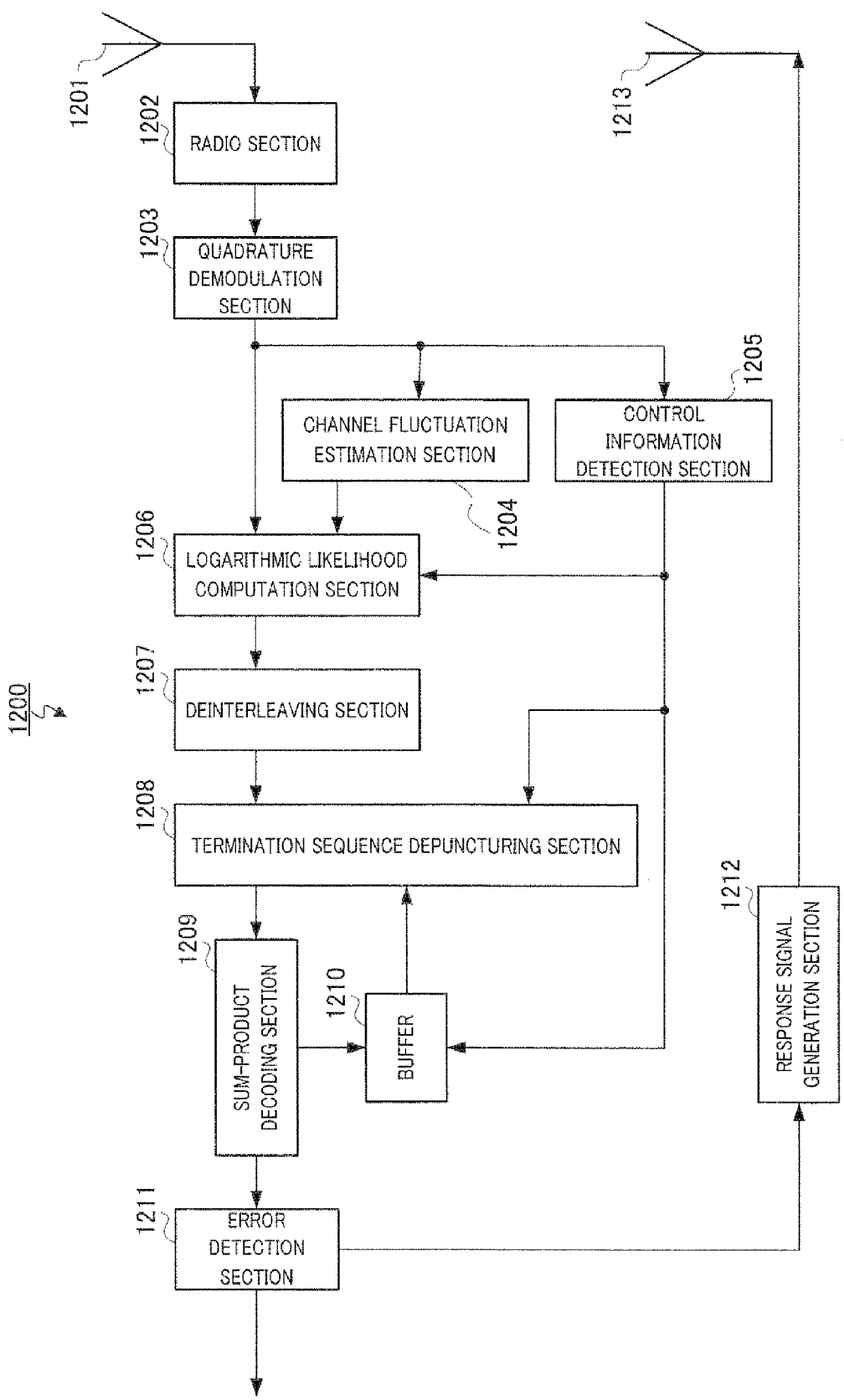
FIG. 17 is a block diagram showing a main configuration of a receiving apparatus according to Embodiment 5.

FIG. 17 is a block diagram showing a main configuration of a receiving apparatus according to this embodiment. Receiving apparatus 1200 in FIG. 17 comprises receiving antenna 1201, radio section 1202, quadrature demodulation section 1203, channel fluctuation estimation section 1204, control information detection section 1205, logarithmic likelihood computation section 1206, deinterleaving section 1207, termination sequence depuncturing section 1208, sum-product decoding section 1209, buffer 1210, error detection section 1211, response signal generation section 1212, and transmitting antenna 1213.

Receiving antenna 1201 receives a transmission RF signal transmitted from transmitting apparatus 1100, and sends this signal to radio section 1202.

Radio section 1202 performs radio demodulation processing such as RE filtering processing, frequency conversion, and A/D (Analog to Digital) conversion, and sends a radio-demodulated baseband signal to quadrature demodulation section 1203.

Quadrature demodulation section 1203 detects I-channel and Q-channel baseband signals, and sends these to channel fluctuation estimation section 1204, control information detection section 1205, and logarithmic likelihood computation section 1206.

Using a known signal included in the baseband signals, channel fluctuation estimation section 1204 estimates channel fluctuation in a radio channel between transmitting apparatus 1100 and receiving apparatus 1200.

Control information detection section 1205 detects control information included in a baseband signal, and sends the detected control information to logarithmic likelihood computation section 1206. Control information detection section 1205 also detects retransmission control information included in the control information, and sends the detected retransmission control information to termination sequence depuncturing section 1208 and buffer 1210.

Using a baseband signal, logarithmic likelihood computation section 1206 finds a logarithmic likelihood ratio of each codeword bit, and sends the obtained logarithmic likelihood ratio to deinterleaving section 1207.

Using processing that is the reverse of the rearrangement processing performed by interleaving section 1030 of transmitting apparatus 1000, deinterleaving section 1207 rearranges a logarithmic likelihood ratio sequence into its original order, and sends a deinterleaved logarithmic likelihood ratio to termination sequence depuncturing section 1208.

Termination sequence depuncturing section 1208 performs depuncturing on a logarithmic likelihood ratio output from deinterleaving section 1207 according to retransmission control information output from control information detection section 1205. Depuncturing processing will be described later herein.

Sum-product decoding section 1209 performs sum-product decoding using a logarithmic likelihood ratio sequence output from termination sequence depuncturing section 1208, and sends a logarithmic likelihood ratio sequence at the end of sum-product decoding to buffer 1210. Sum-product decoding section 1209 also acquires a received codeword sequence by means of a hard decision using a logarithmic likelihood ratio sequence at the end of sum-product decoding, and sends the obtained received codeword sequence to error detection section 1211.

Error detection section 1211 performs a parity check using a parity check matrix on a received codeword sequence output from sum-product decoding section 1209, and detects an error. Error detection section 1211 performs error detection on individual groups obtained by dividing transmission information sequence length n at memory length M intervals. Per-group error detection processing will be described later herein.

If an error is not detected as a result of error detection, error detection section 1211 outputs only a received information sequence within a received codeword sequence as a received sequence.

Response signal generation section 1212 generates a response signal according to error detection information output from error detection section 1211. For example, if error detection information indicates "no error", response signal generation section 1212 generates an ACK signal to inform transmitting apparatus 1100 that reception has been achieved correctly.

On the other hand, if error detection information indicates "error present", response signal generation section 1212 generates a NACK signal to inform transmitting apparatus 1100 that reception has not been performed correctly.

If, based on the results of per-group error detection, errors have occurred across an entire received codeword sequence, or an error has occurred only in a group near the front or middle of a received codeword sequence, response signal generation section 1212 generates NACK:type-I requesting retransmission of an entire transmission codeword sequence, or NACK:type-II requesting retransmission of a transmission codeword sequence after termination sequence puncturing. Also, if an error has occurred only in a group at the rear of a received codeword sequence, response signal generation section 1212 generates NACK:type-III requesting retransmission of only a bit sequence punctured by termination sequence puncturing section 1020.

Transmitting antenna 1213 transmits an ACK or NACK signal output from response signal generation section 1212 to transmitting apparatus 1100.

The operation of transmitting apparatus 1100 and receiving apparatus 1200 configured as described above will now be explained, focusing mainly on retransmission and decoding processing.

A transmission RF signal transmitted from transmitting apparatus 1100 is received via receiving antenna 1201 of receiving apparatus 1200, and has radio demodulation processing executed on it by radio section 1202. A radio-demodulated signal is demodulated to a baseband signal by quadrature demodulation section 1203.

Control information included in a baseband signal is detected by control information detection section 1205. Also, retransmission control information included in the control information is detected by control information detection section 1205.

In logarithmic likelihood computation section 1206, a logarithmic likelihood ratio of each transmitted codeword bit is found from a baseband signal, and in deinterleaving section 1207 the order of a logarithmic likelihood ratio sequence is rearranged using processing that is the reverse of rearrangement processing performed by interleaving section 1030 in transmitting apparatus 1100.

In termination sequence depuncturing section 1208, a logarithmic likelihood ratio is depunctured according to the type of retransmission control information output from control information detection section 1205.

In the Case of (0) Retransmission Control Information "0"

Termination sequence depuncturing section 1208 inserts LLR=0 at a position corresponding to a position of a bit punctured by termination sequence puncturing section 1020 and generates (depunctures) a logarithmic likelihood ratio sequence. Termination sequence depuncturing section 1208 sends a depunctured logarithmic likelihood ratio sequence to sum-product decoding section 1209. In the case of retransmission control information "0", unlike the cases of retransmission control information "1" through "3" described later herein, termination sequence depuncturing section 1208 performs logarithmic likelihood ratio sequence depuncturing without using a logarithmic likelihood ratio sequence stored in buffer 1210.

In the Case of (1) Retransmission Control Information "1"

Buffer 1210 sends a stored past logarithmic likelihood ratio sequence to termination sequence depuncturing section 1208. Termination sequence depuncturing section 1208 combines a logarithmic likelihood ratio sequence output from deinterleaving section 1207 and a logarithmic likelihood ratio sequence output from buffer 1210, and sends a post-combining logarithmic likelihood ratio sequence to sum-product decoding section 1209.

In the Case of (2) Retransmission Control Information "2"

Buffer 1210 sends a stored past logarithmic likelihood ratio sequence to termination sequence depuncturing section 1208. Termination sequence depuncturing section 1208 depunctures a logarithmic likelihood ratio sequence output from deinterleaving section 1207 in the same way as in the case of retransmission control information "0", combines a depunctured logarithmic likelihood ratio sequence and a logarithmic likelihood ratio sequence output from buffer 1210, and sends a post-combining logarithmic likelihood ratio sequence to sum-product decoding section 1209.

In the Case of (3) Retransmission Control Information "3"

Buffer 1210 sends a stored past logarithmic likelihood ratio sequence to termination sequence depuncturing section 1208. Termination sequence depuncturing section 1208 inserts an LLR of a position corresponding to a bit position punctured by termination sequence puncturing section 1020 within a logarithmic likelihood ratio sequence output from buffer 1210 in a logarithmic likelihood ratio sequence output from deinterleaving section 1207, and generates (depunctures) a logarithmic likelihood ratio sequence. Termination sequence depuncturing section 1208 sends a depunctured logarithmic likelihood ratio sequence to sum-product decoding section 1209.

Sum-product decoding section 1209 performs sum-product decoding using a logarithmic likelihood ratio sequence output from termination sequence depuncturing section 1208. Sum-product decoding section 1209 sends a logarithmic likelihood ratio sequence at the end of sum-product decoding to buffer 1210. Sum-product decoding section 1209 also sends a received codeword sequence obtained by means of a hard decision on a logarithmic likelihood ratio sequence at the end of sum-product decoding to error detection section 1211.

Error detection section 1211 performs a parity check using a parity check matrix on a received codeword sequence output from sum-product decoding section 1209, and detects an error. A parity check is performed based on whether or not a received codeword sequence satisfies Equation (6).

[6]

$$v_t H_0^T(t) + v_{t-1} H_1^T(t) + \ldots + v_{t-m_s} H_{m_s}^T(t) = 0 \ldots \quad \text{(Equation 6)}$$

By performing a parity check using Equation (6), error detection section 1211 can detect an error in individual groups obtained by dividing transmission information sequence length n at memory length M intervals. Therefore, by comparing per-group error detection results, it is possible to detect where there are many errors within a received codeword sequence.

Thus, with a parity check, a position at which an error has been detected is known, and it is therefore possible to identify from a position at which an error has been detected whether or not that error is due to termination sequence puncturing. Therefore, if an error is due to termination sequence puncturing, a decrease in transmission efficiency due to retransmission can be suppressed by having response signal generation section 1212 described later herein generate a response signal (NACK:type-III) indicating a retransmission request for only a punctured bit.

Error detection section 1211 outputs per-group parity check results to response signal generation section 1212 as error detection information. As an example of error detection information, vector $E=[e_1, e_2, e_{J-1}, e_J]$ may be used. Here, J is a number of groups on which error detection is performed, and $e_i=0$ is set if an error is not detected in a parity check of an i'th group (where i=1, . . . , J), whereas $e_j=1$ is set if an error is detected.

Response signal generation section 1212 generates a response signal according to error detection information output from error detection section 1211. Specifically, if vector E is an all-zero vector, it is determined that an error has not been detected, and response signal generation section 1212 generates an ACK signal. On the other hand, if one or more elements having a value of 1 are included in vector E, it is determined that an error has been detected, and response signal generation section 1212 generates a NACK signal.

From a position at which a vector E element is 1, response signal generation section 1212 can estimate in group units whereabouts in a received codeword sequence an error occurred. If errors have occurred across an entire received codeword sequence, or an error has occurred only in a group near the front or middle of a received codeword sequence, response signal generation section 1212 generates NACK:type-I requesting retransmission of an entire transmission codeword sequence, or NACK:type-II requesting retransmission of a transmission codeword sequence after termination sequence puncturing. If an error has occurred only in a group at the rear of a received codeword sequence, response signal generation section 1212 generates NACK:type-III requesting retransmission of only a bit punctured by termination sequence puncturing section 1020.

An ACK or NACK signal output from response signal generation section 1212 is transmitted to transmitting apparatus 1100 via transmitting antenna 1213.

In LDPC-CC encoding section 1010 of transmitting apparatus 1100, LDPC-CC encoding processing including termination is executed on transmission information sequence $u_i$ (where $i=1, \ldots, n$), and transmission codeword sequence $[v_{k,i} \ x_{k,j}]$ is acquired. In termination sequence puncturing section 1020, puncturing processing is executed on $x_{k,j}$ corresponding to a termination sequence within transmission codeword sequence $[v_{k,i} \ x_{k,j}]$ output from LDPC-CC encoding section 1010.

A punctured transmission codeword sequence is output to buffer 1110 and transmission sequence selection section 1160, and a punctured puncture bit sequence is output to buffer 1120.

A response signal transmitted from receiving apparatus 1200 is detected by response signal detection section 1140 from a received signal received via receiving antenna 1130, and retransmission control information is generated by retransmission control section 1150 according to the response signal as shown below.

(1) If the response signal is ACK, retransmission control information "0" is created.
(2) If the response signal is NACK:type-I, retransmission control information "1" is created.
(3) If the response signal is NACK:type-II, retransmission control information "2" is created.
(4) If the response signal is NACK:type-III, retransmission control information "3" is created.

A transmission codeword sequence is selected by transmission sequence selection section 1160 based on the retransmission control information output from retransmission control section 1150.

Specifically, in the case of retransmission control information "0", a new transmission codeword sequence output from termination sequence puncturing section 1020 is selected; in the case of retransmission control information "1", a transmission codeword sequence prior to termination sequence puncturing is selected; in the case of retransmission control information "2", a punctured transmission codeword sequence stored in buffer 1110 is selected; and in the case of retransmission control information "3", a puncture bit sequence stored in buffer 1120 is selected as a transmission codeword sequence.

In this way, when an error is detected by error detection section 1211 of receiving apparatus 1200, only a sequence affecting the error is retransmitted, enabling a decrease in transmission efficiency due to retransmission to be suppressed.

A selected transmission codeword sequence is interleaved by interleaving section 1030, and modulation is executed on the interleaved transmission codeword sequence and control information by modulation section 1040. Control information includes retransmission control information to enable receiving apparatus 1200 to determine what kind of signal has been transmitted.

As described above, according to this embodiment transmitting apparatus 1100 is equipped with buffer 1120 that stores a termination sequence punctured by termination sequence puncturing section 1020, and transmits the termination sequence stored in buffer 1120 when a retransmission request is sent from receiving apparatus 1200. With a parity check, a position at which an error has been detected is known, and it is therefore possible to identify from a position at which an error has been detected whether or not that error is due to termination sequence puncturing. Therefore, if an error is due to termination sequence puncturing, a decrease in transmission efficiency due to retransmission can be suppressed by retransmitting only a bit punctured by termination sequence puncturing section 1020.

In this embodiment, a transmitting apparatus using the puncture pattern shown in FIG. 15 has been described as an example, but this is not a limitation, and the effect described in this embodiment can also be obtained when another arbitrary puncture pattern is used.

Also, provision may be made for termination sequence puncturing section 1020 to use a puncture pattern whereby an entire termination sequence is punctured, and for transmitting apparatus 1100 not to transmit any termination sequence at all at the time of an initial transmission. This enables a decrease in transmission efficiency due to termination sequence transmission to be avoided. In this case, the effect described in this embodiment can be obtained by transmitting a termination sequence not transmitted at the time of an initial transmission when NACK:type-III is transmitted from receiving apparatus 1200.

This embodiment has been described as using retransmission control information "0" through "3", and using ACK and NACK:type-I through NACK:type-III as response signals, but this is not a limitation, and the effect of the present invention can also be obtained by using another method whereby it can be determined whether or not a bit error occurred because of termination sequence puncturing, and a response signal capable of reporting this to transmitting apparatus 1100 is transmitted.

Figure 18:
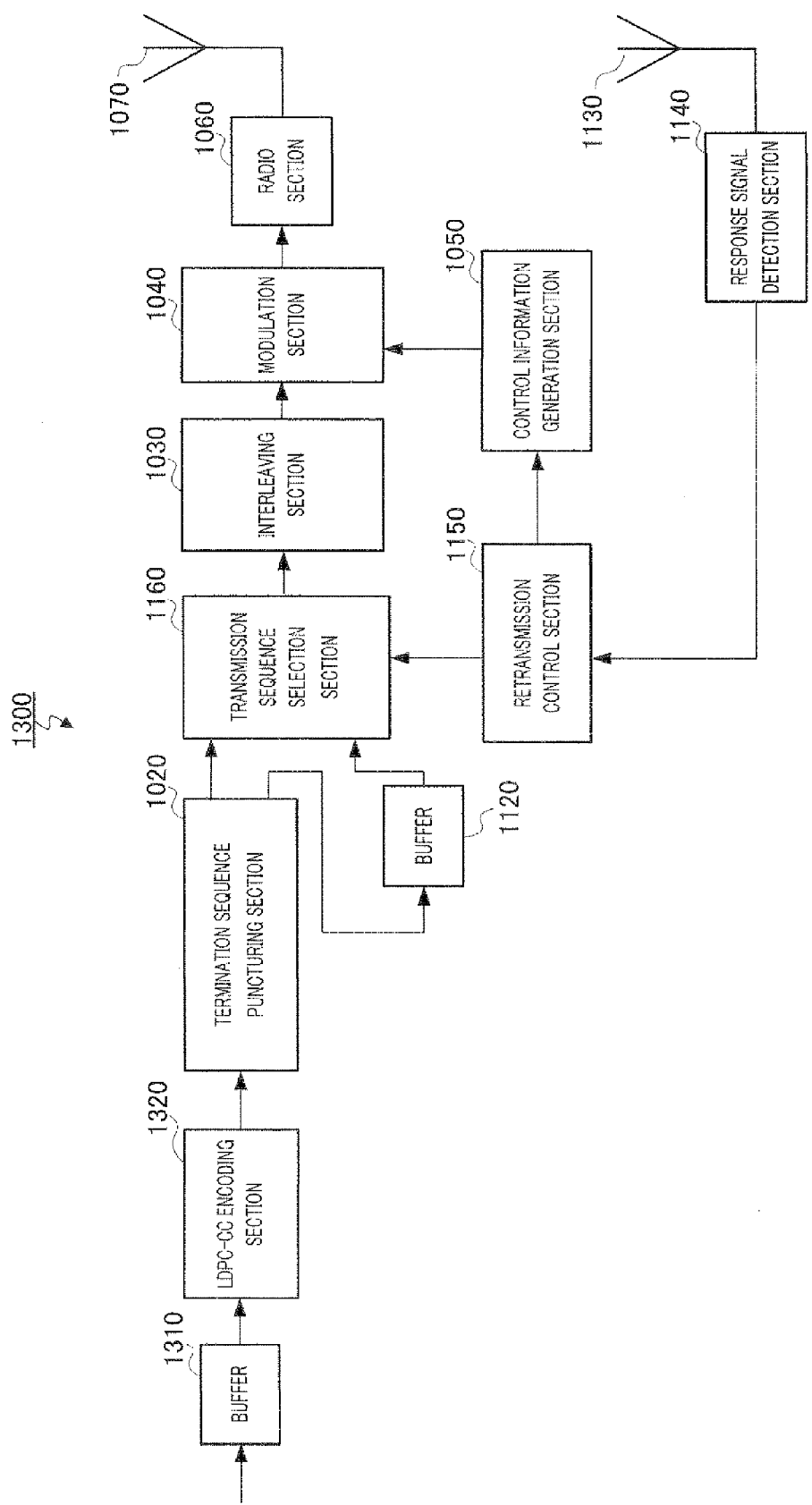
FIG. 18 is a block diagram showing another main configuration of a transmitting apparatus according to Embodiment 5.

In this embodiment, a case has been described in which transmitting apparatus 1100 retransmits transmission codeword sequences stored in storage section 110 and buffer 1120 in the case of retransmission control information "1" or "2", but provision may also be made for a retransmission sequence to be encoded by LDPC-CC encoding section 1010 and then transmitted. A configuration diagram of a transmitting apparatus in this case is shown in FIG. 18. In the description of the transmitting apparatus in FIG. 18, configuration parts identical to those in FIG. 16 are assigned the same reference numbers as in FIG. 16, and descriptions thereof are omitted.

As compared with transmitting apparatus 1100 in FIG. 16, transmitting apparatus 1300 in FIG. 18 employs a configuration in which buffer 1310 and LDPC-CC encoding section 1320 have been added in place of buffer 1110 and LDPC-CC encoding section 1010.

Buffer 1310 stores a transmission information sequence. When retransmission control information "0" is output from retransmission control section 1150, buffer 1310 clears the stored transmission information sequence and stores a new transmission information sequence, and also sends the new transmission information sequence to LDPC-CC encoding section 1320. In the case of retransmission control information "1" or "2", buffer 1310 sends the stored transmission information sequence to LDPC-CC encoding section 1320. If retransmission control information is "3", buffer 1310 stores the stored transmission information sequence as it is.

LDPC-CC encoding section 1320 performs LDPC-CC encoding on a transmission information sequence using an arbitrary coding rate. Here, provision may also be made for LDPC-CC encoding section 1320 to perform LDPC-CC encoding using different coding rates in an initial transmission and in a retransmission. By this means, in the event of a retransmission control information "1" or "2" retransmission request from receiving apparatus 1200, LDPC-CC encoding can be executed using a different coding rate with high error correction capability on the same transmission information sequence when performing a retransmission.

In the case of retransmission control information "0", provision may also be made for buffer 1310 to store a new transmission information sequence with its order rearranged when updating a stored transmission information sequence to a new transmission information sequence. With an LDPC-CC, errors that occur when a termination sequence is punctured are concentrated in bits at the rear of a transmission information sequence. Therefore, as a result of buffer 1310 storing a new transmission information sequence with its order rearranged, transmission information bits located at the rear of a transmission information sequence at the time of a retransmission are different from those at the time of an initial transmission, enabling the probability of a bit error occurring in a retransmission to be reduced. An example of a method of rearranging the order of a transmission information sequence is to rearrange the sequence in order from the rear, for instance. By so doing, a bit LDPC-CC encoded and transmitted at the rear of a transmission information sequence in an initial transmission becomes a bit LDPC-CC encoded and transmitted at the front in a retransmission, and therefore the proportion of rearward bits likely to be affected by an error in an initial transmission that are received correctly is increased.

(Embodiment 6)

In this embodiment, descriptions are given of configurations of a transmitting apparatus and receiving apparatus that are equipped with a function that reduces bit errors occurring in the rear part of a received information sequence due to a reduction in the number of transmitted termination sequences by multistage encoding on bits in the rear part of a transmission information sequence beforehand.

Figure 19:
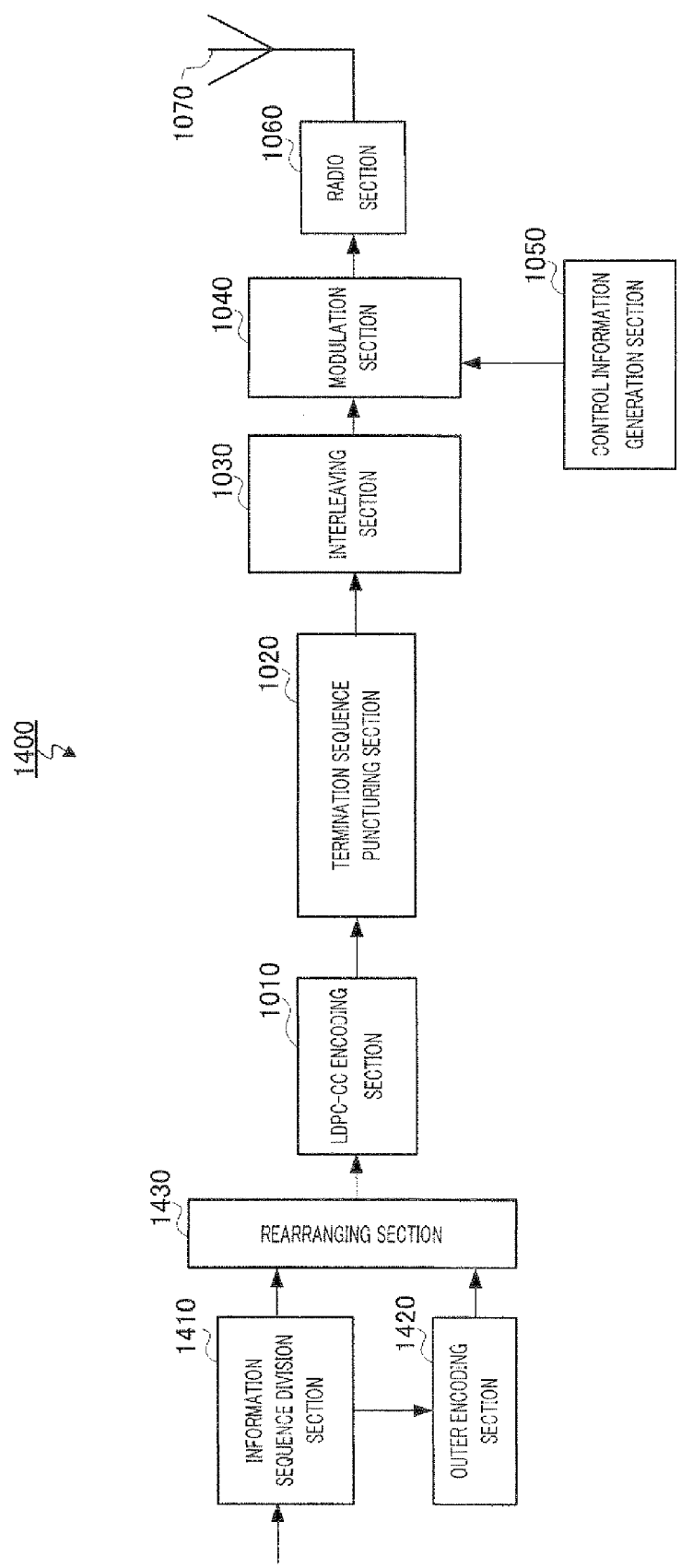
FIG. 19 is a block diagram showing a main configuration of a transmitting apparatus according to Embodiment 6 of the present invention.

FIG. 19 is a block diagram showing a main configuration of a transmitting apparatus according to this embodiment. In the description of this embodiment, configuration parts identical to those in FIG. 14 are assigned the same reference numbers as in FIG. 14, and descriptions thereof are omitted. As compared with transmitting apparatus 1000 in FIG. 14, transmitting apparatus 1400 in FIG. 19 employs a configuration that additionally includes information sequence division section 1410, outer encoding section 1420, and rearranging section 1430.

Information sequence division section 1410 acquires two sequences by dividing a transmission information sequence into a front part and rear part. For example, information sequence division section 1410 divides an n-bit transmission information sequence into K bits from the front of the transmission information sequence and the remaining n-K bits. Information sequence division section 1410 outputs the divided K-bit transmission information sequence to rearranging section 1430, and outputs the remaining divided n-K-bit transmission information sequence to outer encoding section 1420.

Outer encoding section 1420 executes outer encoding on the n-K-bit transmission information sequence resulting from the division by information sequence division section 1410. By this means, outer encoding is executed on n-K bits in the rear part of the transmission information sequence, enabling transmission errors occurring in the rear part of a received information sequence due to a reduction in the number of transmitted termination sequences to be reduced by encoding gain of the outer encoding.

A block code that does not require termination, such as an information sequence length n-K-bit LDPC-BC, for example, should preferably be applied as an encoding method for outer encoding. Outer encoding section 1420 outputs an outer-encoded transmission information sequence to rearranging section 1430.

Rearranging section 1430 has a transmission information sequence from information sequence division section 1410 and a transmission information sequence from outer encoding section 1420 as input, and rearranges the order of these transmission information sequences. As the rearrangement order, a parity sequence generated by outer encoding section 1420 is preferentially positioned forward compared with a transmission information sequence input to outer encoding section 1420.

As explained above, with an LDPC-CC, errors that occur when a termination sequence is punctured are concentrated in bits at the rear of a transmission information sequence. Therefore, by having rearranging section 1430 preferentially position a parity sequence generated by outer encoding section 1420 forward, the proportion of errors in that parity sequence is reduced, and outer encoding gain can be improved.

Rearranging section 1430 sends an interleaved transmission information sequence to LDPC-CC encoding section 1010.

Figure 20:
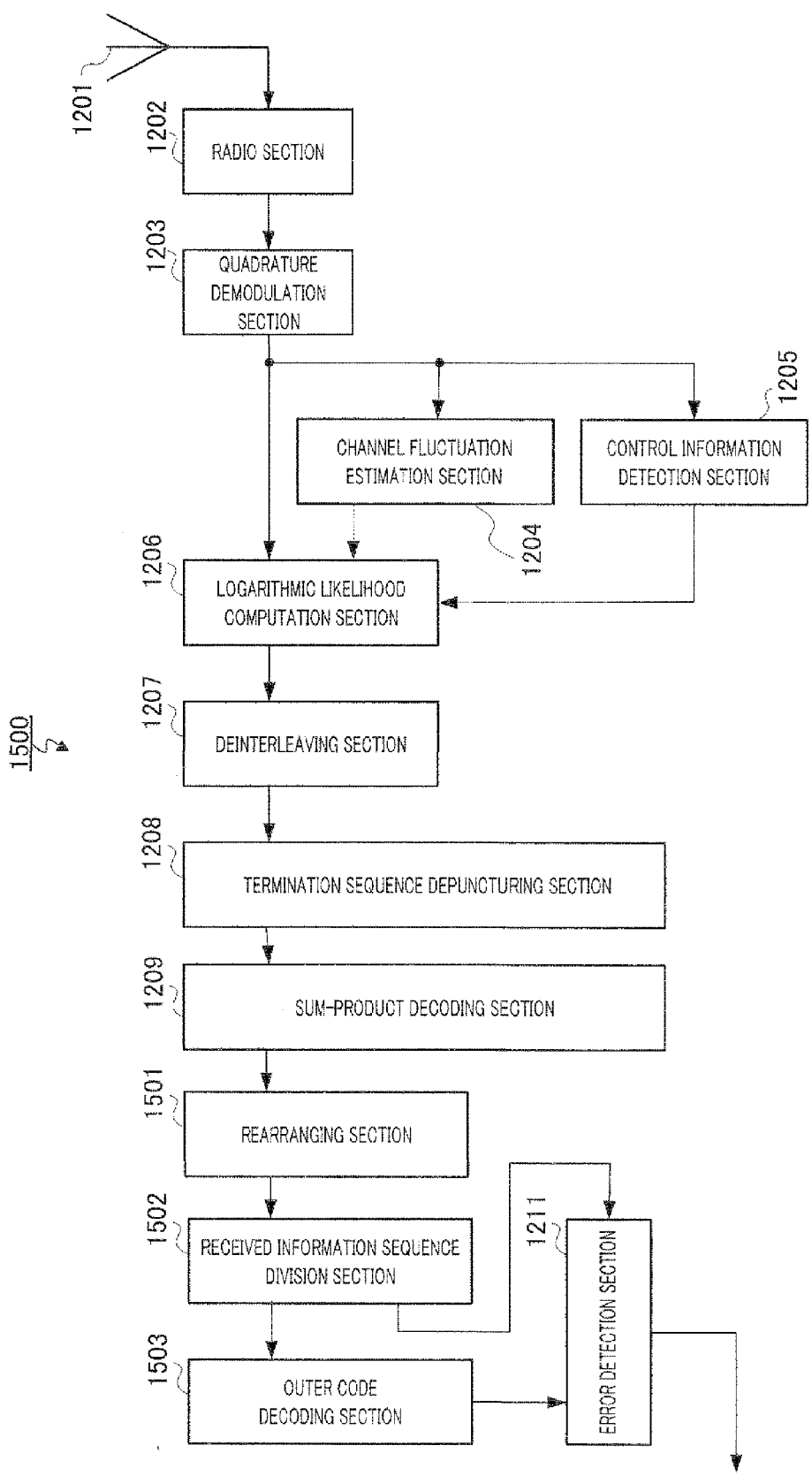
FIG. 20 is a block diagram showing a main configuration of a receiving apparatus according to Embodiment 6.

FIG. 20 is a block diagram showing a main configuration of a receiving apparatus according to this embodiment. In the description of this embodiment, configuration parts identical to those in FIG. 17 are assigned the same reference numbers as in FIG. 17, and descriptions thereof are omitted. As compared with receiving apparatus 1200 in FIG. 17, receiving apparatus 1500 in FIG. 20 employs a configuration in which response signal generation section 1212 and transmitting antenna 1213 have been eliminated, and rearranging section 1501, received information sequence division section 1502, and outer code decoding section 1503 have been added.

Rearranging section 1501 rearranges a received information sequence decoded by sum-product decoding section 1209 according to a rule that is the reverse of that of rearranging section 1430 in transmitting apparatus 1400, and sends a deinterleaved received information sequence to received information sequence division section 1502.

Received information sequence division section 1502 divides a received information sequence output from rearranging section 1501 into two received information sequences using the same rule as information sequence division section 1410 in transmitting apparatus 1400. Received information sequence division section 1502 sends a divided K-bit information sequence to error detection section 1211, and sends the remaining divided received information sequence to outer code decoding section 1503.

Outer code decoding section 1503 performs outer code decoding processing on the post-division received information sequence. For example, if an information sequence length n-K-bit LDPC-BC has been applied as an outer code in outer encoding section 1420, outer code decoding section 1503 performs LDPC-BC decoding using sum-product decoding or Belief Propagation (BP) decoding. Outer code decoding section 1503 sends a decoded received information sequence to error detection section 1211.

As described above, in this embodiment information sequence division section 1410 acquires two sequences by dividing a transmission information sequence into a front part and rear part, and outer encoding section 1420 executes outer encoding on bits in the rear part of the transmission information sequence. By this means, if an error occurs in the rear part of a received information sequence due to a termination sequence reduction by LDPC-CC encoding section 1010, that error can be corrected by outer encoding, enabling degradation of reception quality to be suppressed. Moreover, since outer encoding is not performed on an entire transmission information sequence, but is executed only on the rear part of a transmission information sequence that is prone to errors due to a termination sequence reduction, a decrease in the coding rate due to concatenated encoding can be suppressed. Furthermore, by providing rearranging section 1430, and preferentially positioning part of an outer codeword sequence obtained by outer encoding toward the front of the transmission information sequence after outer encoding has been executed, the encoding gain of outer encoding can be improved.

In the above description, a case has been described in which information sequence division section 1410 extracts K transmission information sequence bits consecutively from the front of a transmission information sequence, but provision may also be made for information sequence division section 1410 to extract K bits consecutively from an arbitrary position in a transmission information sequence, or to extract K bits randomly, and to output the remaining n-K bits to outer encoding section 1420. In this way, outer encoding is executed on n-K consecutive bits or n-K random bits of a transmission information sequence, enabling errors that occur in a burst to be corrected.

Also, in the above description, a case has been described in which rearranging section 1430 positions a parity sequence generated by outer encoding section 1420 more forward than a transmission information sequence input to outer encoding section 1420, but this is not a limitation. For example, provision may also be made for rearranging section 1430 to perform rearrangement so that a transmission information sequence that has not undergone outer encoding, output from information sequence division section 1410, and a transmission information sequence that has undergone outer encoding by outer encoding section 1420, are mixed. In this way, bits on which outer encoding has been executed are also positioned in other than the rear part of a transmission codeword sequence, enabling outer encoding gain to be further improved.

Figure 21:
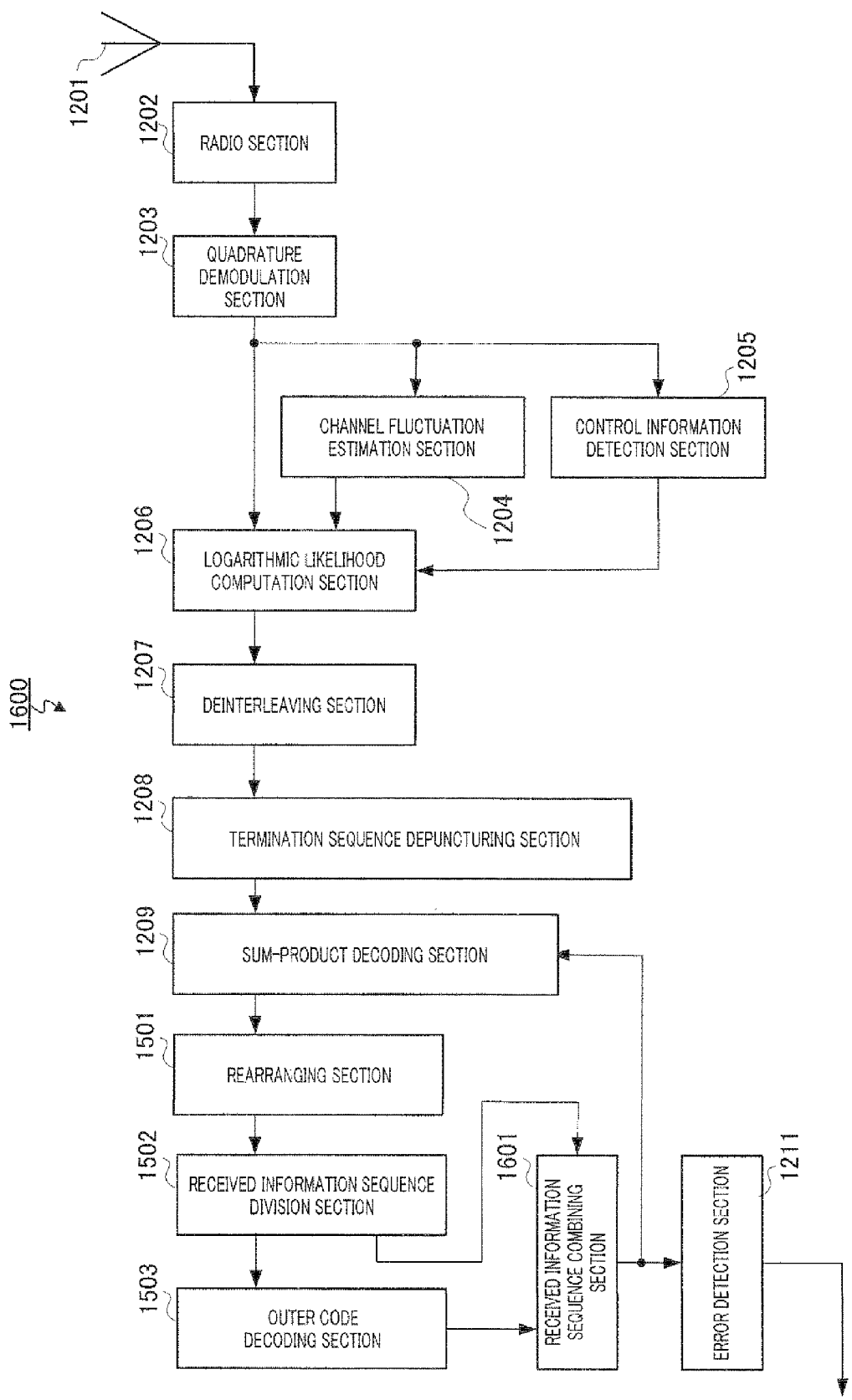
FIG. 21 is a block diagram showing another main configuration of a receiving apparatus according to Embodiment 6.

A block diagram showing another main configuration of a receiving apparatus according to this embodiment is shown in FIG. 21. As compared with receiving apparatus 1500 in FIG. 20, receiving apparatus 1600 in FIG. 21 employs a configuration that additionally includes received information sequence combining section 1601.

Received information sequence combining section 1601 acquires a received information sequence by combining a received information sequence output from received information sequence division section 1502 and a received information sequence after outer-encoded decoding output from outer code decoding section 1503, and outputs the acquired received information sequence to error detection section 1211 and sum-product decoding section 1209.

In this way, sum-product decoding section 1209 can perform decoding of an LDPC-CC that is an inner code again while using a received information sequence that reflects an outer code decoding result, and through execution that reflects inner code decoding and outer code decoding in this way, decoding gain is improved and the number of errors included in a received information sequence can be reduced.

Furthermore, if error correction decoding is performed only on a part in which an error has been detected within a received information sequence, using error detection section 1211 error detection results, the number of computations due to iterative decoding can be reduced. In addition, since an information sequence that has been received without error is confirmed from error detection section 1211 error detection results, inner code and outer code decoding gain can be improved by making the reception likelihood of those bits $+\infty$ or $-\infty$.

(Embodiment 7)

In Embodiments 4 through 6, cases have been described in which puncturing is executed on a termination sequence. In this embodiment, a description is given of a transmitting apparatus that executes puncturing suitable for a transmission codeword sequence obtained by LDPC-CC encoding, and such a puncturing method.

Figure 22:
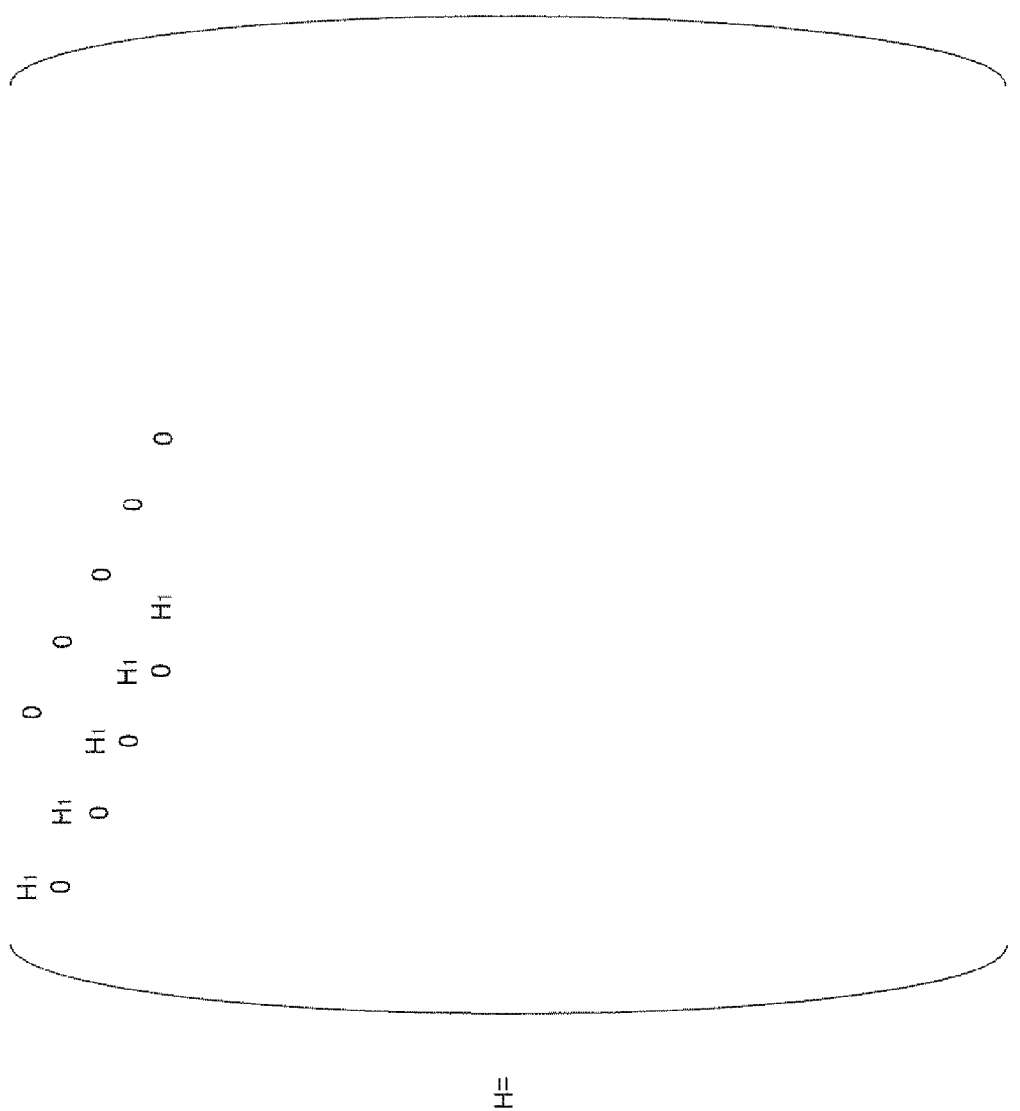
FIG. 22 is a drawing showing a configuration of a parity check matrix of an LDPC-CC according to Embodiment 7.

FIG. 22 is a drawing showing a configuration of a parity check matrix used in this embodiment. Unlike FIG. 1, FIG. 22 shows the configuration of parity check matrix H, not parity check matrix $H^T$. If a transmission codeword vector is denoted by v, the relational expression Hv=0 holds true.

In the description of a puncturing method according to this embodiment, a problem when a general puncturing method is applied to above transmission codeword sequence v will first be explained. A general puncturing method is described in Non-Patent Document 4, for example. Below, a case in which an LDPC-CC is configured using a convolutional code with coding rate R=½, (177, 131) is described as an example.

Figure 23:
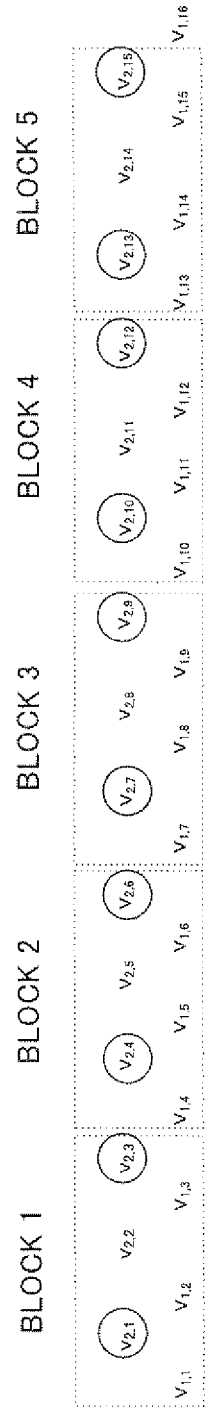
FIG. 23 is a drawing for explaining a general puncturing method.

FIG. 23 is a drawing for explaining a general puncturing method. In FIG. 23, $v_{1,t}$ and $v_{2,t}$ (where t=1, 2, ... ) indicate transmission codeword sequence v. With a general puncturing method, transmission codeword sequence v is divided into a plurality of blocks, and transmission codeword bits are punctured by using the same puncturing on each block.

FIG. 23 shows how transmission codeword sequence v is divided into blocks at 6-bit intervals, and transmission codeword bits are punctured in a fixed proportion using the same puncture pattern on all blocks. In FIG. 23, circled bits indicate bits that are punctured (bits that are not transmitted), and $v_{2,1}$, $v_{2,3}$, $v_{2,4}$, $v_{2,6}$, $v_{2,7}$, $v_{2,9}$, $v_{2,10}$, $v_{2,12}$, $v_{2,13}$, and $v_{2,15}$ are selected and punctured (made non-transmitted bits) so that the coding rate becomes ¾ after the puncturing.

Figure 24:
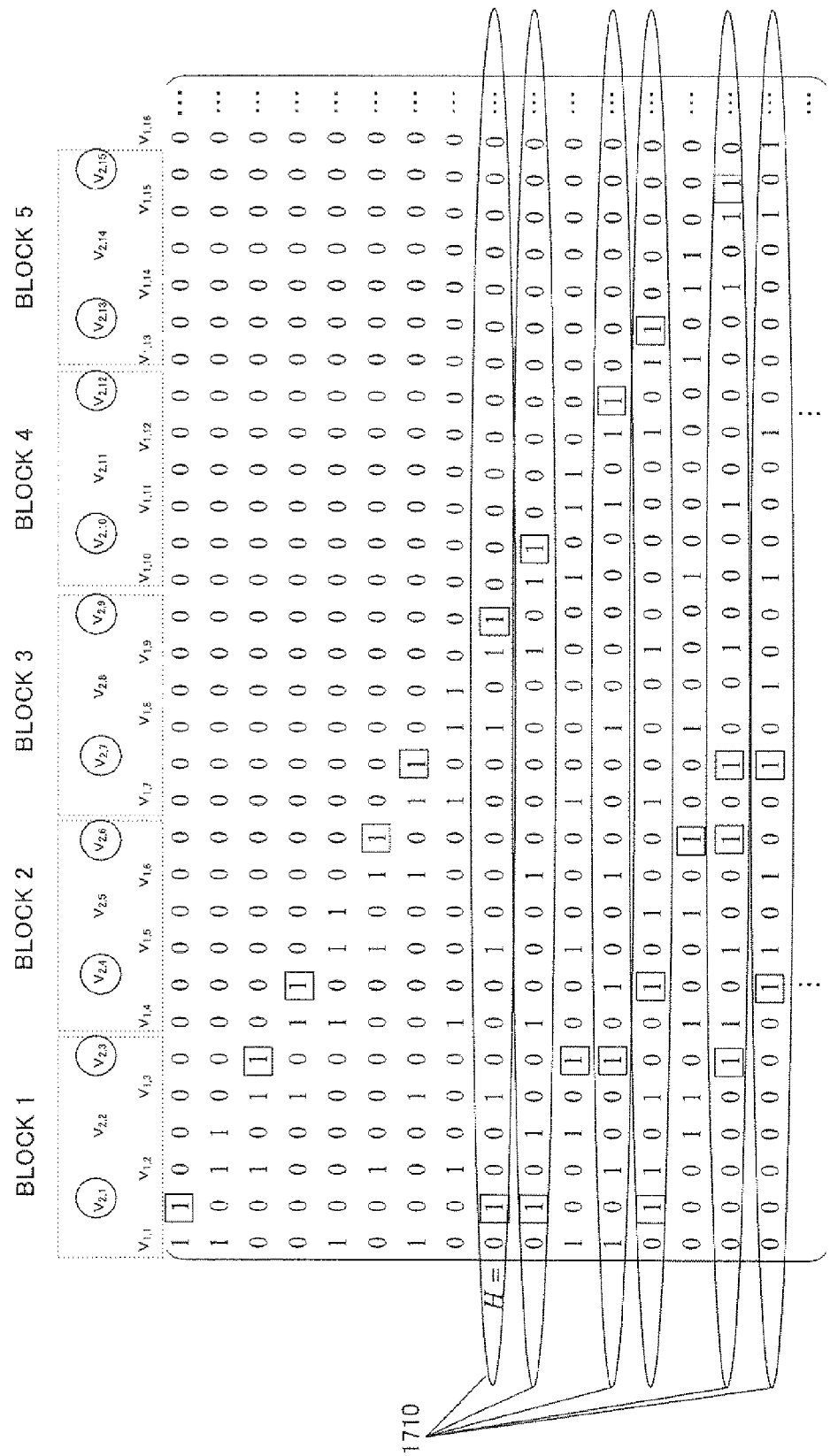
FIG. 24 is a drawing showing the correspondence between transmission codeword sequence v and parity check matrix H according to a general puncturing method.

Next, the effect on the receiver side (decoding side) will be considered when the kind of general puncturing shown in FIG. 23 is executed on a transmission codeword sequence obtained by encoding using an LDPC-CC. Below, a case in which BP decoding is used on the receiver side (decoding side) will be considered. In BP decoding, decoding processing is performed based on a parity check matrix. FIG. 24 shows the correspondence between transmission codeword sequence v and parity check matrix H. In FIG. 24, circled bits are transmission codeword bits that are punctured by puncturing. As a result, bits corresponding to a 1 inside a square in parity check matrix H cease to be included in a transmission codeword sequence. As a result, when BP decoding is performed there is no initial logarithmic likelihood ratio for a bit corresponding to a 1 inside a square, and therefore the logarithmic likelihood ratio is set to 0.

In BP decoding, row computation and column computation are performed iteratively. Therefore, if two or more bits for which there is no initial logarithmic likelihood ratio (bits with a 0 logarithmic likelihood ratio) (that is, bits corresponding to a 1 inside a square in FIG. 24) are included in the same row, logarithmic likelihood ratio updating is not performed by only row computation for that row until the logarithmic likelihood ratio of a bit for which there is no initial logarithmic likelihood ratio (a bit with a 0 logarithmic likelihood ratio) is updated by column computation. That is to say, reliability is not propagated by only row computation, and iteration of row computation and column computation is necessary in order to propagate reliability. Therefore, if there are many such rows, reliability is not propagated in a case such as when there is a limit on the number of iteration processes in BP decoding, causing degradation of reception quality. In the example shown in FIG. 24, rows 1710 are rows for which reliability is not propagated by only row computation—that is, rows that cause degradation of reception quality.

On the other hand, when a puncturing method according to this embodiment is used, the number of rows for which reliability is not propagated by only row computation can be reduced. In this embodiment, transmission codeword bit puncturing is performed, using a first puncture pattern and a second puncture pattern whereby more bits are punctured than with the first puncture pattern, for each transmission codeword bit processing unit. This will now be explained using FIG. 25 and FIG. 26.

FIG. 25 is a drawing for explaining a puncturing method according to this embodiment. As in FIG. 23, $v_{1,t}$ and $v_{2,t}$ (where t=1, 2, ...) indicate transmission codeword sequence v, and a case is described below in which one block is composed of 6 bits in the same way as in FIG. 23. Also, it is assumed that a transmission codeword bit processing unit on the receiver side (decoding side) comprises block 1 through block 5. The example shown in FIG. 25 shows the way in which $v_{2,1}$, $v_{2,3}$, $v_{2,4}$, $v_{2,6}$, $v_{2,7}$, $v_{2,9}$, $v_{2,10}$, $v_{2,12}$, $v_{2,13}$, and $v_{2,15}$ are punctured as a result of using a first puncture pattern that does not perform puncturing for the first block, block 1, and using a second puncture pattern that performs puncturing for block 2 through block 5. Thus, in this embodiment, puncture patterns having different coding rates are used, and a range in which few hits are punctured is provided within a transmission codeword bit processing unit.

Figure 26:
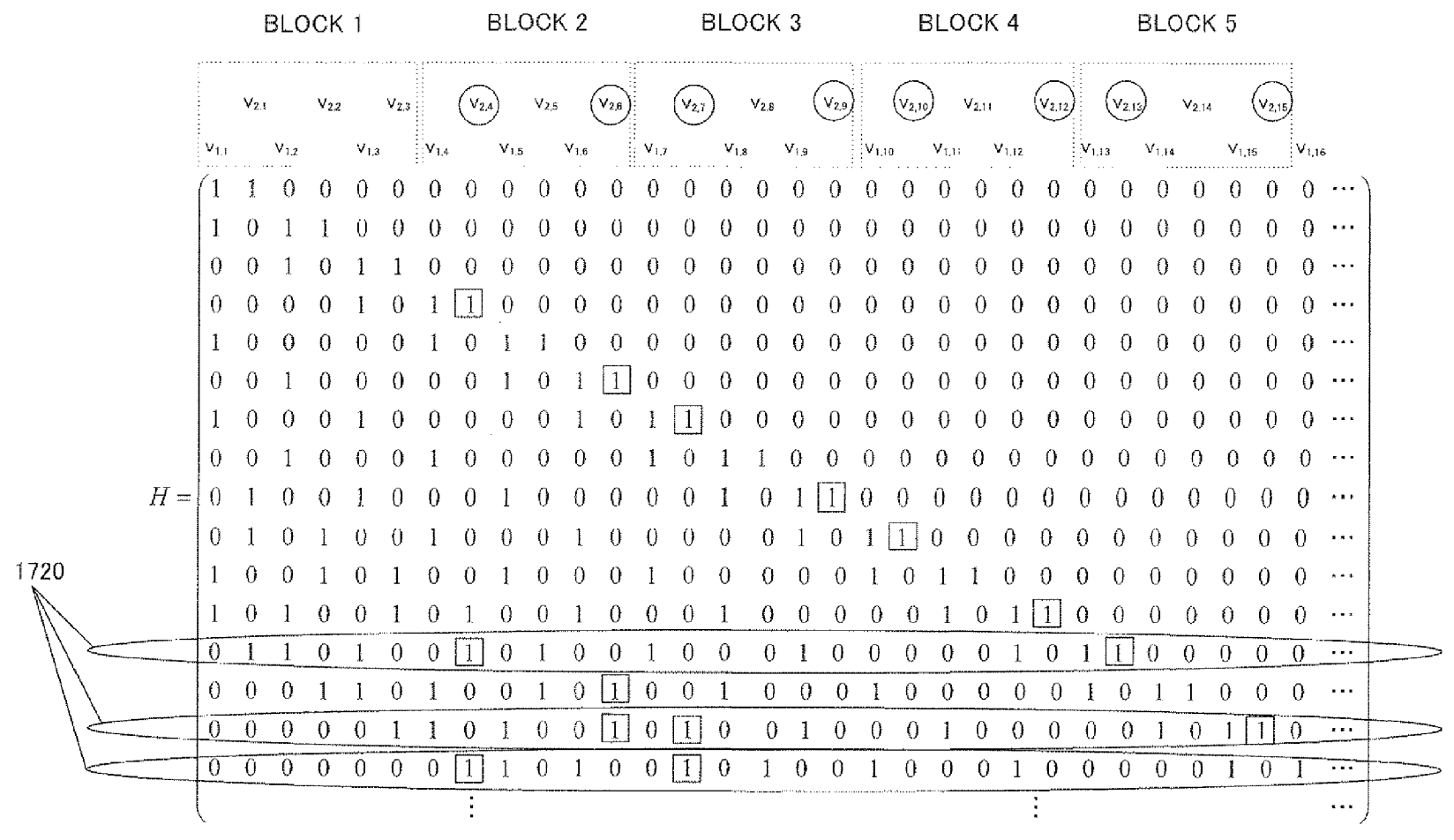

FIG. 26 shows the correspondence between transmission codeword sequence v and parity check matrix H in this case. In FIG. 26, although three rows occur that include two or more 1s inside a square in the same row, the number of such rows has been reduced compared with the case shown in FIG. 24. This is due to the fact that puncturing is not executed on block 1.

Thus, by providing a block on which puncturing is not performed, the number of rows causing degradation of reception quality when BP decoding is performed can be reduced. As a result, in lines up to rows 1720 there is a logarithmic likelihood initially, reliability is dependably propagated in BP decoding, and post-updating reliability is propagated to rows 1720, enabling degradation of reception quality to be suppressed. Thus, due to the characteristics of the structure of a convolutional code based parity check matrix, row reliabilities obtained by only row computations are propagated sequentially by performing iterative decoding a plurality of times, enabling degradation of reception quality due to puncturing to be suppressed. Also, since the number of rows for which reliability is not propagated by only row computation is reduced, the number of iterations necessary for reliability propagation can be reduced.

In the example shown in FIG. 25, transmitted transmission codeword bits increase and transmission speed decreases due to the provision of a block that is not punctured. However, as long as provision is made for the relationship N<<M to hold true between number of bits N for which the first puncture pattern is used and number of bits M for which the second puncture pattern is used, reception quality can be improved while suppressing a decrease in transmission speed. In the example shown in FIG. 25, N=6 and M=24, and although the number of additional transmission codeword bits is only two, the number of rows for which logarithmic likelihood propagation is not performed by only row computation can be reduced from six to three.

Figure 27:
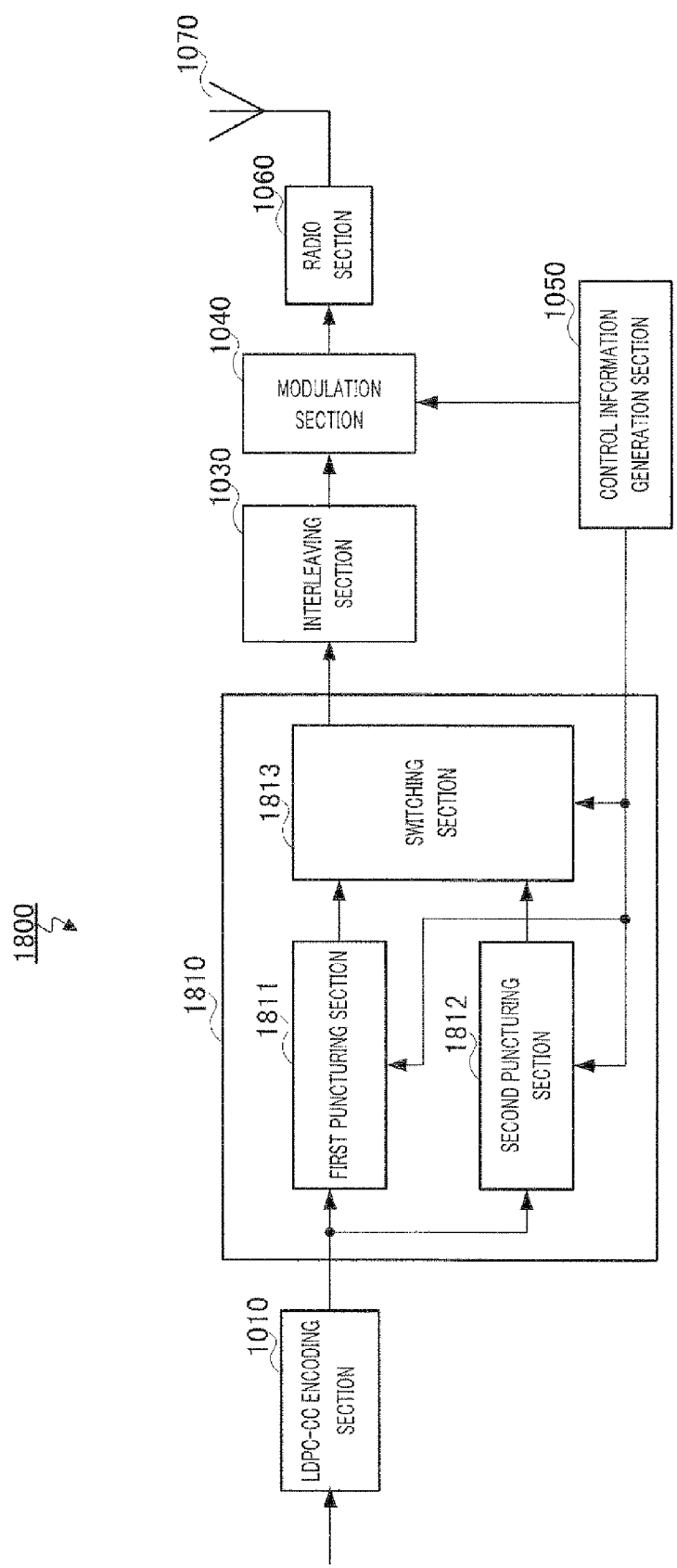
FIG. 27 is a block diagram showing another main configuration of a transmitting apparatus according to Embodiment 7.

A configuration of a transmitting apparatus according to this embodiment will now be described. FIG. 27 is a block diagram showing a main configuration of a transmitting apparatus according to this embodiment. In the description of this embodiment, configuration parts identical to those in FIG. 14 are assigned the same reference numbers as in FIG. 14, and descriptions thereof are omitted. As compared with transmitting apparatus 1000 in FIG. 14, transmitting apparatus 1800 in FIG. 27 is equipped with puncturing section 1810 instead of termination sequence puncturing section 1020. Puncturing section 1810 is equipped with first puncturing section 1811, second puncturing section 1812, and switching section 1813.

Puncturing section 1810 performs puncturing on a transmission codeword sequence comprising a transmission information sequence and a termination sequence, and outputs a punctured transmission codeword sequence to interleaving section 1030.

Figure 28:
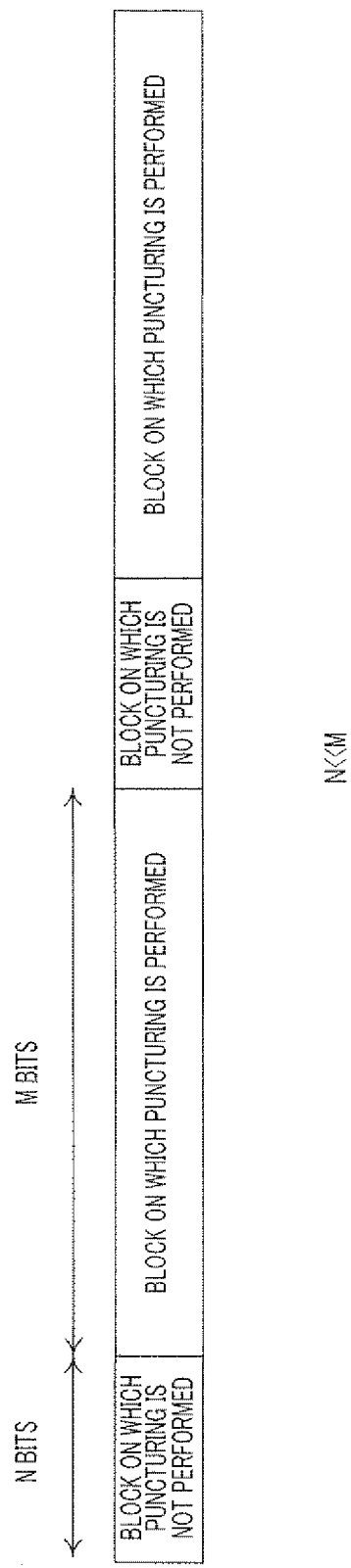
FIG. 28 is a drawing showing an example of a puncture pattern according to Embodiment 7.

Specifically, puncturing section 1810 punctures a transmission codeword sequence using a first puncture pattern and a second puncture pattern whereby more bits are punctured than with the first puncture pattern. The first puncture pattern and second puncture pattern have different proportions of bits that are punctured. Puncturing section 1810 punctures a transmission codeword sequence using a puncture pattern such as shown in FIG. 28, for example. In FIG. 28, (N+M) bits comprise a receiver side (decoding-side) processing unit.

First puncturing section 1811 performs puncturing on a transmission codeword sequence using a first puncture pattern. Second puncturing section 1812 performs puncturing on a transmission codeword sequence using a second puncture pattern.

When the puncture pattern shown in FIG. 28 is used, first puncturing section 1811 does not perform puncturing on an N-bit transmission codeword sequence from the start of a receiver side (decoding-side) processing unit, and outputs a transmission codeword sequence input to first puncturing section 1811 to switching section 1813. Second puncturing section 1812 performs puncturing on a bit (N+1) through (N+M) transmission codeword sequence, and outputs a punctured transmission codeword sequence to switching section 1813.

Provision may also be made for first puncturing section 1811 and second puncturing section 1812 to determine whether or not to execute puncturing on a transmission codeword sequence based on a control signal from control information generation section 1050. According to a control signal from control information generation section 1050, switching section 1813 outputs either a transmission codeword sequence output from first puncturing section 1811, or a transmission codeword sequence output from second puncturing section 1812, to interleaving section 1030.

The operation of transmitting apparatus 1800 configured as described above will now be explained, focusing mainly on puncturing processing by puncturing section 1810. Below, a case in which LDPC-CC encoding section 1010 executes LDPC-CC encoding using a convolutional code with coding rate R=½, (177, 131) is described as an example.

In LDPC-CC encoding section 1010, LDPC-CC encoding processing is executed on transmission information sequence $u_t$ (where t=1, n), and $v=(v_{1,t}, v_{2,t})$ is obtained. In the case of a systematic code, $v_{1,t}$ is transmission information sequence $u_t$ and $v_{2,t}$ is parity. Parity $v_{2,t}$ is found based on transmission information sequence $v_{1,t}$ and a check equation of each row in FIG. 26.

Puncturing processing is executed on coding rate R=½ transmission codeword sequence v by puncturing section 1810. For example, when the puncturing shown in FIG. 25 is used, puncturing is not performed on block 1 by puncturing section 1810, but bits are punctured in a regular manner at predetermined intervals on block 2 through block 5. That is to say, bits $v_{2,4}$ and $v_{2,6}$ are punctured in block 2, bits $v_{2,7}$ and $v_{2,9}$ are punctured in block 3, bits $v_{2,10}$ and $v_{2,12}$ are punctured in block 4, and bits $v_{2,13}$ and $v_{2,15}$ are punctured in block 5. In this way, a transmission codeword sequence with coding rate R=¾ is obtained for block 2 through block 5.

A punctured transmission codeword sequence is transmitted to the receiver side (decoding side) via interleaving section 1030, modulation section 1040, radio section 1060, and transmitting antenna 1070. At this time, when the puncture pattern shown in FIG. 25 is used, $v_{2,4}$, $v_{2,6}$, $v_{2,7}$, $v_{2,9}$, $v_{2,10}$, $v_{2,12}$, $v_{2,13}$, and $v_{2,15}$ are not transmitted.

Thus, when the puncture pattern shown in FIG. 25 is used, blocks for which puncturing is not performed occur at predetermined intervals. As shown in FIG. 25, as a result of puncturing not being performed on block 1, $v_{2,1}$ and $v_{2,3}$, which were not transmitted when the general puncturing method in FIG. 23 was used, are transmitted. Consequently, rows for which reliability is not propagated by only row computation when using BP decoding are the three rows shown as rows 1720 in FIG. 26. As can be seen by comparing FIG. 23 and FIG. 25, adding two transmission bits decreases the number of rows for which reliability is not propagated by only row computation from six to three. As a result, the number of rows for which there is a logarithmic likelihood initially increases, and initial reliability is updated dependably by BP decoding, and furthermore that reliability is propagated to rows 1720 in FIG. 26.

Subsequently, due to the characteristics of the structure of a convolutional code based parity check matrix, reliabilities present in large numbers at the start of the parity check matrix are propagated sequentially by performing iterative decoding a plurality of times, enabling degradation of reception quality due to puncturing to be suppressed.

Figure 34:
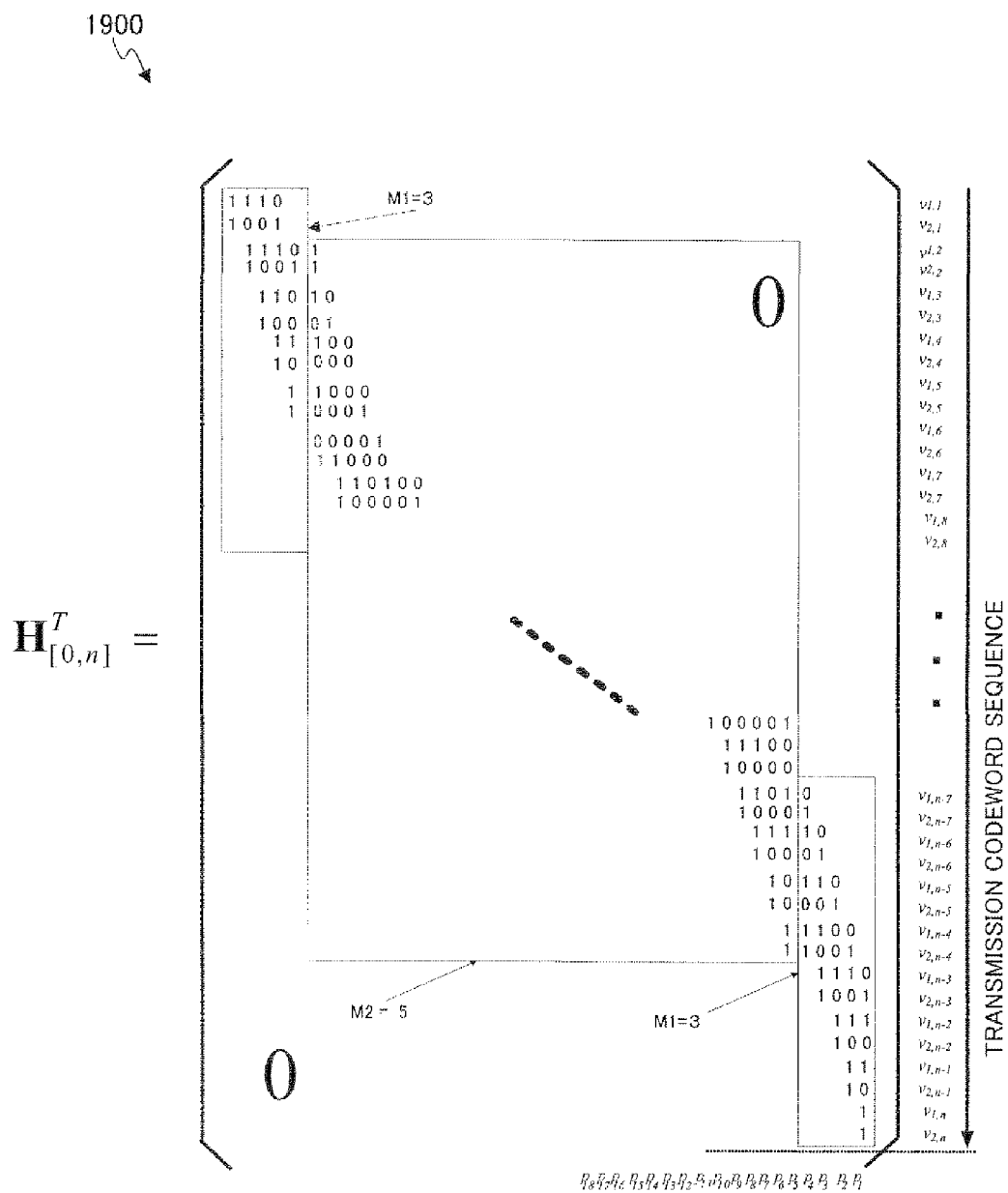
FIG. 34 is a drawing showing an example of a parity check matrix according to Embodiment 8 of the present invention.

In the example shown in FIG. 25, the additional number of bits that come to be transmitted is only two, and therefore a decrease in transmission speed is small and degradation of reception quality can be suppressed. The achievement of this effect is due to the characteristic of an LDPC-CC adopting a form in which places where a 1 is present are concentrated in a parallelogram-shaped range in a parity check matrix, as shown in FIG. 34. Therefore, there is little possibility of being able to obtain the same kind of effect by application to the case of an LDPC-BC.

Thus, by providing a block that is not punctured, the number of rows that exert an adverse effect when BP decoding is performed can be reduced. To consider transmission efficiency in this case, it is important that the relationship N<<M should hold true between bits N forming a block that is not punctured and bits M forming a block subject to puncturing. By making N<<M, degradation of reception quality can be suppressed while suppressing degradation of transmission efficiency.

Provision may also be made for puncturing section 1810 to puncture block 2 through block 5, to which the second puncture pattern is applied, in accordance with a predetermined rule instead of randomly.

Puncture computation processing is simpler when puncturing is performed in accordance with a predetermined rule than when puncturing is performed randomly.

(Other Puncture Patterns)

Figure 29:
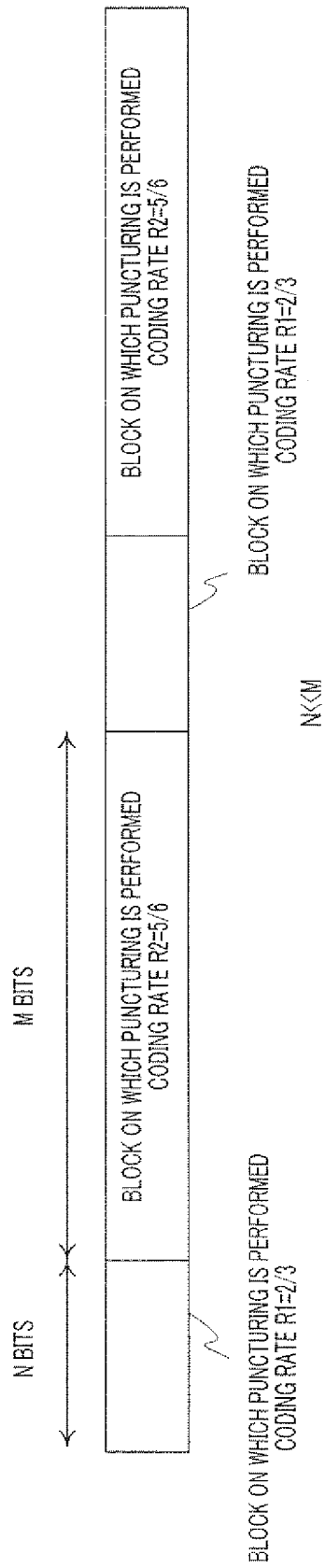
FIG. 29 is a drawing showing another puncture pattern according to Embodiment 7.

The puncture pattern used by puncturing section 1810 is not limited to that in FIG. 28. For example, provision may also be made for puncturing section 1810 to use a puncture pattern with coding rate R1=⅔ as a first puncture pattern, and to use a puncture pattern with coding rate R2=⅚ as a second puncture pattern, as shown in FIG. 29.

Furthermore, puncturing may also be executed with n frames as a processing unit on the receiver side (decoding side), as shown in FIG. 30A and FIG. 30B. As shown in FIG. 30A, provision may be made for a first puncture pattern whereby puncturing is not performed to be used for N bits from the start of n frames (where n is an integer greater than or equal to 1), and for a second puncture pattern whereby puncturing is performed to be used for bits (N+1) through (N+M).

Alternatively, as shown in FIG. 30B, provision may be made for a first puncture pattern with coding rate R1=⅔ to be used for N bits from the start of n frames, and for a second puncture pattern with coding rate R2=⅚ to be used for bits (N+1) through (N+M).

Figure 31A:
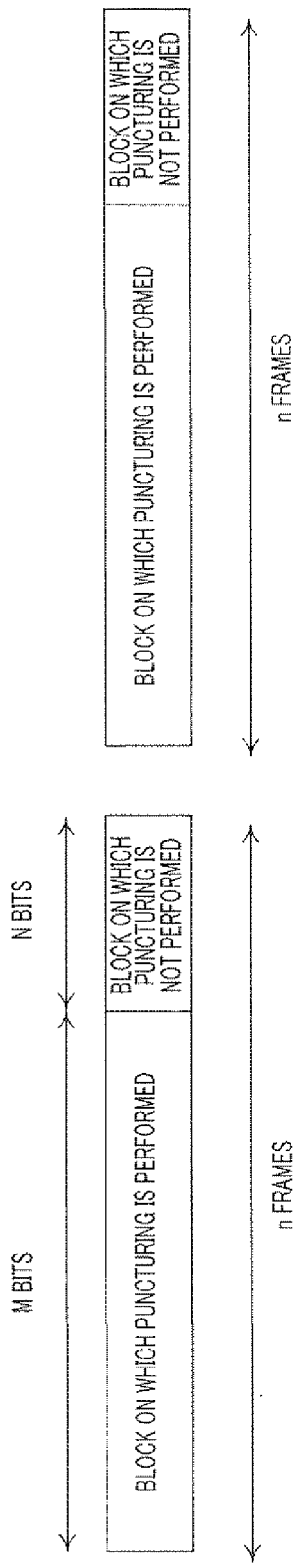
FIG. 31 is a drawing showing another puncture pattern according to Embodiment 7.
Figure 31B:
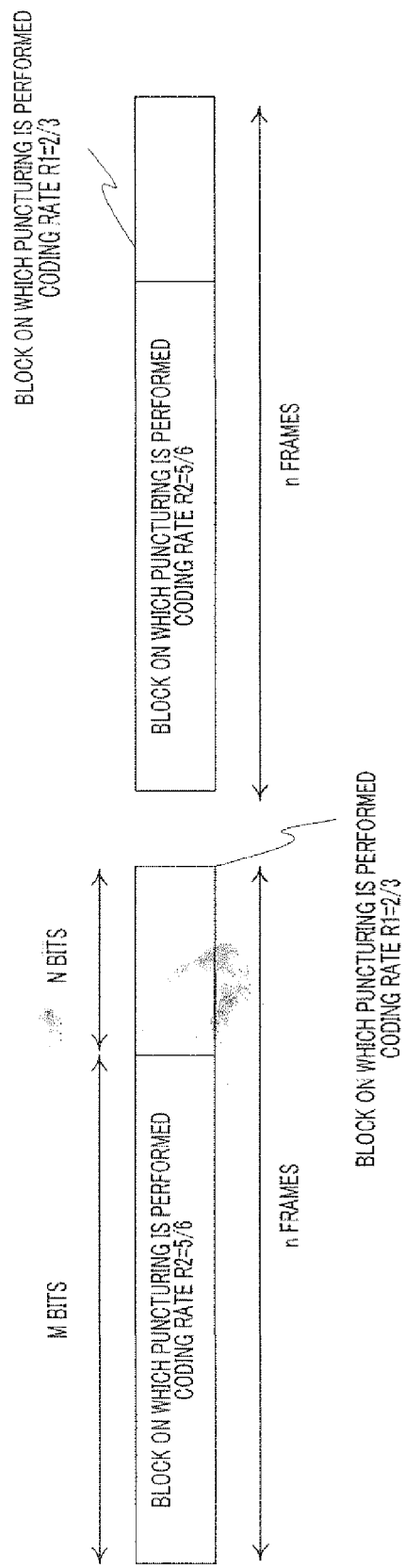

Also, a pattern may be used whereby fewer bits are punctured by puncturing toward the rear of a processing unit on the receiver side (decoding side), as shown in FIG. 31A and FIG. 31B. Providing for fewer bits to be punctured by puncturing toward the rear of a processing unit on the receiver side (decoding side) improves reception quality in BP decoding.

As in the case shown in FIG. 28, as long as provision is made for the relationship N<<M to hold true between number of bits N for which the first puncture pattern is used and number of bits M for which the second puncture pattern is used, reception quality can be improved while suppressing a decrease in transmission speed.

Also, as shown in FIG. 32A, provision may be made for a first puncture pattern whereby puncturing is not performed to be used for N1 bits from the start of n frames (where n is an integer greater than or equal to 1) comprising a processing unit on the receiver side (decoding side), for a second puncture pattern whereby puncturing is performed to be used for bits (N1+1) through (N1+M), and for the first puncture pattern whereby puncturing is not performed to be used for bits (N1+M+1) through (N1+M+N2).

Moreover, as shown in FIG. 32B, provision may be made for a first puncture pattern with coding rate R1=⅔ to be used for N1 bits from the start of n frames (where n is an integer greater than or equal to 1) comprising a processing unit on the receiver side (decoding side), for a second puncture pattern with coding rate R2=⅚ to be used for bits (N1+1) through (N1+M), and for the first puncture pattern with coding rate R1=⅔ to be used for bits (N1+M+1) through (N1+M+N2).

Parity check matrices for which reliability is high increase when a first puncture pattern whereby few bits are punctured by puncturing is used in two places in a processing unit on the receiver side (decoding side) (see FIG. 32) as compared with a case in which such a first puncture pattern is used in one place (see FIG. 30 and FIG. 31), and therefore the convergence rate is high when BP decoding is performed, and decoded results can be obtained with a small number of iterations.

The number of places at which a first puncture pattern whereby few bits are punctured by puncturing is used in an above processing unit is not limited to two, and may be three or more.

When the number of places at which a first puncture pattern whereby few bits are punctured by puncturing is used in an above processing unit is two or more, also, as long as provision is made for the relationship N<<M to hold true between total number of bits N for which the first puncture pattern is used and total number of bits M for which the second puncture pattern is used, reception quality can be improved while suppressing a decrease in transmission speed.

In FIG. 30, FIG. 31, and FIG. 32, cases have been described in which a first puncture pattern and second puncture pattern are used for n frames, but n need only be an integer greater than or equal to 1, and application is also possible in the case of one frame.

Below, puncture patterns suitable for a transmission codeword sequence obtained by LDPC-CC encoding will be considered, taking the relationship to decoding processing timing into consideration.

Figure 33:
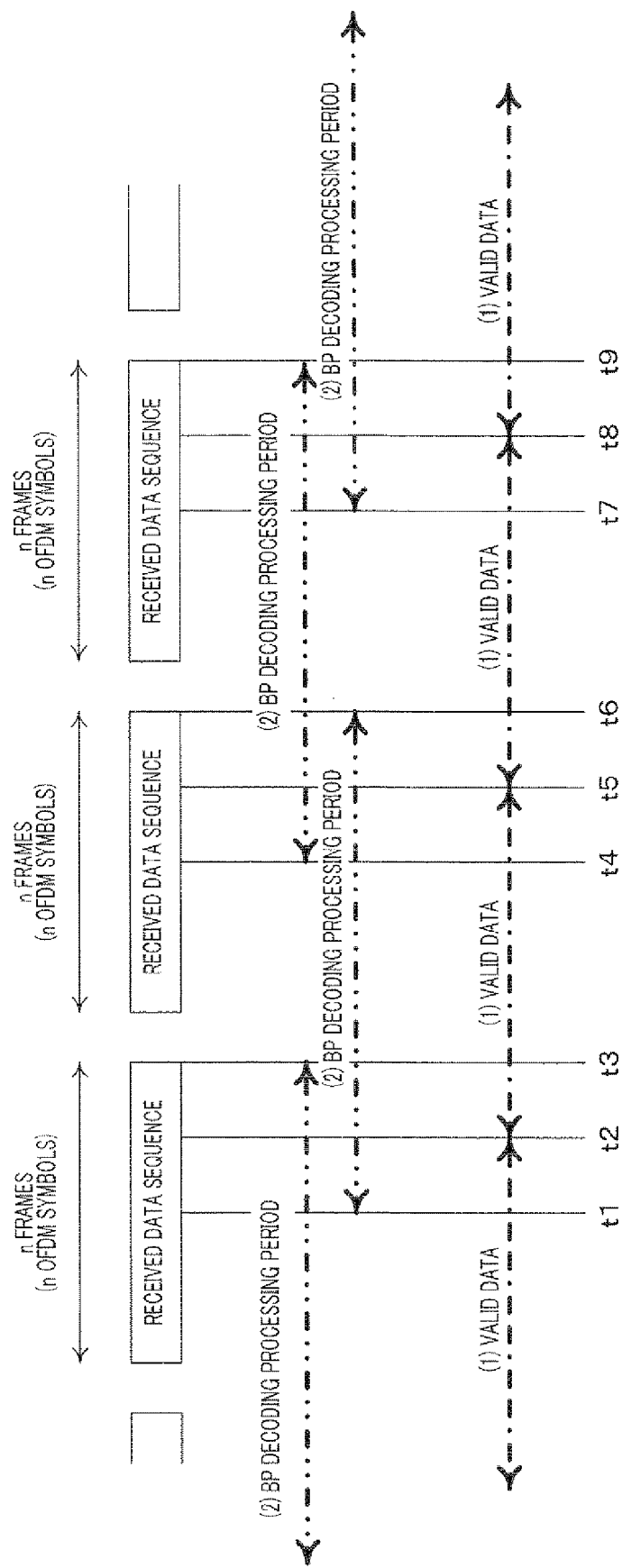
FIG. 33 is a drawing for explaining decoding processing timing.

FIG. 33 is a drawing for explaining decoding processing timing. In FIG. 33, received data sequences are each composed of n frames (for example, n OFDM (Orthogonal Frequency Division Multiplexing) symbols: an OFDM symbol being a symbol composed of all carriers (32 subcarriers) when an OFDM method comprises 32 subcarriers and composes a modulation signal on a subcarrier-by-subcarrier basis). This received data sequence length is a processing unit on the receiver side (decoding side), and the relevant n frames (or n OFDM symbols) are passed to an upper layer as one entity. Generally, there is a time lag until the upper layer fetches data of the next frame, and therefore timings t3, t6, and t9 in FIG. 33—that is, timings at which the final part of n frames is received—are actually taken to be the ends of periods in which BP decoding is performed.

As an LDPC-CC has properties of a convolutional code, in order for data estimated by BP decoding from timing t2 to be made valid data (data with a high possibility of being correct), it is necessary for BP decoding to be started before timing t2. For example, in the example shown in FIG. 33, in order for estimated data obtained by BP decoding between t2 and t5 to be made valid data, it is necessary for BP decoding to be performed between t1 and t6. Similarly, in order for estimated data obtained by BP decoding between t5 and t8 to be made valid data, it is necessary for BP decoding to be performed between t4 and t9.

When such decoding processing timing is taken into consideration, if provision is made for puncturing such that the number of bits punctured by puncturing becomes smaller in the rear part of a received data sequence composed of n frames, for example, rows for which reliability is propagated are included both forward and rearward in a BP decoding processing period, and therefore reliability can be propagated efficiently.

As described above, according to this embodiment provision is made for puncturing section 1810 to perform transmission codeword bit puncturing using a first puncture pattern, and a second puncture pattern whereby more bits are punctured than with the first puncture pattern, for each transmission codeword bit processing unit.

By using first and second puncture patterns with different punctured coding rates instead of executing puncturing in a fixed proportion, degradation of decoding characteristics due to BP decoding can be suppressed.

Although rows that cause degradation of reception quality inevitably occur when puncturing is performed, a method of suppressing degradation of reception quality while suppressing a decrease in transmission speed, such as a puncturing method according to this embodiment, is extremely important in constructing a system offering good performance.

First and second puncture patterns may each be composed of an identical plurality of sub-patterns. That is to say, provision may be made for identical sub-puncture-patterns to be used for each of blocks 2 through 5, and for transmission codeword bits to be punctured in a regular manner, as shown in FIG. 25. This enables puncture computation processing to be simplified.

Also, a first puncture pattern with a small coding rate need not necessarily be positioned at the end of n frames, but, as can be seen from FIG. 33, may also be provided between t1 and t3, t4 and t6, and t7 and t9. Furthermore, since periods t1 to t3, t4 to t6, and t7 to t9 are determined by the relationship between a BP decoding processing period and a period in which valid data is obtained, a suitable position for placing a first puncture pattern also varies.

In the above description, a puncturing method for a case in which BP decoding is performed on a convolutional code has been described as an example, but this is not a limitation, and a puncturing method of the present invention can also be implemented in a similar way in the case of a time-invariant LDPC-CC or time-varying LDPC-CC such as described in Non-Patent Document 1 and Non-Patent Document 5 through Non-Patent Document 7.

(Embodiment 8)

In this embodiment, descriptions are given of a parity check matrix that is designed so that LDPC-CC encoding memory length M decreases toward the front and toward the rear of a transmission information sequence, and a configuration of an LDPC-CC encoder that is based on that parity check matrix. Use of such a configuration enables the number of states of an encoder at the start and end of encoding to be reduced. Consequently, when termination by means of tail-biting described in Non-Patent Document 8 is used, for example, the number of states that need to be considered in encoding and decoding can be reduced, enabling encoder and decoder configurations to be simplified.

FIG. 34 shows an example of a parity check matrix according to this embodiment. Parity check matrix 1900 in FIG. 34 is an example of a case with coding rate R=b/c=½ and transmission information sequence length n. Parity check matrix 1900 differs from parity check matrix 100 in FIG. 3 in that, in parts in which the index of transmission information sequence $u_t$ approaches 1 and approaches n, encoding memory length M1 is smaller than memory length M2 of other parts.

Parity check matrix 1900 is an example in which M1=3 and M2=5, but M1 and M2 are not limited to these values, and it is only necessary for the relationship M1<M2 to hold true. More particularly, the relationship M1<<M2 is advantageous in that the number of tail-biting states can be reduced, and the LDPC-CC constraint length for bits in a part other than a part relating to termination can be lengthened. Also, provision may be made for the number of memory lengths to be made three or more, and for the memory length to decrease gradually as the index of transmission information sequence $u_t$ approaches 1 and approaches n.

As shown in FIG. 34, when parity check matrix 1900 is used encoding is performed for transmission information sequence $u_1$ through $u_5$ with memory length M1=3, and transmission codeword sequences $v_{1,1}$ through $v_{1,5}$ and $v_{2,1}$ through $v_{2,5}$ are acquired. For transmission information sequence $u_{n6}$ through $u_{n-5}$, encoding is performed with memory length M2=5, and transmission codeword sequences $v_{1,6}$ through $v_{1,n-5}$ and $v_{2,6}$ through $v_{2,n-5}$ are acquired. And for transmission information sequence $u_{n-4}$ through $u_n$, encoding is performed with memory length M1=3, and transmission codeword sequences $v_{1,n-4}$ through $v_{1,n}$ and $v_{2,n-4}$ through $v_{2,n}$ are acquired.

As described in Non-Patent Document 8, the number of encoding initial states and end states is two to the M-th power, where M is the memory length of an encoder. Therefore, if memory length M1 of an encoder relating to initial-state and end-state encoding is made smaller, the number of states relating to tail-biting can be reduced.

Thus, by performing LDPC-CC encoding using parity check matrix 1900 shown in FIG. 34, the number of initial states and end states of an encoder can be reduced, and as a result, the amount of computation and processing delay relating to encoding/decoding can be reduced.

A characteristic of an LDPC-CC is that greater encoding gain and a better error rate characteristic are obtained the larger the value of memory length M. Consequently, with parity check matrix 1900, encoding gain can be obtained by increasing the memory length of a part other than a part relating to termination.

Next, a configuration of an LDPC-CC encoder that performs LDPC-CC encoding using parity check matrix 1900 in FIG. 34 will be described with reference to the accompanying drawings.

Figure 35:
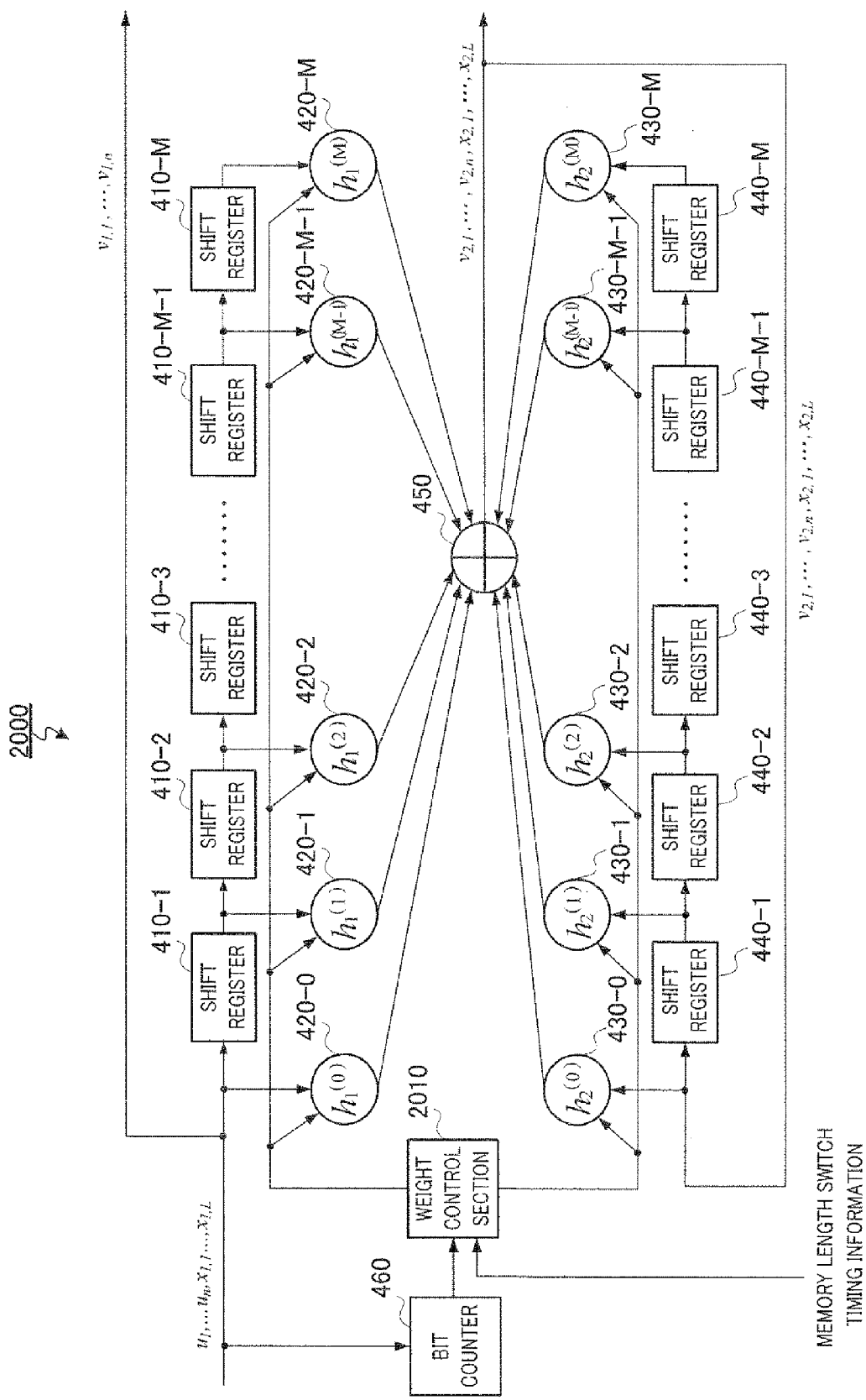
FIG. 35 is a block diagram showing a configuration of an LDPC-CC encoder according to Embodiment 8.

FIG. 35 is a block diagram showing a main configuration of an LDPC-CC encoder according to this embodiment. In the description of this embodiment, configuration parts identical to those in FIG. 6 are assigned the same reference numbers as in FIG. 6, and descriptions thereof are omitted. As compared with LDPC-CC encoder 400 in FIG. 6, LDPC-CC encoder 2000 in FIG. 35 does not have puncturing section 480 and is equipped with weight control section 2010 instead of weight control section 470.

Based on a bit count output from bit counter 460, memory length switch timing information, and a weight pattern conforming to parity check matrix 1900 stored in weight control section 2010, weight control section 2010 sends the values of matrix elements $h_1^{(m)}(t)$ and $h_2^{(m)}(t)$ at the memory length switching timing to weight multipliers 420-0 through 420-M and 430-0 through 430-M. Here, M is greater than M1.

Here, memory length switch timing information denotes a transmission information sequence index that switches memory length M of parity check matrix 1900. For example, in the case of parity check matrix 1900 shown in FIG. 34, encoding is performed on the front part and rear part of a transmission information sequence using M1=3, and encoding is performed on other parts using M2=5, and therefore memory length switch timing information can have two values. That is to say, memory length switch timing information has a timing information index that switches from M1=3 to M2=5, and a timing information index that switches from M2=5 to M1=3.

Figure 36:
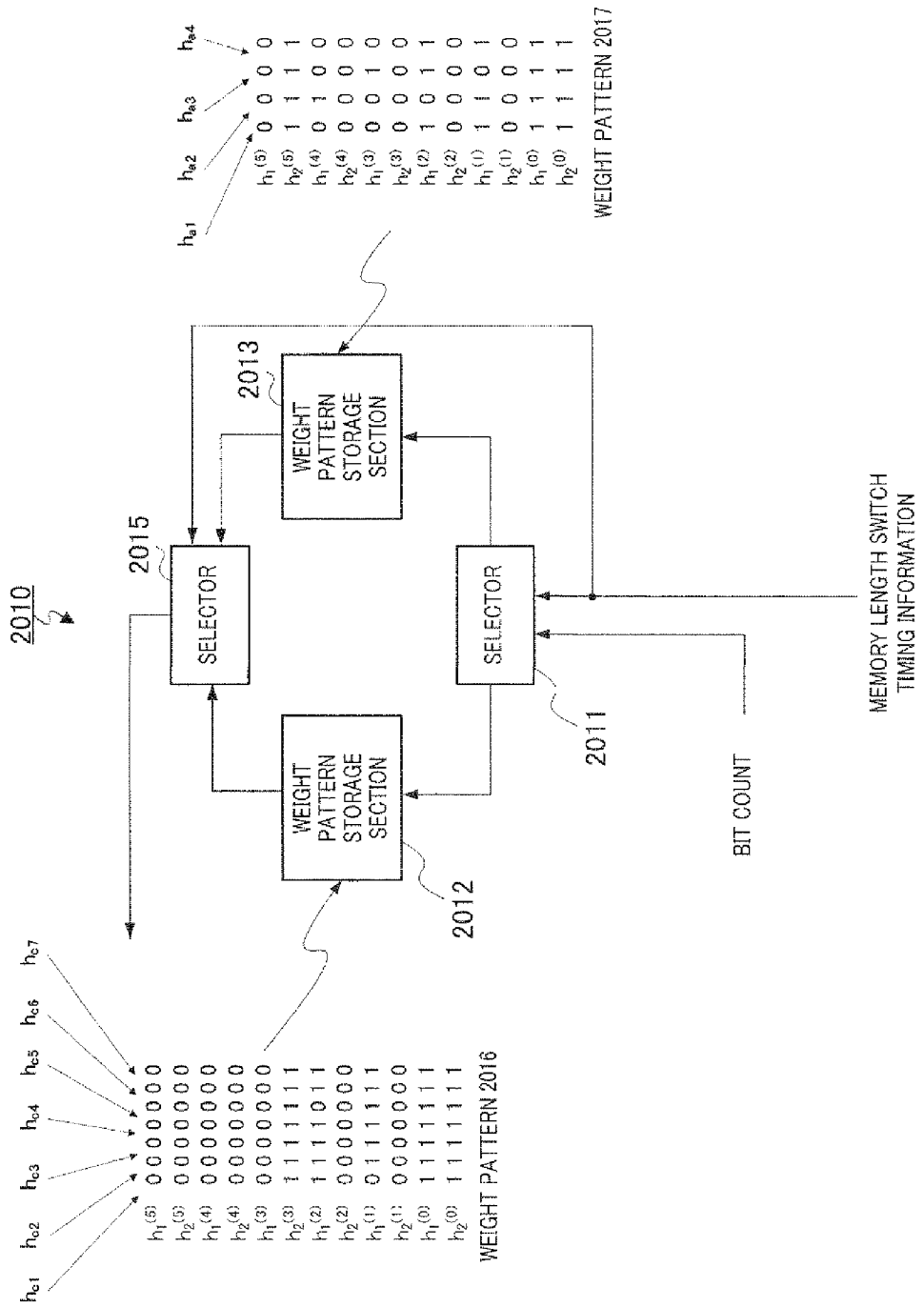
FIG. 36 is a block diagram showing a configuration of a weight control section according to Embodiment 8.

FIG. 36 shows a sample configuration of weight control section 2010 when using two kinds of memory length M: M1=3 and M2=5. Weight control section 2010 in FIG. 36 comprises selectors 2011 and 2015, and weight pattern storage sections 2012 and 2013. Below, an index indicating timing for switching from memory length M1=3 to M2=5 is referred to as memory length switch timing information 1, and an index indicating timing for switching from memory length M2=5 to M1=3 is referred to as memory length switch timing information 2.

Selector 2011 has a bit count and memory length switch timing information 1 and 2 as input, and if bit count memory length switch timing information 1, sends the bit count to weight pattern storage section 2012.

On the other hand, if bit count>memory length switch timing information 1, and bit count≦memory length switch timing information 2, selector 2011 sends the bit count to weight pattern storage section 2013.

Furthermore, if bit count>memory length switch timing information 2, selector 2011 sends the bit count to weight pattern storage section 2012.

Weight pattern storage section 2012 stores the weight pattern indicated by weight pattern 2016, and outputs $h_{a1}$, $h_{a2}$, $h_{a3}$, and $h_{a4}$ to selector 2015 periodically as the bit count increases. Weight pattern 2016 comprises matrix elements $h_1^{(m)}(t)$ and $h_2^{(m)}(t)$ (where m=0, . . . , 3) of a parity check matrix for a case in which memory length M1=3. When memory length M1=3, the number of $h_{b1}$, $h_{b2}$, $h_{b3}$ weight pattern elements is eight, but LDPC-CC encoder 2000 is equipped with 12 weight multipliers 420-0 through 420-M (where M=5) and 430-0 through 430-M (where M=5) capable of handling memory length M2=5. Consequently, in weight pattern 2016, the $h_1^{(4)}$, $h_2^{(4)}$, $h_1^{(5)}$, and $h_2^{(5)}$ weight elements are 0 in any pattern.

Weight pattern storage section 2013 stores the weight pattern indicated by weight pattern 2017, and outputs $h_{b1}$, $h_{b2}$, and $h_{b3}$ to selector 2015 periodically as the bit count increases. Weight pattern 2017 comprises matrix elements $h_1^{(m)}(t)$ and $h_2^{(m)}(t)$ (where m=0, . . . , 5) of an LDPC-CC parity check matrix for a case in which memory length M2=5.

Selector 2015 outputs matrix elements $h_{a1}$, $h_{a2}$, $h_{a3}$, and $h_{a4}$ input from weight pattern storage section 2012, and matrix elements $h_{b1}$, $h_{b2}$, and $h_{b3}$ input from weight pattern storage section 2013, to weight multipliers 420-0 through 420-M and 430-0 through 430-M.

That is to say, if bit count≦memory length switch timing information 1 according to the result of a comparison between a bit count and memory length switch timing information 1 and 2 in conjunction with selector 2011, selector 2015 outputs matrix elements of weight pattern 2016 conforming to a parity check matrix with memory length M1=3 stored in weight pattern storage section 2012 to weight multipliers 420-0 through 420-M and 430-0 through 430-M.

On the other hand, if bit count>memory length switch timing information 1 and bit count≦memory length switch timing information 2, selector 2015 outputs matrix elements of weight pattern 2017 conforming to a parity check matrix with memory length M2=5 stored in weight pattern storage section 2013 to weight multipliers 420-0 through 420-M and 430-0 through 430-M.

Furthermore, if bit count>memory length switch timing information 2, selector 2015 outputs matrix elements of weight pattern 2018 conforming to a parity check matrix with memory length M1=3 stored in weight pattern storage section 2012 to weight multipliers 420-0 through 420-M and 430-0 through 430-M.

The operation of LDPC-CC encoder 2000 configured as described above will now be explained.

The state of shift registers 410-1 through 410-M is set to S1, and the state of shift registers 440-1 through 440-M is set to S2. States S1 and S2 are decide by a transmission sequence. Transmission information sequence $u_1$ through $u_n$ is output sequentially to shift register 410-1, weight multiplier 420-0, and bit counter 460.

Bit counter 460 counts the number of bits of input transmission information sequence $u_1$ through $u_n$ and termination sequence $x_{1,1}$ through $x_{1,L}$, and outputs the obtained bit count to weight control section 2010.

Weight control section 2010 selects either weight pattern 2016 or weight pattern 2017 according to the result of a comparison between the bit count and memory length switch timing information, and outputs matrix elements of the selected weight pattern to weight multipliers 420-0 through 420-M and 430-0 through 430-M.

Specifically, if bit count≦length switch timing information 1, matrix elements of weight pattern 2016 conforming to a parity check matrix with memory length M1=3 are output to weight multipliers 420-0 through 420-M and 430-0 through 430-M.

If bit count>memory length switch timing information I and bit count≦memory length switch timing information 2, matrix elements of weight pattern 2017 conforming to a parity check matrix with memory length M2=5 are output to weight multipliers 420-0 through 420-M and 430-0 through 430-M.

And if bit count>memory length switch timing information 2, matrix elements of weight pattern 2016 conforming to a parity check matrix with memory length M1=3 are output to weight multipliers 420-0 through 420-M and 430-0 through 430-M.

In this way, a memory length relating to encoding of the front part and rear part of a transmission information sequence can be made smaller, and as a result, the number of initial states and end states of an encoder can be reduced.

As described above, according to this embodiment, weight control section 2010 stores weight patterns 2016 and 2017 conforming to parity check matrices with different memory lengths, and when input bits are an information sequence, a weight pattern with a short memory length is used in the front part and rear part of the information sequence. Since the number of initial states and end states of an encoder can be reduced as memory length M decreases, the amount of computation and processing delay time associated with encoding/decoding can be reduced.

In this embodiment, a case has been described by way of example in which encoding is performed using memory length M1=3 in the front part and rear part of a transmission information sequence, and using memory length M2=5 in other parts, but this is not a limitation, and an effect of reducing the number of initial states and end states of an encoder can still be obtained by the present invention if a parity check matrix for which memory length M1 used in the front part and rear part of a transmission information sequence is set to an arbitrary memory length of less than 3, or for which an amount of decrease from memory length M2 to memory length M1 is made arbitrary, is used.

(Embodiment 9)

In this embodiment, a description is given of a configuration of an LDPC-CC encoder that is designed so that, in encoding of an LDPC-CC comprising a plurality of polynomials, encoding processing is started using a polynomial for which the memory length is minimum among the plurality of polynomials, and encoding processing is ended using a polynomial for which the memory length is minimum among the plurality of polynomials. Use of such a configuration enables the number of states of an encoder at the start and end of encoding to be reduced, enabling the amount of computation and processing delay time associated with encoding/decoding to be reduced.

Figure 37:
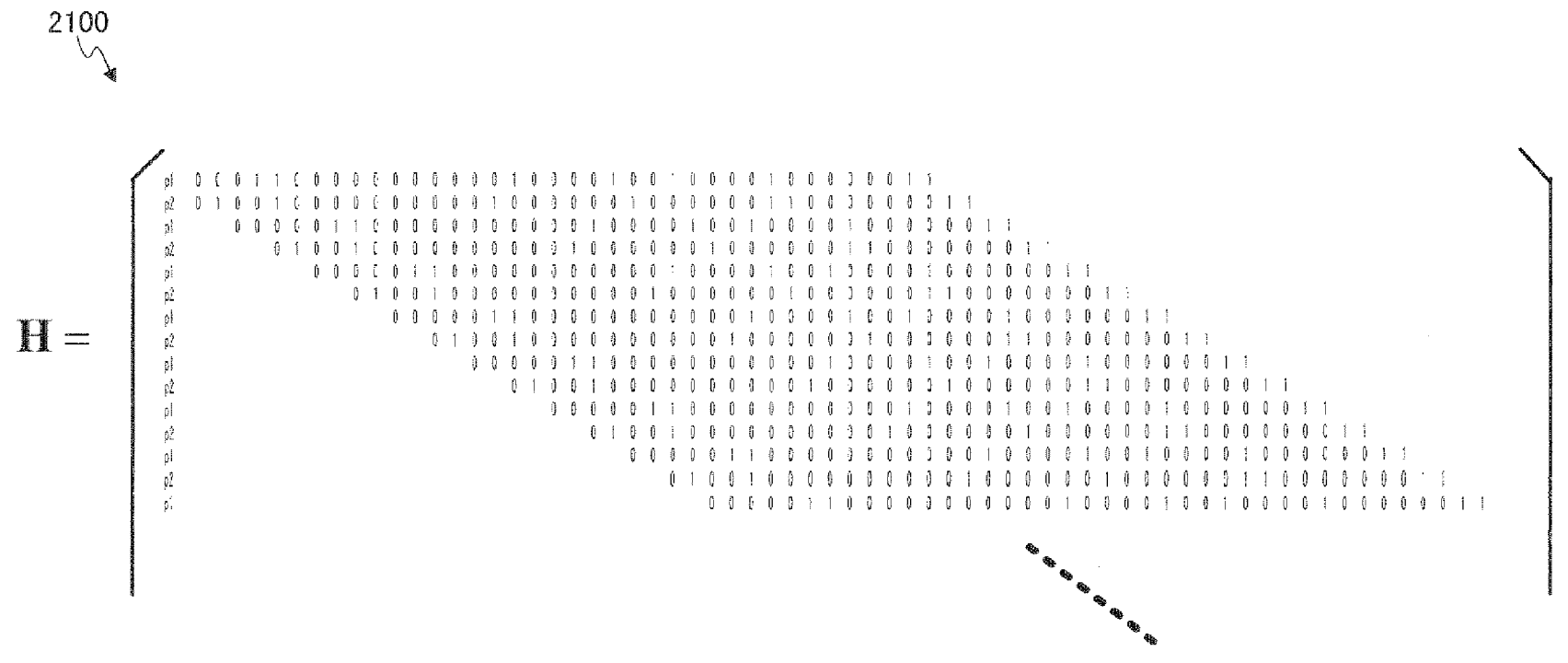

FIG. 37 shows parity check matrix 2100 according to this embodiment. Parity check matrix 2100 is a parity check matrix for which the number of polynomials is 2—that is, a parity check matrix that defines a time-varying-period-2 LDPC-CC. Each row of parity check matrix 2100 corresponds to a check polynomial, and each column corresponds to a codeword bit. The two polynomials are given by Equation (7-1) and Equation (7-2).

[7]

$$(D^{16}+D^{10}+D^6+1)X(D)+(D^{17}+D^8+D^4+1)P(D)=0 \ldots \quad \text{(Equation 7-1)}$$

$$(D^{17}+D^8+D^4+1)X(D)+(D^{19}+D^{12}+D^5+1)P(D)=0 \ldots \quad \text{(Equation 7-2)}$$

Below, a first polynomial given by Equation (7-1) is referred to as polynomial p1, and a second polynomial given by Equation (7-2) is referred to as polynomial p2.

The memory lengths of first polynomial p1 are Md1=16 and Mp1=17, where subscripts d and p indicate information bits and parity bits. The memory lengths of second polynomial p2 are Md2=17 and Mp2=19. That is to say, of first polynomial p1 and second polynomial p2, both memory lengths are shorter for first polynomial p1.

As stated in Embodiment 8, the shorter the memory length, the smaller is the number of encoder states, and therefore, in order to reduce the number of states, it is desirable for encoding to be started using a polynomial for which the memory length is short, and for encoding to be ended using a polynomial for which the memory length is short.

At this time, by starting encoding with first polynomial p1, encoding can be performed using a polynomial for which the memory length is short at the start of encoding. On the other hand, when the time-varying period is 2, and two polynomials are used alternately, a polynomial at the end of encoding varies according to the number of information bits that are encoded. Consequently, encoding processing cannot necessarily be ended using a polynomial for which the memory length is short.

Thus, in this embodiment, polynomial adjustment section 2210 is provided, and provision is made for encoding always to be ended with a polynomial for which the memory length is short.

Figure 38:
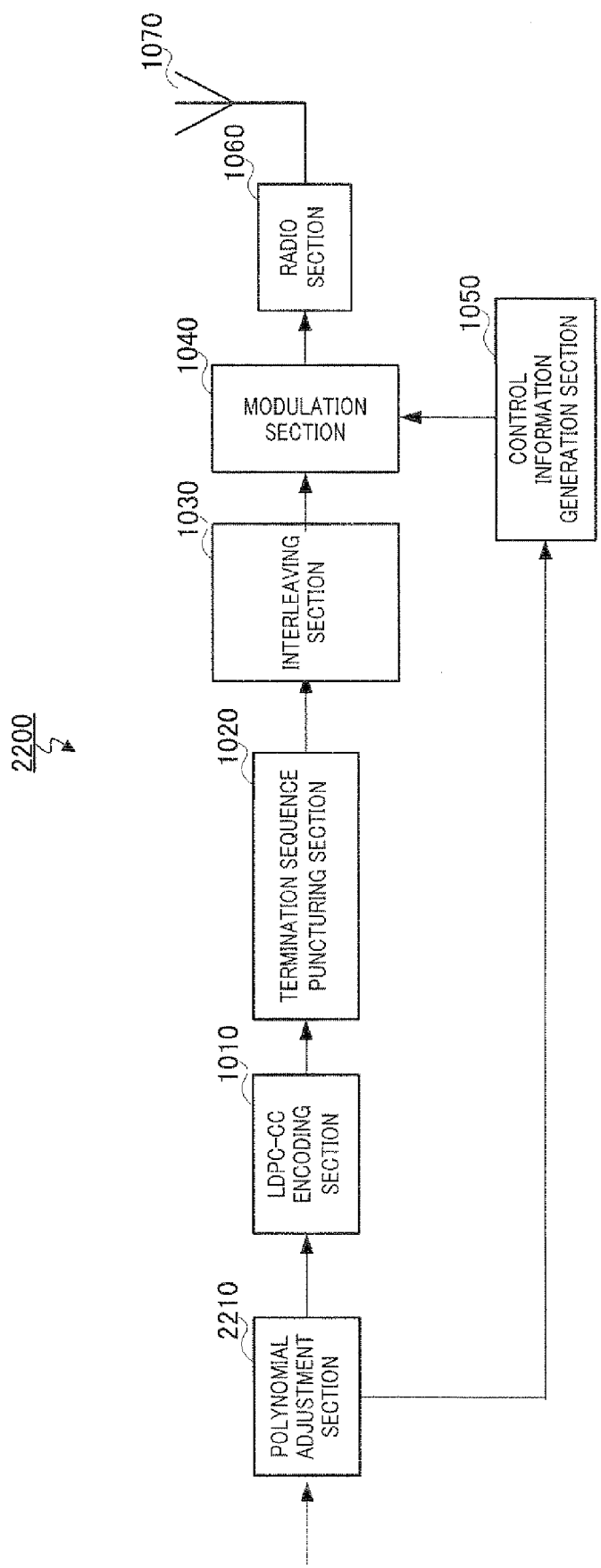
FIG. 38 is a block diagram showing a configuration of a transmitting apparatus according to Embodiment 9.

FIG. 38 shows a main configuration of a transmitting apparatus according to this embodiment. As compared with transmitting apparatus 1000 in FIG. 14, transmitting apparatus 2200 in FIG. 38 employs a configuration that additionally includes polynomial adjustment section 2210.

Polynomial adjustment section 2210 finds number of adjustment bits Nadj using number of transmission information bits Ndata and number of LDPC-CC polynomials Npoly.

Figure 39:
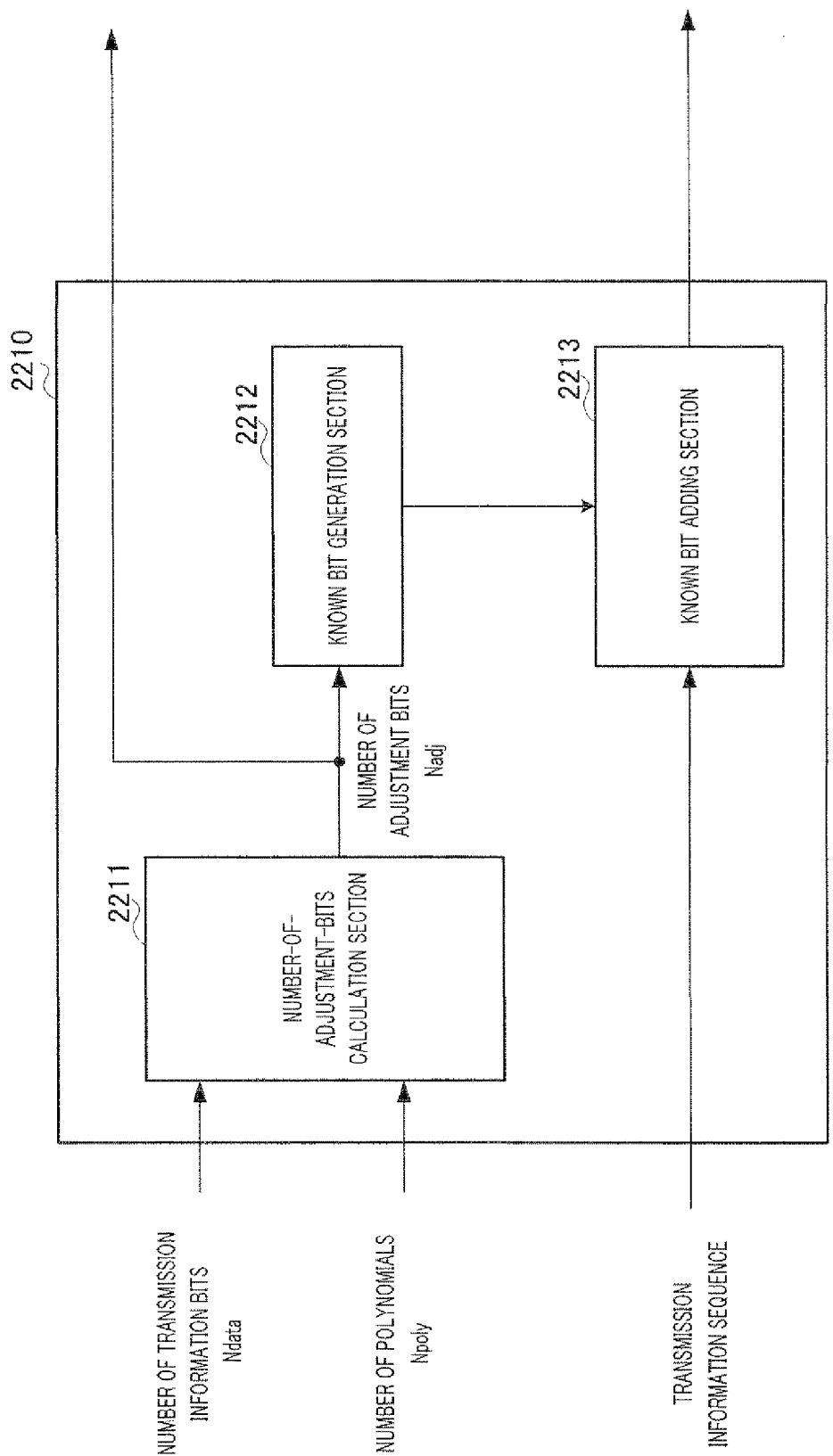
FIG. 39 is a block diagram showing a configuration of a polynomial adjustment section according to Embodiment 9.

FIG. 39 shows a configuration of polynomial adjustment section 2210. Polynomial adjustment section 2210 is equipped with number-of-adjustment-bits calculation section 2211, known bit generation section 2212, and known bit adding section 2213.

Here, LDPC-CC encoding section 1010 starts LDPC-CC encoding using polynomial p1 for which the memory length is minimum.

Therefore, if an index of an information bit to be encoded is designated Ni (=1, 2, . . . , Ndata), an information bit having an index satisfying the equation Ni%Npoly=1 is encoded using polynomial p1. Here, "%" represents an operator that finds a remainder of a division.

From number of transmission information bits Ndata and number of polynomials Npoly, number-of-adjustment-bits calculation section 2211 finds the minimum number of adjustment bits Nadj for which (Ndata+Nadj)%Npoly=1, and outputs the obtained number of adjustment bits Nadj to known bit generation section 2212.

Known bit generation section 2212 generates a number of known bits equivalent to number of adjustment bits Nadj. Any bit sequence can be used as known bits as long as it is a bit sequence known on the transceiver side and on the receiver side. For example, an all-zero sequence or the like can be used as known bits equal in number to Nadj. Known bit generation section 2212 sends the generated known bits to known bit adding section 2213.

Known bit adding section 2213 adds the known bits equal in number to Nadj to the rear part of a transmission information bit sequence, and sends this to LDPC-CC encoding section 1010.

Thus, in this embodiment, encoding can be started and ended dependably using polynomial p1 for which the memory length is minimum by having polynomial adjustment section 2210 insert known adjustment bits.

Number-of-adjustment-bits calculation section 2211 sends number of adjustment bits Nadj to control information generation section 1050. By this means, Nadj is transmitted included in control information, enabling Nadj to be conveyed to the receiver side. Information conveyed to the receiver side need not be Nadj, but may be only information necessary for Nadj to be calculated on the receiver side, and may be Ndata%Npoly, or the number of transmission information bits and the number of polynomials, for example.

In this embodiment, a case has been described in which the number of polynomials is two—that is, the time-varying period is 2—but this is not a limitation, and application is also possible in a similar way when the number of polynomials is three or more.

In this embodiment, a case has been described by way of example in which there is only one polynomial for which the memory length is minimum, but there may also be a plurality of polynomials for which the memory length is minimum. For example, if the total number of polynomials is five, and memory lengths Mp1 through Mp5 are set as MP1=16, MP2=18, MP3=16, MP4=20, and MP5=19, polynomial p1 is used when Ni%Npoly=1 and polynomial p3 is used when Ni%Npoly=3, and therefore provision may be made for polynomial adjustment section 2210 to find the minimum Nadj for which (Ndata+Nadj)%Npoly=1 or 3.

Also, a case has been described in which polynomial adjustment section 2210 according to this embodiment makes a polynomial used at the start and end of encoding a polynomial for which the memory length is short by adding known bits to the rear part of a transmission information sequence, but the configuration and operation of polynomial adjustment section 2210 are not limited to this case.

Figure 40:
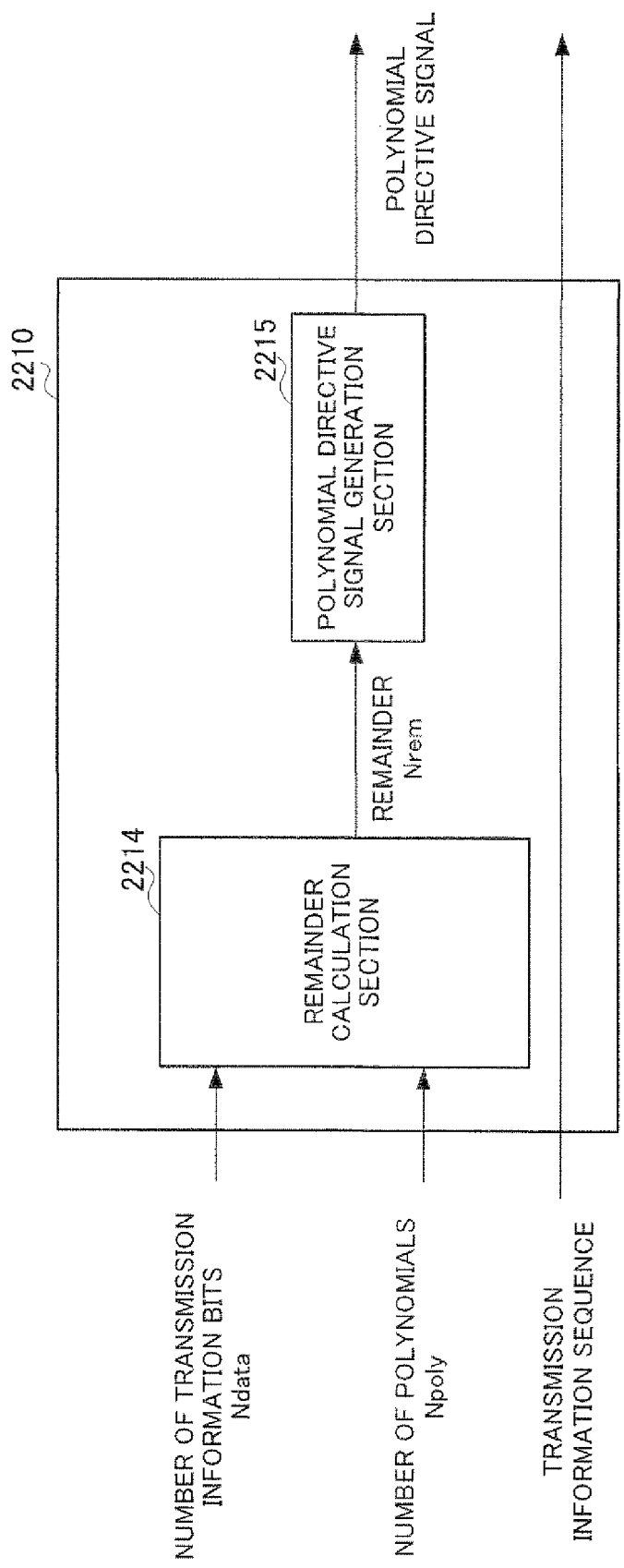
FIG. 40 is a block diagram showing another configuration of a polynomial adjustment section according to Embodiment 9.

FIG. 40 shows another sample configuration of polynomial adjustment section 2210. Polynomial adjustment section 2210 in FIG. 40 is equipped with remainder calculation section 2214 and polynomial directive signal generation section 2215.

From number of transmission information bits Ndata and number of polynomials Npoly, remainder calculation section 2214 calculates remainder Nrem given by Nrem=(Ndata)%Npoly. Remainder calculation section 2214 sends generated remainder Nrem to polynomial directive signal generation section 2215.

Polynomial directive signal generation section 2215 generates a polynomial directive signal from remainder Nrem. The polynomial directive signal is generated as described below. Consider, for example, a case in which Npoly=2. When the two polynomials, polynomial p1 and polynomial p2, are as shown in Equation (7-1) and Equation (7-2), the memory length is shorter for first polynomial p1, and therefore LDPC-CC encoder 1010 starts encoding using polynomial p1.

Therefore, when Nrem=1, the Ndata'th transmission information bit is encoded using polynomial p1. On the other hand, when Nrem=0, the Ndata'th transmission information bit is encoded using polynomial p2.

If encoding is performed using a polynomial for which the memory length is short at the end of encoding as well as at the start of encoding, the number of states can be reduced. Consequently, when Nrem=1, polynomial directive signal generation section 2215 outputs a directive signal to LDPC-CC encoder 1010 for the last bit to be encoded using polynomial p1 for which the memory length is short.

Since LDPC-CC encoder 1010 starts encoding using polynomial p1 and thereafter performs encoding while switching polynomials, if Nrem=1 for the last bit, encoding is performed on the last bit using polynomial p1 even if there is no directive signal. Consequently, provision may be made for polynomial directive signal generation section 2215 not to output a directive signal.

On the other hand, if Nrem=0 for the last bit, encoding is performed using polynomial p2 for which the memory length is long. Consequently, in order to avoid this, polynomial directive signal generation section 2215 outputs a directive signal to LDPC-CC encoder 1010 for the last bit to be encoded using polynomial p1. As a result, the order in which polynomials are used for LDPC-CC encoding is "p1, p2, p1, p2, p1, p2, p1, p1".

In this way, polynomial adjustment section 2210 can give a directive so that LDPC-CC encoder 1010 always uses a polynomial for which the memory length is short for encoding of the last bit, enabling the number of states at the start and end of encoding to be reduced, and enabling the amount of computation and processing delay time necessary for encoding/decoding to be reduced.

In the above description, a case has been described in which the time-varying period is 2—that is, the number of polynomials is two—but this is not a limitation, and application is also possible in a similar way when the number of polynomials is three or more.

Also, in the above description a case has been described by way of example in which there is one polynomial that gives a minimum memory length, but this is not a limitation, and the number of polynomials that give a minimum memory length may also be two or more. In this case, polynomial directive signal generation section 2215 generates a polynomial directive signal so that encoding ends with one of the polynomials that gives a minimum memory length, and sends this signal to LDPC-CC encoder 1010.

(Embodiment 10)

In this embodiment, a decoder is described that decodes an LDPC-CC codeword encoded by switching among a plurality of weight patterns described in Embodiment 1. Below, a case in which an LDPC-CC codeword encoded by switching among a plurality of weight patterns conforming to the parity check matrix shown in FIG. 5 will be described as an example.

Figure 41:
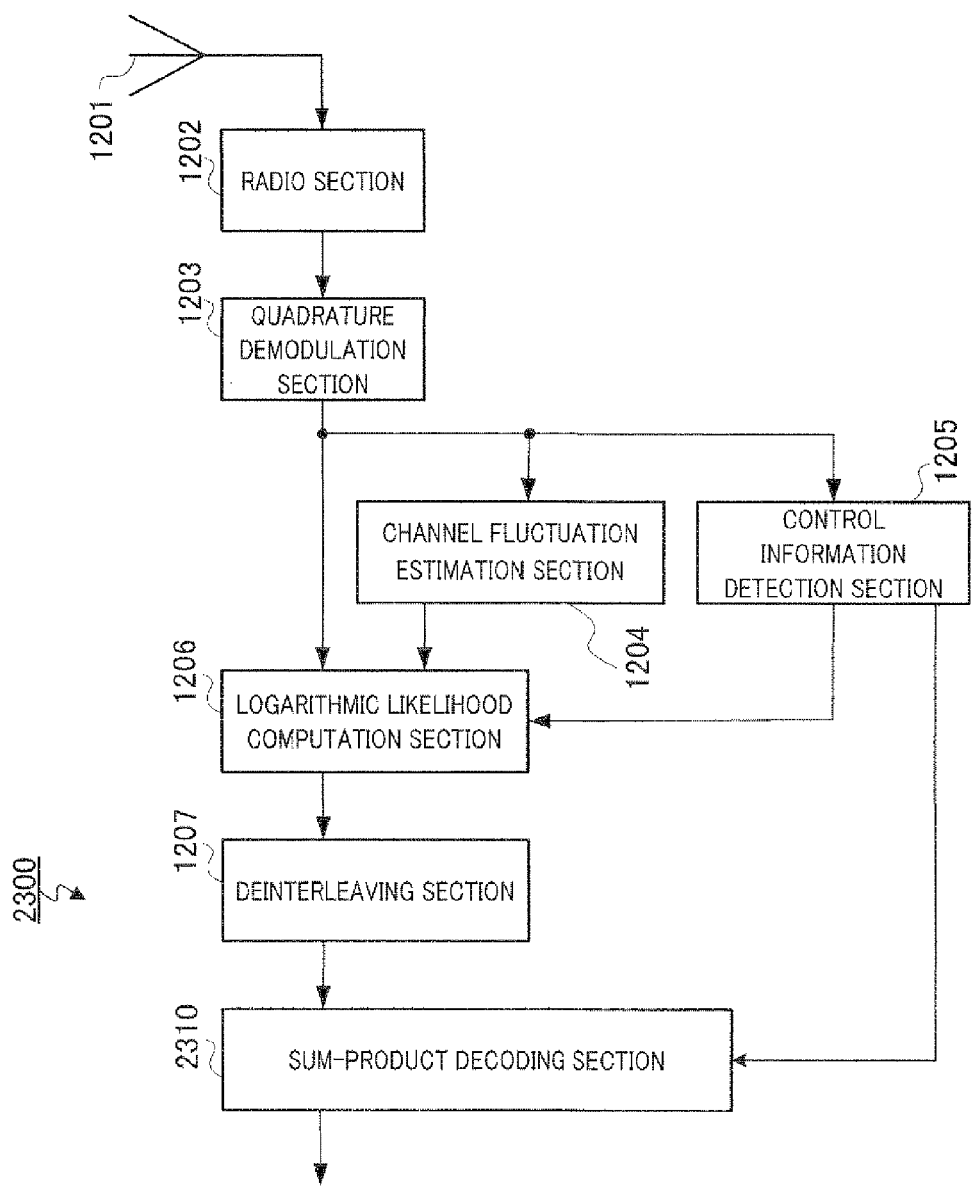
FIG. 41 is a block diagram showing a configuration of a receiving apparatus according to Embodiment 10 of the present invention.

FIG. 41 shows a main configuration of a receiving apparatus according to this embodiment. Configuration parts in receiving apparatus 2300 in FIG. 41 that are identical to those of receiving apparatus 1200 in FIG. 17 are assigned the same reference numbers as in FIG. 17, and descriptions thereof are omitted here. Receiving apparatus 2300 in FIG. 41 mainly comprises receiving antenna 1201, radio section 1202, quadrature demodulation section 1203, channel fluctuation estimation section 1204, control information detection section 1205, logarithmic likelihood computation section 1206, deinterleaving section 1207, and sum-product decoding section 2310.

Sum-product decoding section 2310 has a received logarithmic likelihood ratio sent from deinterleaving section 1207 and a transmission information sequence length sent from control information detection section 1205 as input, performs sum-product decoding, and obtains a decoded result.

Figure 42:
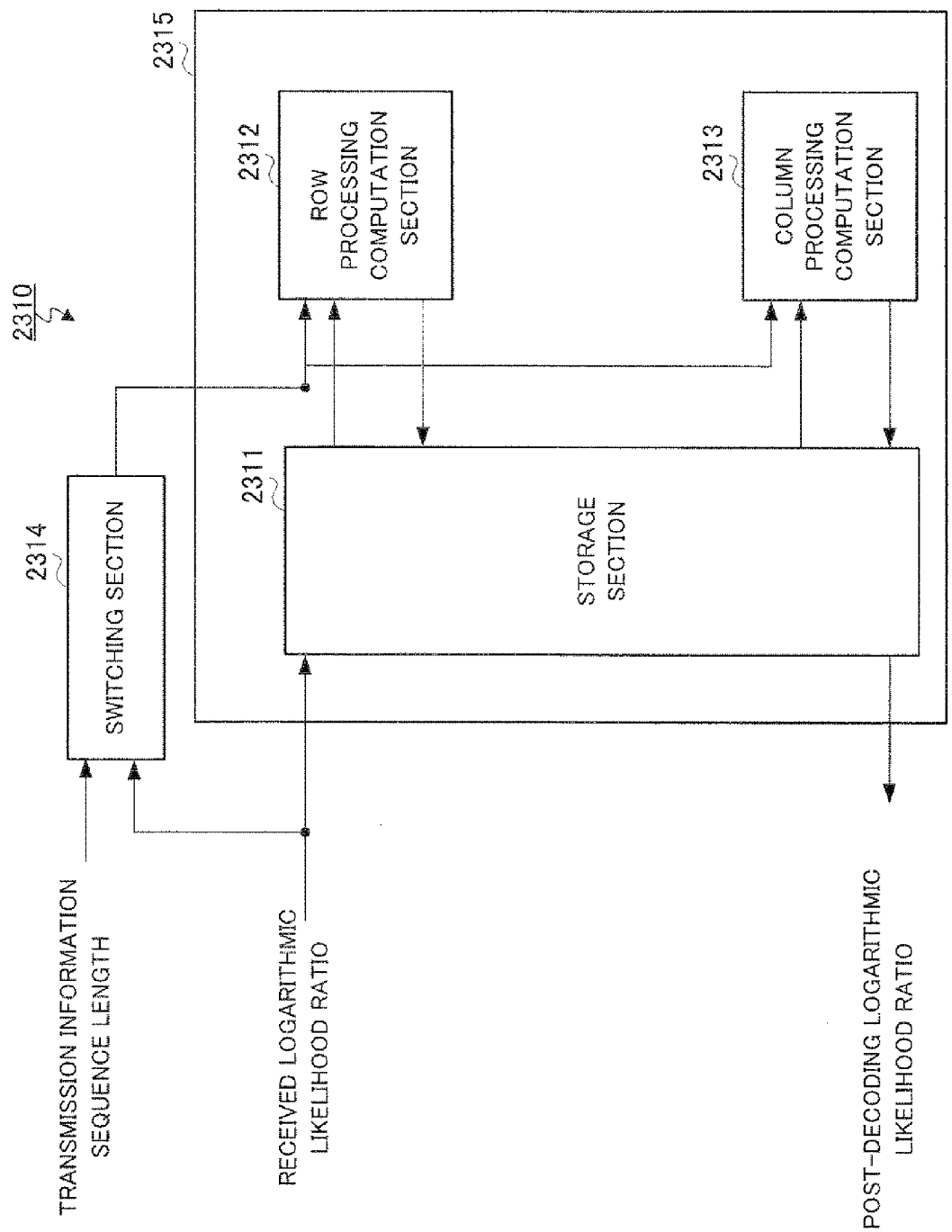
FIG. 42 is a block diagram showing a configuration of a sum-product decoding section according to Embodiment 10.

FIG. 42 shows the configuration of sum-product decoding section 2310. Sum-product decoding section 2310 is equipped with storage section 2311, row processing computation section 2312, column processing computation section 2313, and switching section 2314. Storage section 2311, row processing computation section 2312, and column processing computation section 2313 form matrix processing computation section 2315.

Storage section 2311 stores external value $\alpha_{mn}$ obtained by row processing and a priori value $\beta_{mn}$ obtained by column processing.

Row processing computation section 2312 reads a necessary a priori value $\beta_{mn}$ from storage section 2311, and performs row processing computation in accordance with a parity check matrix H row-direction weight pattern. The weight pattern is switched based on switching timing information. In row processing computation, row processing computation section 2312 performs decoding of a single parity check code using a priori value and obtains external value $\alpha_{mn}$.

Processing of the m'th row will now be described.

External value $\alpha_{mn}$ is updated using update equation (8) below for all pairs (m,n) satisfying the equation $H_{m,n}=1$.

(Equation 8)

$$\alpha_{mn} = \left(\prod_{n' \in A(m)\backslash n} \text{sign}(\beta_{mn'})\right) \Phi\left(\sum_{n' \in A(m)\backslash n} \Phi(|\beta_{mn'}|)\right) \quad [8]$$

Here, $\Phi(x)$ is called a Gallager f function, and is defined by the following equation.

(Equation 9)

$$\Phi(x) = \ln \frac{\exp(x)+1}{\exp(x)-1} \quad [9]$$

Column processing computation section 2313 reads a necessary external value $\alpha_{mn}$, from storage section 2311, and performs column processing computation in accordance with a parity check matrix H column-direction weight pattern. The weight pattern is switched based on switching timing information.

In column processing computation, column processing computation section 2313 performs the decoding of repetition code using input logarithmic likelihood ratio $\lambda_n$ and external value $\alpha_{mn}$, and finds a priori value $\beta_{mn}$.

Processing of the n'th column will now be described.

$\beta_{mn}$ is updated using update equation (10) below for all pairs (m,n) satisfying the equation $H_{mn}=1$. Only when the calculation is performed with $\alpha_{mn}=0$.

(Equation 10)

$$\beta_{mn} = \lambda_n + \sum_{m' \in B(n)/m} \alpha_{m'n} \quad [10]$$

Switching section 2314 switches the weight patterns of row processing computation section 2312 and column processing computation section 2313 based on weight pattern switching timing. Weight pattern switching timing may be input from outside, or may be generated within switching section 2314. FIG. 42 shows a configuration in which switching section 2314 has a received logarithmic likelihood ratio and transmission information sequence length n as input, performs received logarithmic likelihood ratio counting, and calculates weight pattern switching timing using that count value and transmission information sequence length n.

Figure 43:
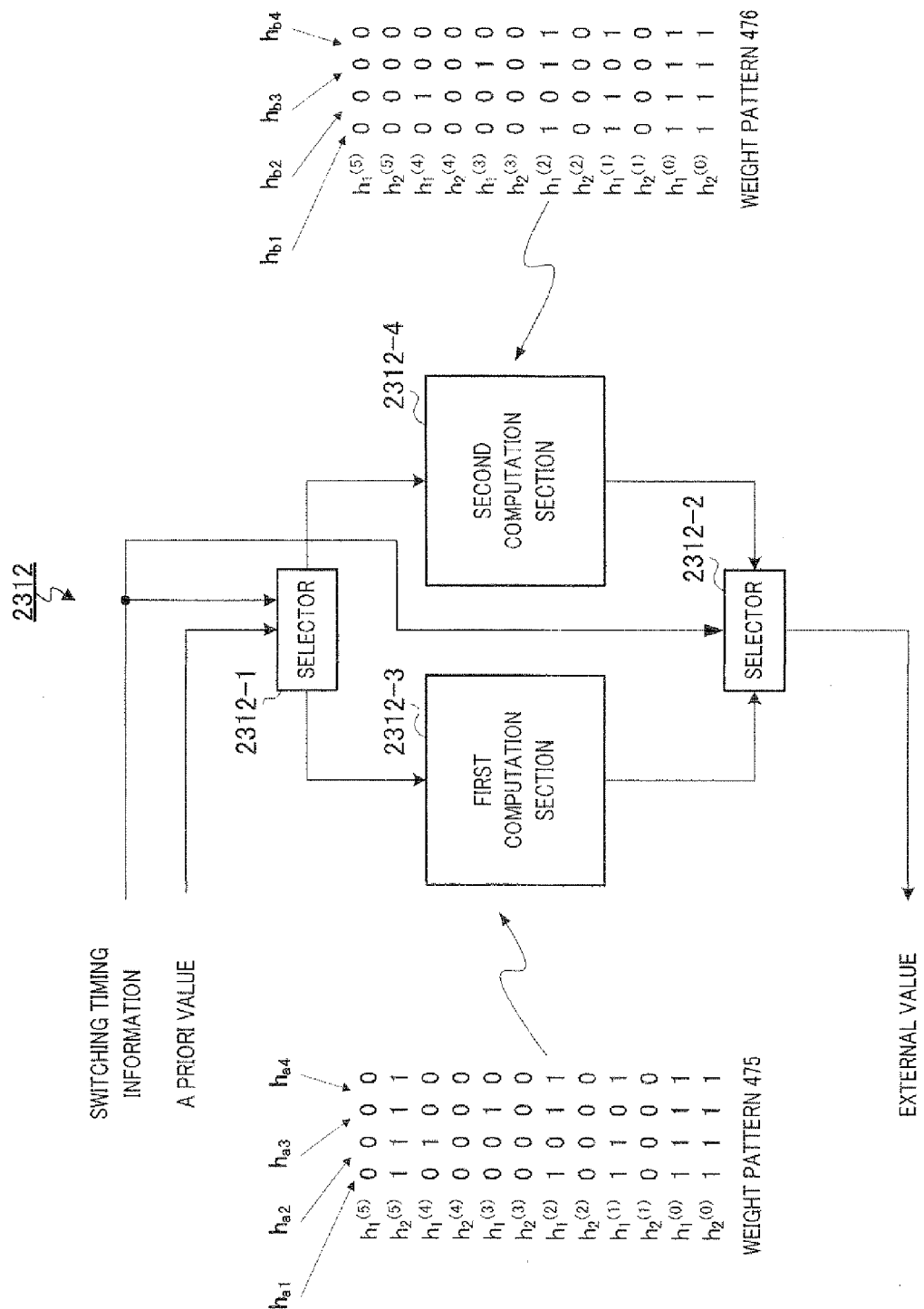
FIG. 43 is a block diagram showing a configuration of a row processing computation section according to Embodiment 10.

FIG. 43 shows the configuration of row processing computation section 2312. Row processing computation section 2312 is equipped with selectors 2312-1 and 2312-2, first computation section 2312-3, and second computation section 2312-4.

Selectors 2312-1 and 2312-2 switch the transmission destination of an a priori value and the reception destination of an external value based on switching timing information.

First computation section 2312-3 performs row processing computation based on weight pattern 475. Weight pattern 475 is a pattern provided in weight pattern storage section 472 of weight control section 470. Second computation section 2312-4 performs row processing computation based on weight pattern 476. Weight pattern 476 is a pattern provided in weight pattern storage section 473 of weight control section 470.

Figure 44:
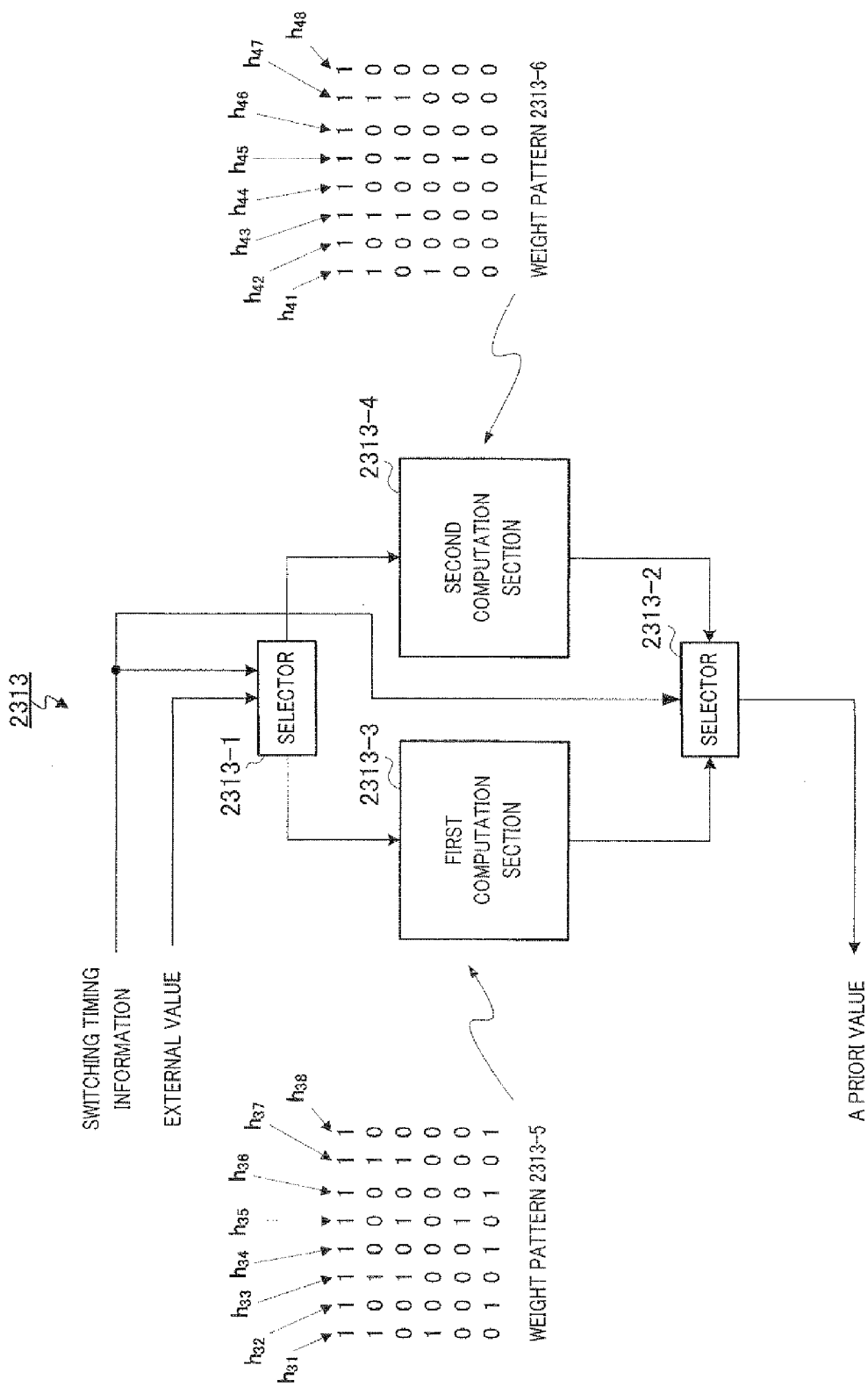
FIG. 44 is a block diagram showing a configuration of a column processing computation section according to Embodiment 10.

FIG. 44 shows the configuration of column processing computation section 2313. Column processing computation section 2313 is equipped with selectors 2313-1 and 2313-2, first computation section 2313-3, and second computation section 2313-4. Selectors 2313-1 and 2313-2 switch the transmission destination of an a priori value and the reception destination of an external value based on switching timing information.

First computation section 2313-3 performs column processing computation based on weight pattern 2313-5, and second computation section 2313-4 performs column processing computation based on weight pattern 2313-6. Weight pattern 2313-5 and weight pattern 2313-6 are weight patterns conforming to the parity check matrix in FIG. 5 stored by weight control section 470 on the encoding side.

When received logarithmic likelihood ratio count value C<2n, switching section 2314 generates switching timing information directing that weight pattern 475 is to be used; when 2n+1≦C<2(n+5), switching section 2314 generates switching timing information directing that weight pattern 476 is to be used; and in case of 2n+11≦C or above, switching section 2314 generates switching timing information directing that weight pattern 475 is to be used.

Also, when received logarithmic likelihood ratio count value C<2(n−5), switching section 2314 generates switching timing information directing that weight pattern 2313-5 is to be used; when 2(n−1)≦C<2n, switching section 2314 generates switching timing information directing that weight pattern 2313-6 is to be used; and when 2≦C, switching section 2314 generates switching timing information directing that weight pattern 2313-5 is to be used.

Switching section 2314 outputs switching timing information generated in this way to row processing computation section 2312 and column processing computation section 2313. By this means, row processing computation section 2312 and column processing computation section 2313 can execute decoding processing conforming to an LDPC-CC parity check matrix used on the encoding side.

After repeating row processing and column processing a predetermined number of times, sum-product decoding section 2310 obtains an a posteriori logarithmic likelihood ratio.

As described above, a receiving apparatus according to this embodiment is equipped with sum-product decoding section 2310, and sum-product decoding section 2310 is configured so as to switch weight patterns used in row processing computation and column processing computation according to switching timing information. In this way, it is possible to implement sum-product decoding of a codeword encoded by switching weight patterns as described in Embodiment 1.

In this embodiment, an LDPC-CC defined by the parity check matrix shown in FIG. 5 has been described, but this is not a limitation, and an LDPC-CC with a different memory length and different weight patterns, for example, may also be used.

In this embodiment, a receiving apparatus and decoder have been described that correspond to the encoder in Embodiment 1, but this is not a limitation, and by changing switching timing information and weight patterns to correspond to the encoder in Embodiment 2, for example, a receiving apparatus and decoder that correspond to the encoder described in Embodiment 2 can be configured.

The present invention is not limited to the above-described embodiments, and various variations and modifications may be possible without departing from the scope of the present invention. For example, in the above embodiments, cases have mainly been described in which the present invention is implemented by an encoder and transmitting apparatus, but the present invention is not limited to this, and can also be implemented by means of a power line communication apparatus.

It is also possible for the encoding method and transmitting method to be implemented by software. For example, provision may be made for a program that executes the above-described encoding method and communication method to be stored in ROM (Read Only Memory) beforehand, and for this program to be run by a CPU (Central Processing Unit).

Provision may also be made for a program that executes the above-described encoding method and transmission method to be stored in a computer-readable storage medium, for the program stored in the storage medium to be recorded in RAM (Random Access Memory) of a computer, and for the computer to be operated in accordance with that program.

It goes without saying that the present invention is not limited to radio communication, and is also useful for power line communication (PLC), visible light communication, and optical communication.

One aspect of an LDPC-CC encoder of the present invention employs a configuration having: a plurality of shift registers; a plurality of weight multiplication sections that multiply outputs of the shift registers by a weight; a modulo 2 adder that performs modulo 2 addition of outputs of the plurality of weight multiplication sections; a bit counter that counts a number of input bits that are encoded; and a weight control section that controls weights of the plurality of weight multiplication sections according to the number of bits.

According to this configuration, LDPC-CC encoding that uses a parity check matrix can be performed.

One aspect of an LDPC-CC encoder of the present invention employs a configuration in which the weight control section stores a first weight pattern conforming to a parity check matrix and a second weight pattern conforming to a parity check matrix obtained by deforming the parity check matrix, and uses the first weight pattern when the input bits are an information sequence, and uses the second weight pattern when the input bits are a termination sequence.

According to this configuration, a shift register weight value can be switched according to whether input bits are an information sequence or a termination sequence. Therefore, the LDPC-CC encoder can conclude termination processing by means of setting a weight values by which a transmission codeword sequence is multiplied to be 0 irrespective of the value of the transmission codeword sequence when input bits are a termination sequence. As a result of this, the LDPC-CC encoder can reduce the length of the transmitted termination sequence because.

One aspect of an LDPC-CC encoder of the present invention employs a configuration in which the second weight pattern is a weight pattern conforming to a parity check matrix in which a rightmost 1 of each row of the parity check matrix has been changed to a 0.

According to this configuration, when input bits are a termination sequence the LDPC-CC encoder can set a weight value by which a transmission codeword sequence is multiplied to be 0 irrespective of the value of the transmission codeword sequence. As a result, the length of a transmitted termination sequence can be reduced.

One aspect of an LDPC-CC encoder of the present invention employs a configuration in which the second weight pattern is a weight pattern conforming to a parity check matrix obtained by left-shifting a rightmost 1 of each row of the parity check matrix to a column not used for a termination sequence parity check.

According to this configuration, in termination sequence decoding, encoding gain due to repetition code in sum-product decoding can be maintained since the number of row-direction 1s (row weight) does not change.

One aspect of an LDPC-CC encoder of the present invention employs a configuration in which the second weight pattern is a weight pattern conforming to a parity check matrix obtained by left-shifting the same number of rightmost 1s of each row of the parity check matrix for each row.

According to this configuration, fewer kinds of weight patterns are stored.

One aspect of an LDPC-CC encoder of the present invention employs a configuration in which the second weight pattern is a weight pattern conforming to a parity check matrix obtained by changing a 1 of a row corresponding to a check bit to a 0 in the parity check matrix.

According to this configuration, the LDPC-CC encoder can set a weight value by which a transmission codeword sequence is multiplied to be 0 irrespective of the value of the transmission codeword sequence, and a length of a transmitted termination sequence can be greatly reduced.

One aspect of an LDPC-CC encoder of the present invention employs a configuration further equipped with a puncturing section that, when the input bits are a termination sequence, punctures a systematic bit of the termination sequence.

According to this configuration, if a termination sequence is made a zero sequence that is known on the receiver side, for example, a decrease in transmission efficiency can be suppressed by puncturing that zero sequence.

One aspect of an LDPC-CC encoder of the present invention employs a configuration in which the weight control section stores a plurality of weight patterns conforming to parity check matrices having different memory lengths, and when the input bits are an information sequence, uses a weight pattern with a shorter memory length toward the rear of the information sequence.

According to this configuration, the memory length is made shorter toward the rear of an information sequence, enabling the termination sequence length to be made shorter, and enabling degradation of transmission efficiency to be suppressed.

One aspect of an LDPC-CC encoder of the present invention employs a configuration in which the weight control section stores a plurality of weight patterns conforming to parity check matrices having different coding rates, and when the input bits are an information sequence, uses a weight pattern with a lower coding rate toward the rear of the information sequence.

According to this configuration, the coding rate is made lower toward the rear of an information sequence, enabling error resilience in termination processing to be strengthened even if a termination sequence is reduced.

One aspect of a transmitting apparatus of the present invention employs a configuration having: an LDPC-CC encoding section that executes LDPC-CC encoding on input bits; and a termination sequence puncturing section that punctures a termination sequence included in a sequence after LDPC-CC encoding.

According to this configuration, the termination sequence transmission amount can be reduced and a decrease in transmission efficiency can be suppressed.

One aspect of a transmitting apparatus of the present invention employs a configuration in which the termination sequence puncturing section increases the proportion of punctured bits toward the rear of a termination sequence.

According to this configuration, a rear part of a termination sequence having relatively little effect on a transmission codeword sequence can be punctured preferentially in termination processing, enabling the termination sequence transmission amount to be reduced while suppressing degradation of the error rate characteristic of a received information sequence.

One aspect of a transmitting apparatus of the present invention employs a configuration in which the termination sequence punctures the entire termination sequence.

According to this configuration, if a termination sequence is known on both the transceiver side and the receiver side, the termination sequence transmission amount can be greatly reduced.

One aspect of a transmitting apparatus of the present invention employs a configuration further equipped with a first buffer that stores a termination sequence punctured by the termination sequence puncturing section, wherein a termination sequence stored in the first buffer is transmitted when a retransmission request is sent from a communicating party.

According to this configuration, if a position at which an error has been detected is identified as a termination sequence position by an LDPC-CC parity check, it is possible to retransmit only a punctured termination sequence, enabling a decrease in transmission efficiency due to retransmission to be suppressed.

One aspect of a transmitting apparatus of the present invention employs a configuration further equipped with a second buffer that stores the input bits before the LDPC-CC encoding section.

According to this configuration, in the event of a retransmission request, LDPC-CC encoding can be executed using a different coding rate with high error correction capability on the same transmission information sequence, and the proportion of bits received correctly can be increased.

One aspect of a transmitting apparatus of the present invention employs a configuration in which the second buffer rearranges the order of the input bits in order from the rear.

According to this configuration, by storing input bits with their order rearranged, transmission is performed in a retransmission using a different sequence order from that used in an initial transmission, enabling the proportion of bits affected by an error in an initial transmission that are incorrect again to be reduced.

One aspect of a transmitting apparatus of the present invention employs a configuration in which the second buffer rearranges the order of the input bits in order from the rear.

According to this configuration, a rearward bit that is likely to be affected by an error in an initial transmission is LDPC-CC encoded in a front part in a retransmission, enabling the probability of the same bit being incorrect in a retransmission to be reduced.

One aspect of a transmitting apparatus of the present invention employs a configuration further equipped with: an information sequence division section that acquires first and second sequences by dividing an information sequence into two; an outer encoding section that encodes the second information sequence; and a rearranging section that rearranges the order of the first information sequence and the second information sequence that has undergone outer encoding; wherein the LDPC-CC encoding section executes LDPC-CC encoding on output bits from the rearranging section.

According to this configuration, when two sequences are acquired by dividing an information sequence into a front part and rear part, outer encoding can be executed on a rearward information sequence likely to be affected by an error in termination, and therefore if an error occurs in the rear part of a received information sequence, that error can be corrected, and degradation of reception quality can be suppressed.

One aspect of a transmitting apparatus of the present invention employs a configuration in which the outer encoding section performs low-density parity-check block code (LDPC-BC) encoding.

According to this configuration, high error correction capability can be achieved while reducing the circuit scale used for outer encoding.

One aspect of a transmitting apparatus of the present invention employs a configuration in which the rearranging section rearranges the first information sequence and the second information sequence that has undergone encoding so that a parity sequence obtained by the outer encoding section is positioned forward preferentially.

According to this configuration, part of an outer codeword sequence obtained by outer encoding can be preferentially positioned toward the front of a transmission information sequence, enabling the encoding gain of outer encoding to be improved.

One aspect of a transmitting apparatus of the present invention employs a configuration having: an LDPC-CC encoding section that executes LDPC-CC encoding on input bits and generates transmission codeword bits; and a puncturing section that punctures the transmission codeword bits using a first puncture pattern, and a second puncture pattern whereby more bits are punctured than with the first puncture pattern, for each processing unit of the transmission codeword bits.

One aspect of a transmitting apparatus of the present invention employs a configuration in which the puncturing section uses the first puncture pattern at the start of a processing unit of the transmission codeword bits.

According to these configurations, the number of rows that exert an adverse effect in a parity check matrix used in BP decoding on the receiver side (decoding side) can be reduced, enabling degradation of reception quality to be suppressed.

One aspect of a transmitting apparatus of the present invention employs a configuration in which the puncturing section uses the first puncture pattern at the rear of a processing unit of the transmission codeword bits.

According to this configuration, rows of a parity check matrix for which reliability is propagated are included both forward and rearward in a BP decoding processing period, and therefore reliability can be propagated efficiently.

One aspect of a transmitting apparatus of the present invention employs a configuration in which the puncturing section allocates the first puncture pattern and the second puncture pattern to a processing unit of the transmission codeword bits, based on timings of a BP (Belief Propagation) decoding processing unit time on the receiver side and a processing unit of the transmission codeword bits, in such a way that a plurality of the transmission codeword bits used by the first puncture pattern are included in the BP decoding processing unit time.

According to this configuration, the range within which decoding can be performed by a row of a parity check matrix for which reliability is propagated in a BP decoding processing period input signal increased, enabling reliability to be propagated efficiently.

One aspect of an LDPC-CC encoder of the present invention employs a configuration in which the weight control section stores a plurality of weight patterns conforming to parity check matrices having different memory lengths, and uses a weight pattern with a shorter memory length for encoding toward the front part of the input bits and the rear part of the input bits.

One aspect of an LDPC-CC encoder of the present invention employs a configuration in which the weight control section stores a plurality of weight patterns conforming to a plurality of polynomials, and uses a weight pattern conforming to a polynomial for which the memory length is minimum among the plurality of polynomials for encoding of the first bit of the input bits, and uses a weight pattern conforming to a polynomial for which the memory length is minimum among the plurality of polynomials for encoding of the last bit of the input bits.

One aspect of an LDPC-CC encoder of the present invention employs a configuration further equipped with a known bit adding section that adds a number of known bits corresponding to the number of input bits and the number of polynomials to the rear part of the input bits.

One aspect of an LDPC-CC encoder of the present invention employs a configuration in which the weight control section uses a weight pattern conforming to a parity check matrix for which the memory length is minimum among the plurality of polynomials for encoding of the last bit of the input bits.

According to these configurations, the number of states at the start and end of LDPC-CC encoding can be reduced, and the amount of computation and processing delay time necessary for encoding/decoding can be reduced.

One aspect of an LDPC-CC decoder of the present invention is an LDPC-CC decoder that decodes a Low-Density Parity-Check Convolutional Code (LDPC-CC), and employs a configuration having: a matrix computing element equipped with a plurality of weight patterns conforming to a parity check matrix; and a switching section that switches among the plurality of weight patterns based on weight pattern switching timing.

According to this configuration, an LDPC-CC codeword encoded using a parity check matrix can be decoded using that parity check matrix.

One aspect of an LDPC-CC decoder of the present invention employs a configuration in which the switching section has a weight switching timing calculation section that counts the number of received logarithmic likelihood ratios, and calculates weight pattern switching timing using that count value and a transmission information sequence length.

According to this configuration, even in a case in which a parity check matrix weight pattern is switched, an LDPC-CC codeword can be decoded using the relevant parity check matrix.

The disclosures of Japanese Patent Application No. 2007-183492, filed on Jul. 12, 2007, Japanese Patent Application No. 2007-339913, filed on Dec. 28, 2007, and Japanese Patent Application No. 2008-178241, filed on Jul. 8, 2008, including the specifications, drawings and abstracts, are incorporated herein by reference in their entirety.

Industrial Applicability

A low density parity check convolutional code (LDPC-CC) encoder and transmitting apparatus according to the present invention can perform error correction encoding/decoding while reducing the amount of a termination sequence necessary for LDPC-CC encoding/decoding and suppressing degradation of transmission efficiency, and are useful for an LDPC-CC encoder that executes error correction encoding using LDPC-CC encoding, an LDPC-CC decoder, and so forth.

The invention claimed is:

1. A Low-Density Parity-Check Convolutional Code (LDDC-CC) encoder comprising:
a plurality of shift registers;
a plurality of weight multipliers that multiply outputs of the shift registers by a weight;
an exclusive OR computing circuit that finds an exclusive OR of outputs of the plurality of weight multipliers;
a bit counter that counts a number of input bits that are encoded; and
a weight controller that controls weights of the plurality of weight multipliers according to the number of bits, wherein:
the plurality of shift registers includes a shift register for information sequence and a shift register for parity;
the shift register for parity inputs an output from the exclusive OR computing circuit; and
the weight controller stores a first weight pattern conforming to a parity check matrix of a LDPC-CC and a second weight pattern conforming to a deformed parity check matrix obtained by deforming the parity check matrix of the LDPC-CC, and uses the first weight pattern when an information sequence of the input bits is input into an earliest shift register of the shift register for information sequence, and uses the second weight pattern when a predetermined input termination sequence for creating an encoded termination sequence is input into an earliest shift register of the shift register for information sequence.

2. The LDPC-CC encoder according to claim 1, wherein the deformed parity check matrix is obtained by left-shifting a rightmost 1 of each row of the parity check matrix of a LDPC-CC to a column not used for a termination sequence parity check.

3. The LDPC-CC encoder according to claim 1, wherein the deformed parity check matrix is obtained by changing a 1 in rows corresponding to a parity bit to a 0 in the parity check matrix of the LDPC-CC.

4. The LDPC-CC encoder according to claim 1, further comprising a puncturer that, when the input bits are the input termination sequence, punctures a systematic bit of the encoded termination sequence.

5. The LDPC-CC encoder according to claim 1, wherein the weight controller stores a plurality of weight patterns conforming to parity check matrices having different memory lengths, and when the input bits are an information sequence, uses a weight pattern with a shorter memory length toward a rear part of the information sequence.

6. The LDPC-CC encoder according to claim 1, wherein the weight controller stores a plurality of weight patterns conforming to parity check matrices having different coding rates, and when the input bits are an information sequence, uses a weight pattern with a lower coding rate toward a rear part of the information sequence.

7. The LDPC-CC encoder according to claim 1, wherein the weight controller stores a plurality of weight patterns conforming to parity check matrices having different memory lengths, and uses a weight pattern with a shorter memory length for encoding toward a front part of the input bits and a rear part of the input bits.

8. The LDPC-CC encoder according to claim 1, wherein the weight controller stores a plurality of weight patterns conforming to a plurality of polynomials, and uses a weight pattern conforming to a polynomial for which memory length is minimum among the plurality of polynomials for encoding of a first bit of the input bits, and uses a weight pattern conforming to a polynomial for which memory length is minimum among the plurality of polynomials for encoding of a last bit of the input bits.

9. The LDPC-CC encoder according to claim 8, further comprising a known bit adder that adds a number of known bits corresponding to a number of the input bits and a number of the polynomials to a rear part of the input bits.

10. The LDPC-CC encoder according to claim 8, wherein the weight controller uses a weight pattern conforming to a parity check matrix for which memory length is minimum among the plurality of polynomials for encoding of a last bit of the input bits.

* * * * *

UNITED STATES PATENT AND TRADEMARK OFFICE
CERTIFICATE OF CORRECTION

| | | Page 1 of 1 |
|---|---|---|
| PATENT NO. | : 8,423,876 B2 | |
| APPLICATION NO. | : 12/668655 | |
| DATED | : April 16, 2013 | |
| INVENTOR(S) | : Shutai Okamura et al. | |

It is certified that error appears in the above-identified patent and that said Letters Patent is hereby corrected as shown below:

In the Claims:

Claim 1, column 48, line 3 incorrectly reads:

"(LDDC-CC) encoder comprising:"

and should read

"(LDPC-CC) encoder comprising:".

Signed and Sealed this
Twenty-second Day of April, 2014

Michelle K. Lee
*Deputy Director of the United States Patent and Trademark Office*